United States Patent [19]
Dudley et al.

[11] Patent Number: 5,384,786
[45] Date of Patent: Jan. 24, 1995

[54] FAST AND EFFICIENT CIRCUIT FOR IDENTIFYING ERRORS INTRODUCED IN REED-SOLOMON CODEWORDS

[75] Inventors: Trent Dudley, Littleton; Neal Glover, Broomfield; Larry King, Boulder, all of Colo.

[73] Assignee: Cirrus Logic, Inc., Fremont, Calif.

[21] Appl. No.: 679,570

[22] Filed: Apr. 2, 1991

[51] Int. Cl.6 .................... G06F 11/10; H03M 13/00
[52] U.S. Cl. ................................................. 371/37.1
[58] Field of Search .................... 371/37.1, 37.5, 40.1, 371/38.1, 39.1

[56] References Cited

U.S. PATENT DOCUMENTS

| | | | |
|---|---|---|---|
| 4,410,989 | 10/1983 | Berlekamp | 371/40 |
| 4,763,332 | 8/1988 | Glover | 371/37 |
| 4,839,896 | 6/1989 | Glover et al. | 371/37 |

OTHER PUBLICATIONS

"Standard ECMA-154, Data Interchange on 90mm Optical Disk Cartridges, Read Only and Rewritable, MO" by ECMA European Computer Manufacturers Association, published Jun. 1991, pp. 35–42, 79–88.
"Information Exchange", ISO/IEC JTC 1/SC 23N, pp. 53–57.
"CL-SM330 Preliminary Data Sheet" by Cirrus Logic, Inc. published Apr., 1991.
"CL-SM331 Preliminary Data Sheet" by Cirrus Logic, Inc. published Apr., 1991.
A Decoding Procedure for the Reed–Solomon Codes by Raymond S. Lim; Aug. 1978; pp. 12–15.
Inversionless Decoding of Binary BCH Codes by Herbert O. Burton; Jul. 1971; vol. IT–17, pp. 464–466.

Primary Examiner—Charles E. Atkinson
Assistant Examiner—Stephen C. Elmore
Attorney, Agent, or Firm—Blakely, Sokoloff, Taylor & Zafman

[57] ABSTRACT

Apparatus and methods are disclosed for providing an improved system for identifying the location and value of errors introduced in binary data encoded using Reed-Solomon and related codes and to detect miscorrections of such codes with an auxiliary code. The invention employs an architecture based on a microcode engine that is specialized for error identification and that supports interleaved codewords. This architecture can be efficiently fabricated as an integrated circuit, yet is capable of identifying multiple introduced errors "on the fly" i.e. with performance sufficient to not significantly slow the process of reading from data storage or transmission subsystems such as, but not limited to, optical disks. In the preferred embodiment, a new two-step method of error syndrome computation is employed to reduce circuit cost and complexity. An improved iterative algorithm is provided which reduces circuit cost and complexity and decreases the time required to generate the error locator polynomial. Cyclic redundancy check (CRC) information is adjusted as introduced errors are identified during the Chien search, thus reducing the time required to protect against ECC miscorrection. Externally-specified error thresholds allow detection of excessive numbers of errors.

4 Claims, 30 Drawing Sheets

| SB1 | SB2 | SB3 | | | | |
|---|---|---|---|---|---|---|
| | | D1 | D2 | D3 | D4 | D5 |
| | | D6 | D7 | D8 | D9 | D10 |
| | | D11 | D12 | D13 | D14 | D15 |
| RS1 | | D16 | D17 | D18 | D19 | D20 |
| | | D21 | D22 | D23 | D24 | D25 |
| | | ⋮ | ⋮ | ⋮ | ⋮ | ⋮ |
| | | D506 | D507 | D508 | D509 | D510 |
| RS34 | | D511 | D512 | VU1 | VU2 | VU3 |
| | | VU4 | CRC1 | CRC2 | CRC3 | CRC4 |
| RS35 | | E1,1 | E2,1 | E3,1 | E4,1 | E5,1 |
| | | E1,2 | E2,2 | E3,2 | E4,2 | E5,2 |
| | | E1,3 | E2,3 | E3,3 | E4,3 | E5,3 |
| | | E1,4 | E2,4 | E3,4 | E4,4 | E5,4 |
| | | ⋮ | ⋮ | ⋮ | ⋮ | ⋮ |
| RS39 | | E1,14 | E2,14 | E3,14 | E4,14 | E5,14 |
| | | E1,15 | E2,15 | E3,15 | E4,15 | E5,15 |
| | | E1,16 | E2,16 | E3,16 | E4,16 | E5,16 |

*Figure 2*
*(prior art)*

| ADDRESS | BIT 7 | BIT 6 | BIT 5 | BIT 4 | BIT 3 | BIT 2 | BIT 1 | BIT 0 |
|---|---|---|---|---|---|---|---|---|
| 10h | | | | Start Ident./Ident. Busy | Suppress Error Vectors | | | |
| 11h | | | Correct/X-Fer VU/PIR | | | | 130 mm Mode | 1024 Mode |
| 12h | | | | | Disable Error Identification | | | Read Continuously |
| 21h | | | | | | | | Enable Done Interrupt |
| 23h | | | | | | | | Identifier Done |
| 30h | Uncorrectable ECC Error | Uncorrectable CRC Error | ECC Threshold Exceeded | Identifier Overrun | | | | |
| 31h | Error Identifier RAM Address (Write Only) | | | | | | | |
| 32h | Error Identifier RAM Access | | | | | | | |
| 3Fh | | | | Enable ECC Diag Mode | | | | |

*Figure 15*

FAST AND EFFICIENT CIRCUIT FOR IDENTIFYING ERRORS INTRODUCED IN REED-SOLOMON CODEWORDS

BACKGROUND OF THE INVENTION

This invention relates to information storage and retrieval or transmission systems, and more particularly to means for encoding and decoding codewords for use in error detection, identification and correction in such information systems.

Digital information storage devices, such as magnetic disk, magnetic tape or optical disk, store information in the form of binary bits. Also, information transmitted between two digital devices, such as computers, is transmitted in the form of binary bits. During transfer of data between devices, or during transfer between the storage media and the control portions of a device, errors are sometimes introduced so that the information received is a corrupted version of the information sent. Errors can also be introduced by defects in a magnetic or optical storage medium. These errors must almost always be corrected if the storage or transmission device is to be useful.

Correction of the received information is accomplished by (1) deriving additional bits, called redundancy, by processing the original information mathematically; (2) appending the redundancy to the original information during the storage or transmission process; and (3) processing the received information and redundancy mathematically to detect, identify and correct erroneous bits at the time the information is retrieved. The process of deriving the redundancy is called encoding. The process of processing the received information and redundancy is called decoding. One class of codes often used in these processes is Reed-Solomon codes.

Encoding of information is accomplished by processing a sequence of information bits, called an information polynomial or information word, to devise a sequence of redundancy bits, called a redundancy polynomial or word, in accord with an encoding rule such as Reed-Solomon codes. An encoder processes the information polynomial with the encoding rule to create the redundancy polynomial and then appends it to the information polynomial to form a codeword polynomial which is transmitted over the signal channel or stored in an information storage device. When a codeword polynomial is received from the signal channel or read from the storage device, a decoder processes the received codeword polynomial to detect the presence of error(s), to attempt to identify any error(s) present and to flag the information polynomial as erroneous or to correct it before transferring the information polynomial for further processing.

The decoding process typically comprises three steps: (1) computing frequency-domain syndromes from the received codeword; (2) computing an error locator polynomial, whose roots indicate the locations of erroneous symbols, from the frequency-domain syndromes; and (3) finding the roots of the error locator polynomial and computing the corresponding error values.

SECTOR FORMATS

The length n of codewords of Reed-Solomon codes utilizing b-bit symbols is restricted to $n < 2^b$. A symbol size commonly used is the "byte" comprising eight bits, giving $n < 2^8 = 256$. When it is desired to store in and retrieve from a data storage system, or send and receive over a signal channel, a group of more than 255 bytes together, more than one codeword is required. When errors tend to occur in bursts affecting more than one symbol, it is advantageous to interleave the codewords so that a single error burst is spread across more than one codeword.

Optical disks conforming to ANSI/ISO standards for 90 mm and 130 mm media store data in a sector comprising an identifying mark; a triply-redundant header containing physical location information; 512 or 1024 user-data bytes plus vendor-unique/pointer bytes, all protected by an overlay CRC code with four redundant bytes, in five or ten interleaved ECC codewords, respectively, each with sixteen redundant bytes; and other necessary special marks. See *90 mm Rewritable/Read Only Optical Disk Cartridges for Information Interchange,* Second Edition, Second Draft, JTC 1/SC 23/WG 2 N213, December 1990, pages 38-42 and 84-86. Also see *Information Technology—130 MM Rewritable Optical Disk Cartridges for Information Exchange,* ISO/IEC JTC 1/SC 23N, pages 53-57. FIG. 1 shows the organization of a 512-user-date-byte sector for the ANSI 90 mm rewritable optical disk standard. FIG. 2 shows the interleaved codeword organization of the data area within each 512-data byte sector for the ANSI 90 mm CCS rewritable optical disk standard. The "SB" and "RS" bytes are not included in ECC/CRC computations.

SYNDROME COMPUTATION

A Reed-Solomon code with distance d over b-bit symbols from $GF(2^b)$ has code generator polynomial $G(x)$ of degree $d-1$:

$$G(x) = \prod_{i=m}^{m+d-2} (x \oplus \alpha^i) \qquad (1)$$

where m is the offset of the code generator polynomial. $\oplus$ represents finite-field addition and the product is formed using finite-field multiplication. The time-domain remainder polynomial $R(x)$ has coefficients $R_j$ for j from 0 to $d-2$ defined by $$R(x) = C'(x) MOD G(x) = \sum_{j=0}^{d-2} R_j * x^j \qquad (2)$$

where $C'(x)$ is the received codeword polynomial and the summation is performed using finite-field addition. Frequency-domain syndromes $S_{m+i}$ for i from 0 to $d-2$ are related to coefficients $R_j$ according to:

$$S_{m+i} = \sum_{j=0}^{d-2} R_j * \alpha^{(m+i) \cdot j} \qquad (3)$$

Rearranging equation (3) yields:

$$S_{m+i} = \sum_{j=0}^{d-2} [R_j * \alpha^{m \cdot j}] * \alpha^{j \cdot i} \qquad (4)$$

Methods for performing the computations of equation (4) when m is zero are known in the art; see Lim, "A Decoding Procedure for the Reed-Solomon Codes, "NASA Technical Paper 1286, 1978 pp. 12-15. FIG. 3 depicts prior-art circuitry implementing equation (4), comprising $d-1$ registers 113 denoted D(0) through D(d−2); d−1 constant finite-field multipliers 110 implementing multiplication by $\alpha^j$ for j from 0 to d−2; d−1 three-input multiplexers 111; and a (d−1)-input EXCLUSIVE-OR circuit 112. All registers, multiplexers, multipliers and data paths are symbol wide.

In the operation of FIG. 3, first the following process is repeated d−1 times for j from 0 to d−2: present coefficient $R_j$ and assert control signal LD_D(j) to store $R_j$ in D(j). Then control signal EN is asserted and the following process is repeated d−1 times for i from 0 to d−2: syndrome $S_i$ is produced on OUT and stored elsewhere and the outputs of multipliers $\alpha^j$ 110 are stored in respective registers D(j) 113 for j from 0 to d−2.

The circuit of FIG. 3 is undesirable because it requires an excessive number of registers and constant finite-field multipliers and a very large EXCLUSIVE-OR circuit. Thus it is clear that improved methods for computing frequency-domain syndromes are needed.

ITERATIVE ALGORITHM

Iterative algorithms for generating the error locator polynomial for Reed-Solomon and related codes are known in the art; see Clark and Cain, *Error Correction Coding for Digital Communications*, 1981, pp. 204–208. Iterative algorithms which require no inversion are also known in the art; see Burton, "Inversionless Decoding of Binary BCH Codes," *IEEE Transactions on Information Theory*, IT-17, 1971, pp. 464–466. FIG. 4 shows the steps of a prior-art inversionless iterative algorithm. In step 1, counters n, k and L, parameter $d_k$ and polynomials $\sigma^{(n)}$ and $\sigma^{(k)}$ are initialized. In step 2, the nth discrepancy $d_n$ is calculated. If $d_n$ is zero, control passes to step 6. Otherwise, step 3 calculates the updated error locator polynomial $\sigma^{(p)}$. Then if counter L is greater than or equal to the difference n-k, control is passed to step 5. Otherwise step 4 updates counters k and L, copies $d_n$ to $d_k$ and copies $\sigma^{(n)}$ to $\sigma^{(k)}$. Step 4 copies $\sigma^{(p)}$ to $\sigma^{(n)}$. Step 6 multiplies $\sigma^{(k)}$ by x and increments counter n. Then if counter n is less than 2·t, control is passed to step 2. Otherwise, the iterative algorithm has been completed and $\sigma^{(n)}$ is the desired error locator polynomial. The prior-art iterative algorithm of FIG. 4 is undesirable because it requires storage elements for three polynomials and repeated copying of polynomial coefficients from one storage area to another.

FINITE-FIELD COMPUTATIONS

Hardware capable of performing the computations required for decoding Reed-Solomon and related codes are known in the art; see Glover and Dudley, *Practical Error Correction Design for Engineers*, 1988, page 353. FIG. 5 shows the major blocks of a prior-art decoding circuit comprising syndrome generator 180; syndrome buffer 181; work buffer 182; sequencer 183; registers 195 A, B, C, D, E, F, G and H; read-only-memory tables 184; EXCLUSIVE-OR circuit 185; zero-detection circuits 186 and 187; finite-field logarithm read-only-memories 188 and 189; NOR circuit 190; ones-complementing circuit 191; modulo-255 adder 192; finite-field antilogarithm table 193; and gating circuit 194. Unless otherwise noted, all paths are eight bits wide.

In operation of FIG. 5, syndrome generator 180 generates frequency-domain syndromes for all interleaved codewords simultaneously and stores them in syndrome buffer 181. Sequencer 183 controls the operation of the decoder, using work buffer 182 to store intermediate results produced using the other circuitry. Finite-field sums are produced using EXCLUSIVE-OR circuit 185. Finite-field variable products are produced using logarithm tables 188 and 189, adder 192, antilogarithm table 192, zero-detection circuits 186 and 187, NOR circuit 190 and gating circuit 194. Finite-field inversion is performed using read-only memory tables 184.

The circuitry of FIG. 5 is undesirable because it requires an excessive amount of complex and relatively slow circuitry. Syndrome generator 180 contains separate syndrome computation circuits for each interleaved codeword. The finite-field computation circuit contains a large number of registers. The read-only-memory circuits of 184, 188, 189 and 192 are both complex and slow, limiting the maximum rate of operation. It is clear that less expensive, faster circuitry is needed.

CRC RESIDUE ADJUSTMENT

The ANSI/ISO standards for 90 mm and 130 mm optical disk media provide for a CRC code covering all interleaves of the user data and the vendor-unique/-pointer information bytes. This distance-five, Reed-Solomon code has information symbols comprising the EXCLUSIVE-OR sum of bytes across interleaves. The CRC code generator polynomial GC(x) is of degree four:

$$GC(x) = \prod_{i=c}^{c+dc-1} (x \oplus \alpha^i). \tag{5}$$

where dc is the degree and c is the offset of the CRC code generator polynomial. The time-domain CRC residue polynomial RC(x) has coefficients $RC_j$ defined by $$RC(x) = CC'(x) MOD GC(x) = \sum_{j=0}^{dc-2} RC_j^* x^j \tag{6}$$

where CC'(x) is the received CRC codeword polynomial. The residue of this code must be adjusted to remove the contribution of each identified error. After all errors have been identified, the adjusted CRC residue must be zero; if not, a miscorrection of an uncorrectable error by the error correction code has been detected.

One method for adjusting the CRC residue is to re-encode the sector after the error detection, identification and correction process has been completed and check that the re-encoded CRC redundancy symbols match the corrected CRC redundancy symbols. This method is undesirable because it requires additional hardware to provide access to the corrected data and additional time to perform the re-encoding process.

Another method for adjusting the CRC residue is to compute CRC syndromes $SC_{c+i}$ from CRC residue coefficients $RC_j$ according to:

$$SC_{c+i} = \sum_{j=0}^{dc-2} RC_j^* \alpha^{(c+i)j} \tag{7}$$

and then adjust the CRC syndromes according to:

$$SC_{c+i} = SC_{c+i} \oplus \sum_{j=1}^{N} E_j^* \alpha^{(c+i) \cdot L_j} \tag{8}$$

where N is the total number of errors in symbols covered by the CRC code, $E_j$ are the error values and $L_j$ are the locations of the errors relative to the CRC code. This method is undesirable because it requires additional time to compute the CRC syndromes and to perform the adjustment. It is clear that faster and less expensive methods for adjusting the CRC residue are needed.

SUMMARY OF THE INVENTION

Apparatus and methods are disclosed for providing an improved system for identifying the location and value of errors introduced in binary data encoded using Reed-Solomon and related codes and to detect miscorrections of such codes with an auxiliary code. The invention employs an architecture based on a microcode engine that is specialized for error identification and that supports interleaved codewords. This architecture can be efficiently fabricated as an integrated circuit, yet is capable of identifying multiple introduced errors "on the fly" i.e. with performance sufficient to not significantly slow the process of reading from data storage or transmission subsystems such as, but not limited to, optical disks. In the preferred embodiment, a new two-step method of error syndrome computation is employed to reduce circuit cost and complexity. An improved iterative algorithm is provided which reduces circuit cost and complexity and decreases the time required to generate the error locator polynomial. Cyclic redundancy check (CRC) information is adjusted as introduced errors are identified during the Chien search, thus reducing the time required to protect against ECC miscorrection. Externally-specified error thresholds allow detection of excessive numbers of errors.

In accordance with the foregoing, an object of the present invention is, in the typical case, to identify a plurality of errors introduced within a particular sector during the time period in which the next adjacent sector is being read or received from the storage or transmission medium. In the atypical case where the time required to identify the number of introduced errors exceeds the time required to read the next adjacent sector, or where the number of introduced errors exceeds either an externally specified threshold or the correction power of the specific Reed-Solomon code used, the present invention detects this case, signals an external microcontroller and signals the ENDEC section of the CL-SM330 to cease reading the medium.

Another object of the present invention is to reduce the implementation cost and complexity of error identification circuitry by performing error syndrome computation in two steps, where each step processes half of the required bits through a finite-field computation circuit of approximately half the size required by the prior-art one-step method.

Another object of the present invention is to provide an enhancement of the prior-art iterative algorithm to allow computing the coefficients of the error locator polynomial in a manner that is quicker and requires less circuitry than prior-art implementations by using two polynomials and by interchanging the values of two pointers to two tables containing the coefficients of these polynomials and interchanging their associated parameters.

Another object of the present invention is to reduce the time required by the error identification computation by performing, during the Chien search for introduced errors, the required adjustment of the CRC information whenever an error is identified. Data paths and computation circuits are provided specifically to support this objective.

Another object is to provide an architecture particularly suitable for error identification computations which includes both a specialized data-path design and a set of specialized microengine instructions and which is suitable for implementation in an integrated circuit.

Another object is to provide elements of the set of microengine instructions which efficiently control the execution of finite-field variable multiply-and-sum operations.

Another object of the present invention is to accept time-domain error syndromes so as to support a high performance, cost-efficient implementation for Reed-Solomon codes that allows the same LFSR to be used for both encoding and decoding of Reed-Solomon codewords.

Another object is to support the ANSI/ISO standard formats for both 512-byte and 1024-byte sector sizes and both 90 mm and 130 mm optical-disk medium sizes.

Another object is to allow the code symbols of the information polynomial to be interleaved, as is known in the art, among a plurality of codeword polynomials, each containing its own independent redundancy polynomial while using the same error identification circuitry for each interleave.

Another object is to allow the EXCLUSIVE-OR sum across interleaves of the code symbols of the information polynomial to form the information symbols of a codeword of an overlay CRC code.

Another object is to adjust this CRC information as errors are detected during the Chien search, thus reducing the time required to protect against ECC miscorrection.

Another object is to detect when the number of errors identified within a sector exceeds externally specified thresholds.

These and other objects of the invention will become apparent from the detailed disclosures following herein.

BRIEF DESCRIPTION OF THE DRAWINGS

FIG. 2 illustrates the ANSI standard layout of the data area within a sector containing 512 user data bytes on 90 mm CCS optical-disk media.

FIG. 15 is a register address and bit assignment map of the interface between the error identifier circuit and the external microcontroller.

DESCRIPTION OF THE PREFERRED EMBODIMENT

SYSTEM DESCRIPTION

Figure 1:
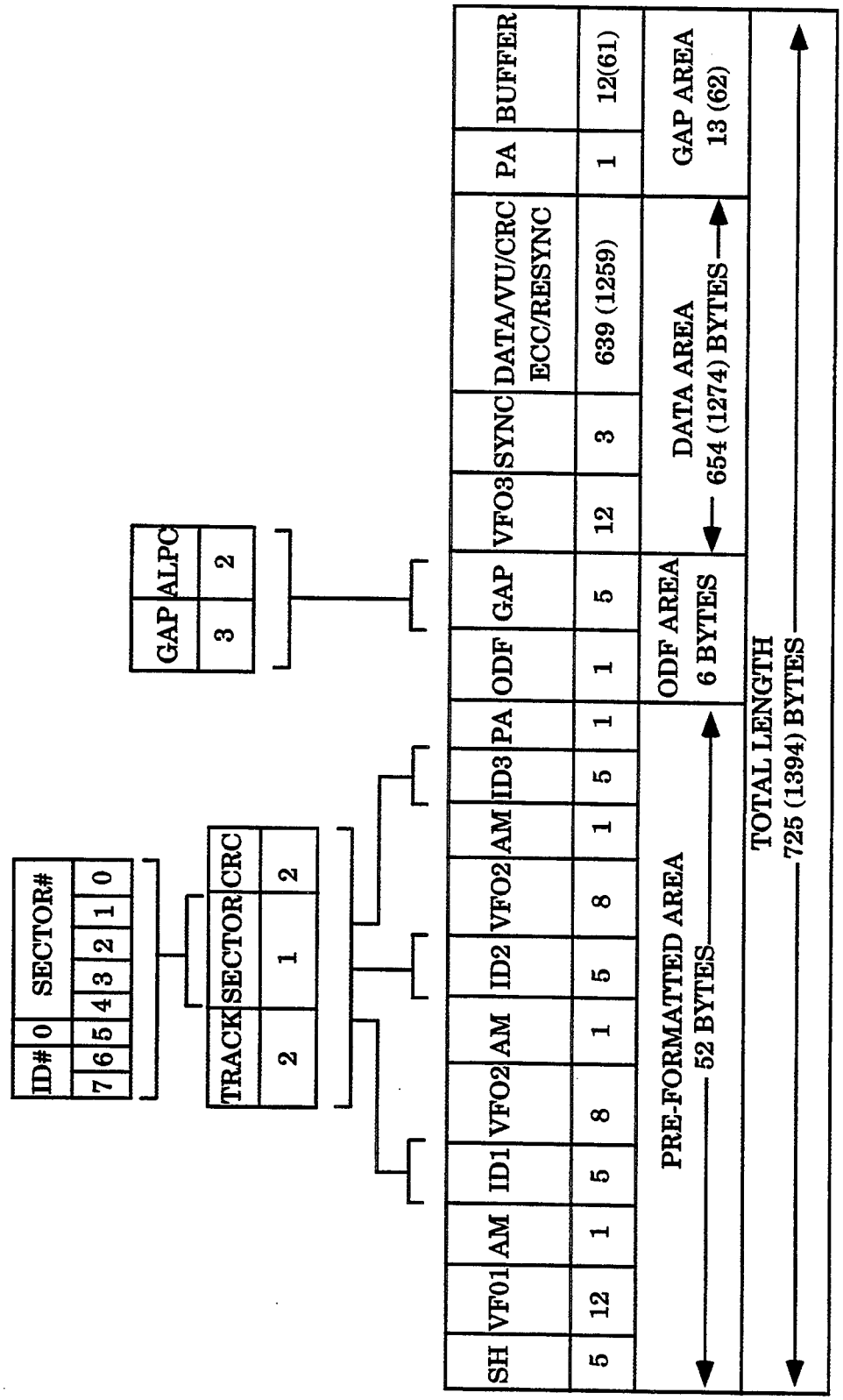
FIG. 1 illustrates the ANSI standard layout of a sector containing 512 user data bytes on 90 mm Continuous Composite Servo (CCS) optical-disk media.
Figure 3:
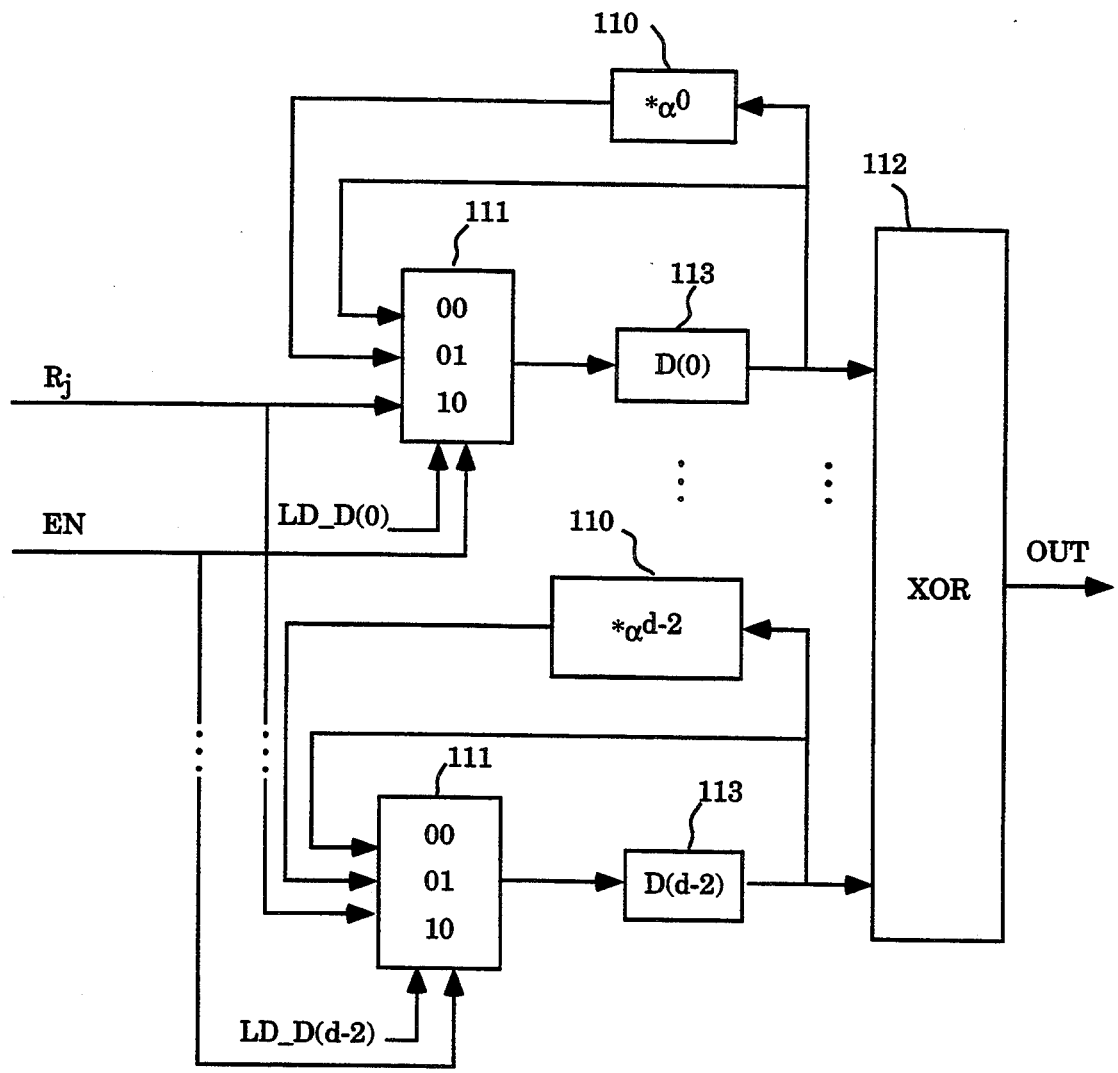
FIG. 3 is a logic diagram of a prior-art syndrome computation circuit that outputs one syndrome per clock cycle.
Figure 4:
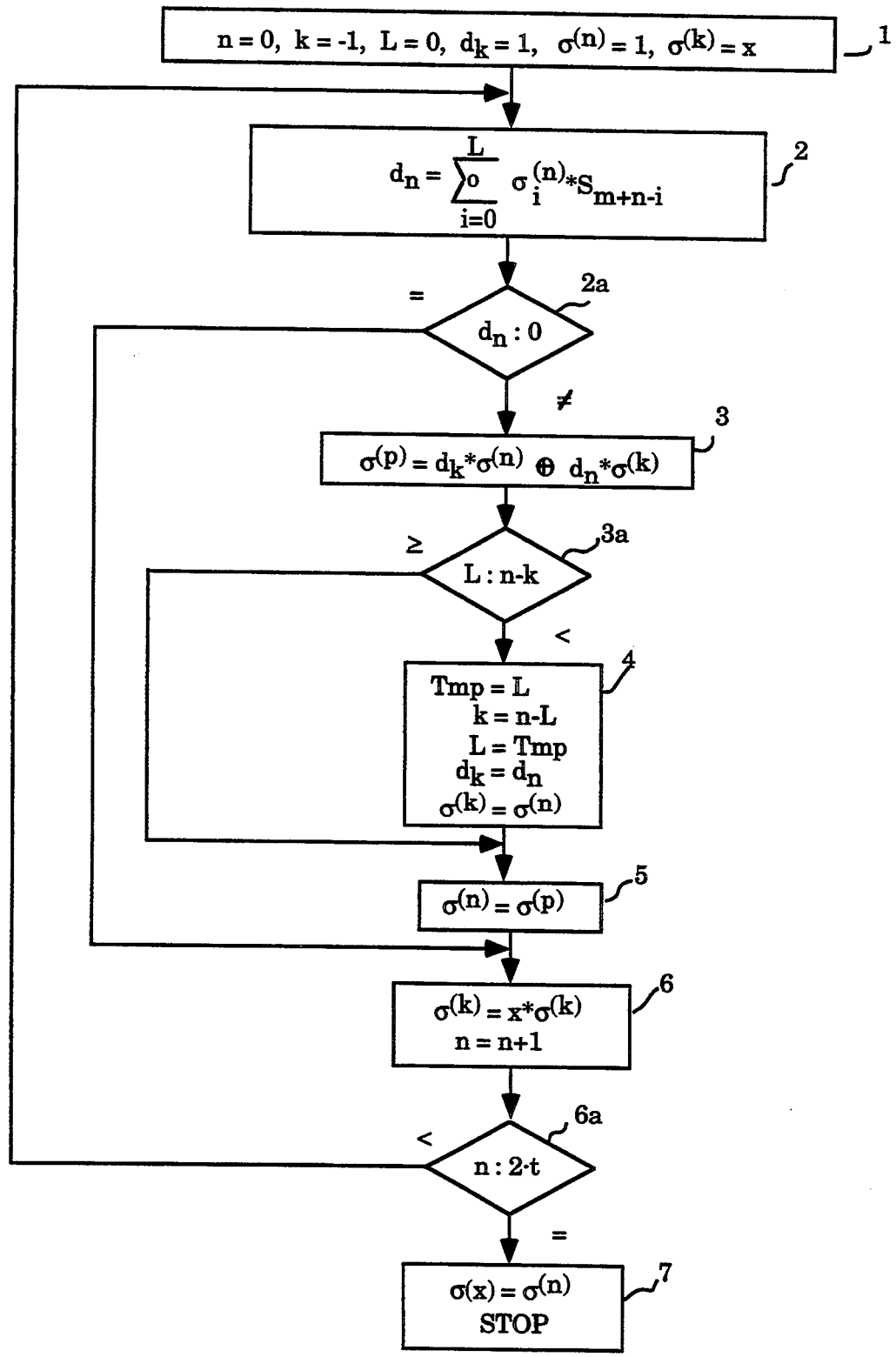
FIG. 4 is a flow chart of a prior-art iterative algorithm for computing the coefficients of the error locator polynomial.
Figure 5:
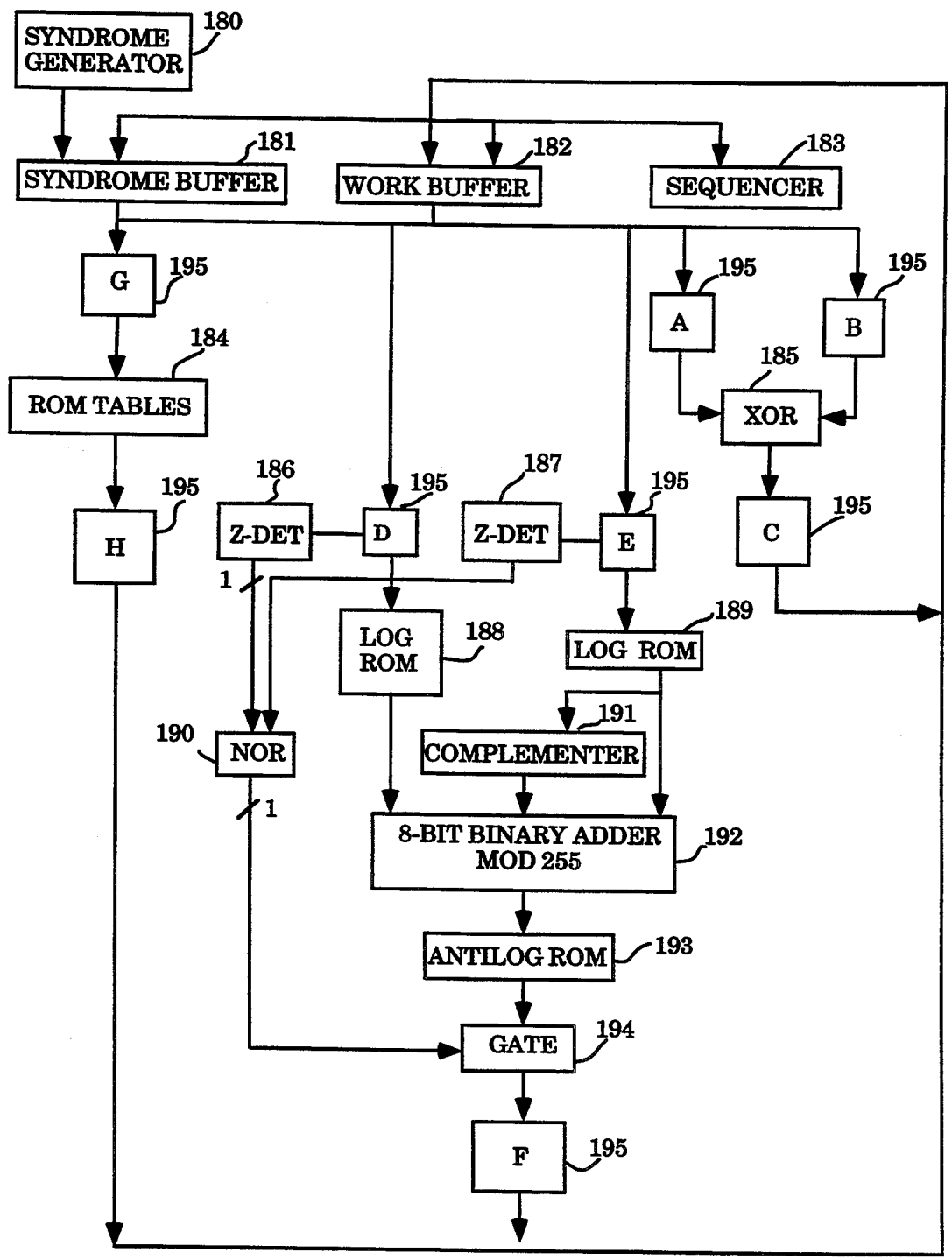
FIG. 5 is a block diagram of a prior-art circuit for performing finite-field computations.
Figure 6:
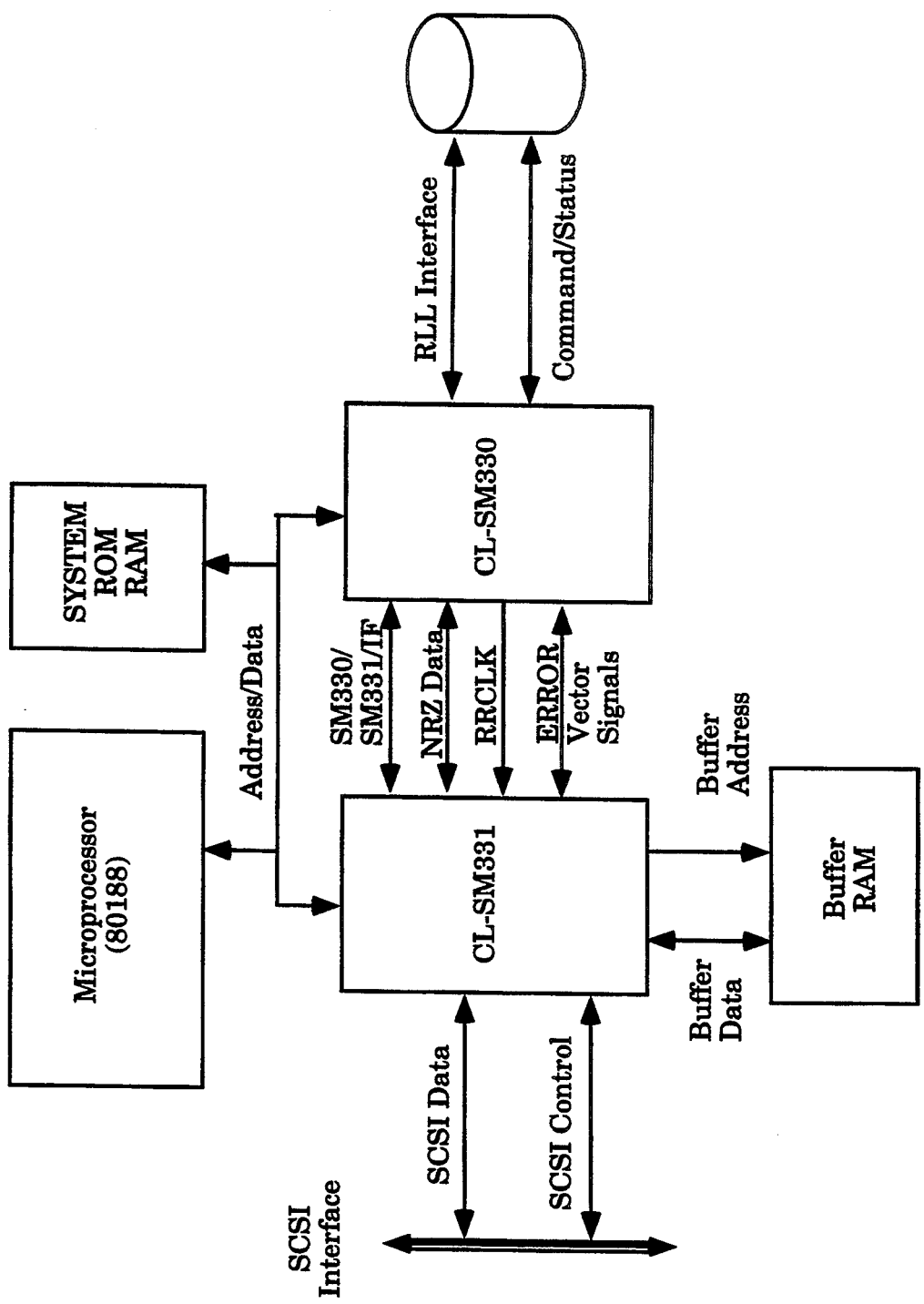
FIG. 6 is a block diagram of an optical-disk data-storage system containing the present invention.

FIG. 6 is a block diagram of an optical disk system for data storage that embodies the present invention within the CL-SM330 integrated circuit. The CL-SM330 and CL-SM331 are a set of two high-integration, integrated circuits for optical disk controllers for embedded controller applications. They fully support the ANSI/ISO industry standard optical disk formats using the CCS (Continuous Composite Servo) standard for both 90 mm (3.5") and 130 mm (5.25") optical disk drives. The rewritable, partial ROM and WORM (Write Once Read Many) standards are supported. The high integration and optimized pin-out of the CL-SM330/331 make them suitable for embedded controller applications, particularly for 90 mm drives where only limited board space is available. The CL-SM330 Optical Disk ENDEC/ECC implements the encoder/decoder/formatter and the error detection, identification and correction logic required by the CCS standard. The CL-SM331 SCSI Optical Disk Controller implements a Small Computer System Interface (SCSI), Buffer Manager and Sector formatter. The CL-SM330 and CL-SM331, along with buffer memory, a data separator and a local microcontroller with system Read-Only-Memory and Random-Access-Memory, complete a high-performance, low-cost optical disk controller subsystem.

A local microcontroller provides both the CL-SM330 and the CL-SM331 with initial operating parameters, such as disk sector format, type and size of buffer memory and SCSI host controller. During data transfer operations, the CL-SM330/331 require only minimal intervention from the local microcontroller. Features such as auto-incrementing ID registers and fully-automated error correction (in typical cases) minimize the microcontroller's real-time interaction with disk activity.

Figure 7:
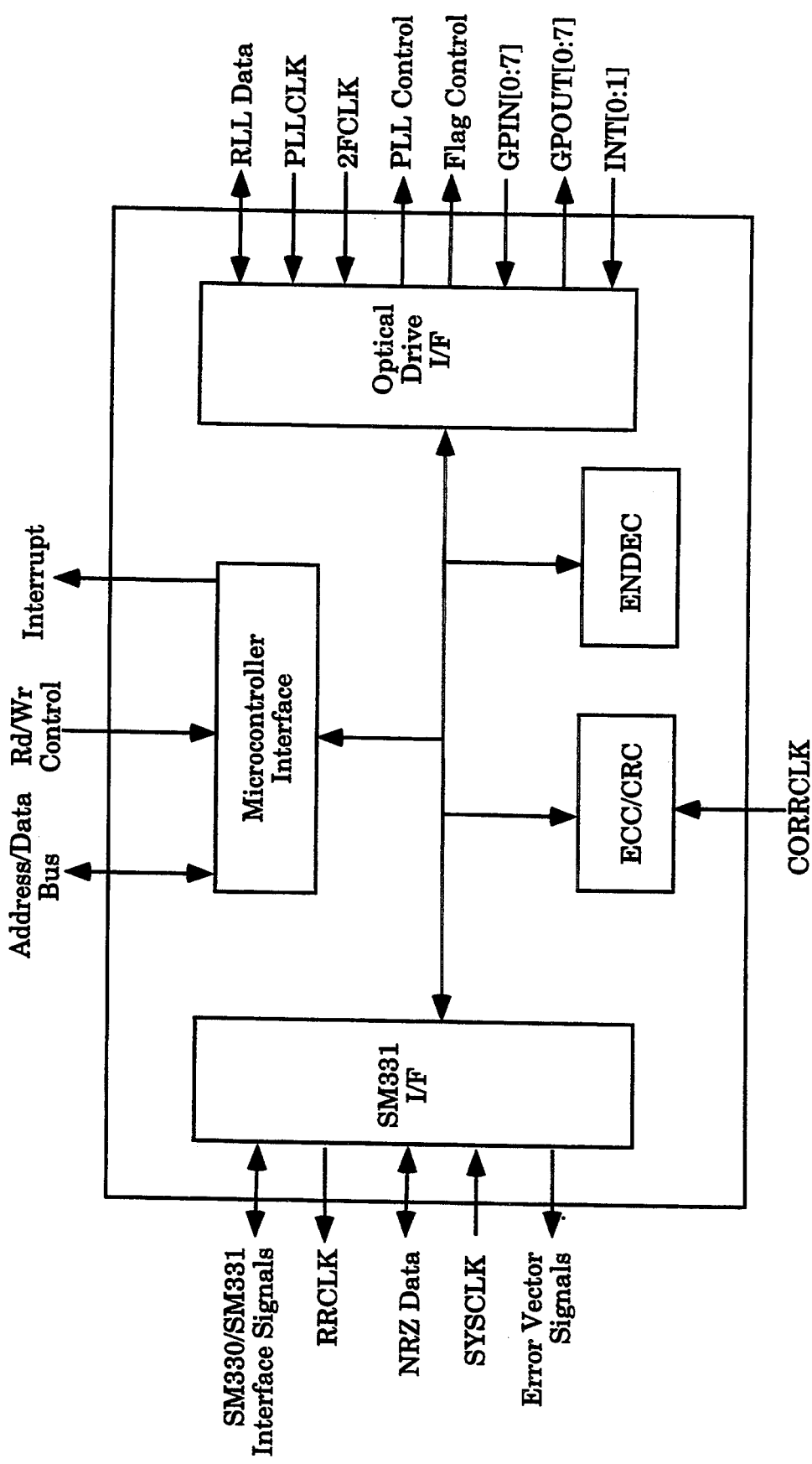
FIG. 7 is a block diagram of the CL-SM330 portion of the optical-disk data-storage system.

FIG. 7 is a block diagram of the CL-SM330 integrated circuit showing its interfaces to the CL-SM331, the microcontroller, and the optical drive, as well as its ENDEC and ECC/CRC circuits. The present invention is part of the ECC/CRC block shown. The microcontroller-to-CL-SM330 communication path is a multiplexed address and data path similar to that provided by Intel 80188 and Motorola 68HC11 classes of microcontrollers. A configuration pin is available to allow selection of the microcontroller-bus control-signal method of either class. Virtually all controller functions are programmable by the microcontroller via read/write registers. This provides substantial firmware control over drive operation to allow for various retry methods and other unique requirements. The CL-SM330 has centralized status registers with interrupt capability. These features allow firmware designers flexibility in writing polled loops or interrupt handlers to provide real-time process control critical in embedded controller drive applications.

The data interface between the CL-SM330 and CL-SM331 is a serial NRZ interface. NRZ data is transmitted between the two devices with the Read-Reference Clock (RRCLK). Disk interface control signals, such as "Sector Mark Found" "ID Found" etc., are used for synchronization of the data transfer between the CL-SM330 and CL-SM331. A dedicated serial Error Vector Interface transfers error correction vectors with the System Clock (SYSCLK) to the CL-SM331 for actual correction of erroneous bytes in the buffer. To protect against errors in the information transmission between the two devices, eight-bit checksums cover all information transferred over the NRZ Interface and the Error Vector Interface. An Interrupt line allows optional connection of the CL-SM331 and CL-SM330 interrupt mechanisms, resulting in a single interrupt line to be handled by the local microcontroller.

The CL-SM330 supports standard 512-user-data-byte sectors with five ECC interleaves or 1024-user-data-byte sectors with ten ECC interleaves. Correction of erroneous data in the buffer is performed by the CL-SM330/331 controller independent of the microcontroller. All but worst-case errors are corrected "on-the-fly", without loss of disk revolutions. "On-the-fly" operation is achieved by identifying the introduced errors using the present invention and generating error correction vectors for each sector while the next adjacent sector is being read by the controller. Error correction vectors are transmitted to the CL-SM331 through the dedicated serial Error Vector Interface. An independent Corrector Clock input (CORRCLK) is provided for the ECC/CRC block to allow optimum error identifier performance, independent of the System Clock frequency. Overlay CRC verification is performed in hardware during the error identification process, resulting in very low miscorrection probability without significant performance penalty.

The CL-SM330 ENDEC section includes the RLL (2,7) encoder/decoder and circuitry for the generation and detection of the special marks required by the optical disk format. Full ANSI/ISO format support provides for programmable Sector Mark, ID Field, Data Sync Mark and Resync Mark thresholds, as well as automatic hardware PLL synchronization and re-synchronization capability, compensation for Sector Mark asymmetry, Flag generation and written Flag detection. Output signals are provided to indicate the position of the Pre-Formatted data area, the Track Offset Flag area and the Automatic Laser Power Control area.

The data connection from the CL-SM330 to the optical drive is a serial RLL (2,7) encoded interface. Output signals are also provided for data synchronizer (PLL) control; during either normal phase lock or, if phase lock is lost while reading, these signals can be used to control the synchronization or resynchronization of the phase-locked loop to the incoming data stream. A general-purpose eight-bit output port and a general-purpose eight-bit input port, as well as two general purpose interrupt inputs, are available on the CL-SM330 to allow customization of the drive interface and minimize external component requirements.

Figure 8:
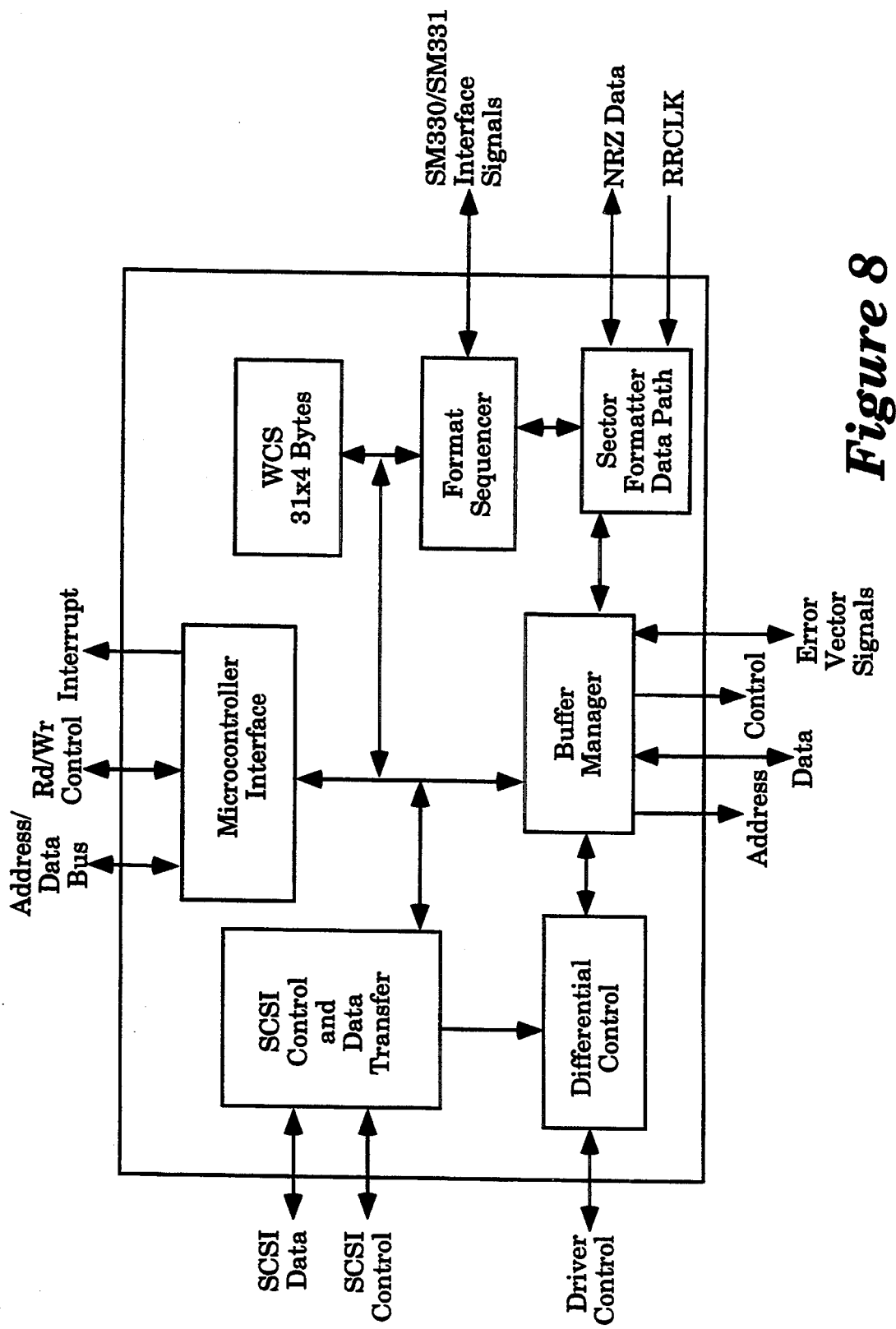
FIG. 8 is a block diagram of the CL-SM331 portion of the optical-disk data-storage system.

FIG. 8 is a block diagram of the CL-SM331 integrated circuit including its interfaces with the SCSI bus and the microcontroller, Buffer Manager and Differential Control circuits, as well as its Format Sequencer and associated Writable Control Store (WCS) and Sector Formatter Data Path. The CL-SM331 Microcontroller Interface is similar to that of the CL-SM330 Microcontroller Interface, with the addition of a Ready signal which enables the CL-SM331 to force wait states on the microcontroller address/data bus.

The CL-SM331 SCSI is designed for compliance with the SCSI-II specification; see Small Computer Standard Interface-2 Draft Proposed American National Standard, XT9.2/86-109 Rev. 10c, X3.131-199x, Mar. 9, 1990. The SCSI logic includes integrated 48 mA drivers for the single-ended option as well as signals for control of the external logic necessary to implement the differential transceiver option. Both the asynchronous and synchronous transfer protocols are supported in either Initiator or Target mode. Routine bus control operations such as arbitration, selection and reselection are automatically sequenced in hardware. This method of implementing the SCSI Interface makes the SCSI protocol firmware extremely flexible and very efficient.

The CL-SM331 Buffer Manager controls the flow of data between the SCSI and disk interface. These interfaces store and retrieve data from the buffer memory using interleaved access cycles. The actual buffer memory may be implemented with static or dynamic RAM devices. The CL-SM331 Buffer Manager is programmable to provide all of the necessary address and control signals for RAM devices of varying access times. Up to 256 KBytes of SRAM can be directly addressed by the CL-SM331. As much as 4 MBytes of DRAM is directly supported by the CL-SM331 with specific control for 64 Kbit, 256 Kbit, 1 Mbit and 4 Mbit devices. In DRAM mode, refresh cycles are generated automatically through a third channel to the buffer memory in addition to the concurrent disk and SCSI accesses. The CL-SM331 Buffer Manager accepts error correction vectors from the CL-SM330 chip and automatically corrects errors in the buffer RAM with no interruption of the current data transfer.

The CL-SM331 Format Sequencer, WCS and Sector Formatter Data Path blocks provide for interface between the CL-SM331 and CL-SM330, as described above. The Data Path logic performs the serial-to-parallel and parallel-to-serial conversion for NRZ data transfer between the buffer and the CL-SM330. The Format Sequencer controls the low-level sector format control, as defined by the pattern loaded in the WCS.

TWO-STEP SYNDROME COMPUTATION

Define $\lfloor x \rfloor$ as the largest integer not greater than x and define $t = \lfloor (d-1)/2 \rfloor$.

Equation (3) can be written as $$S_{m+i} = \sum_{j=0}^{t-1} [R_j * \alpha^{m \cdot j}] * \alpha^{j \cdot i} \oplus \alpha^{t \cdot i} * \sum_{j=0}^{d-2-t} [R_{j+t} * \alpha^{m \cdot (j+t)}] * \alpha^{j \cdot i} \quad (9)$$

$$= A_{m+i} \oplus B_{m+i},$$

where $$A_{m+i} = \sum_{j=0}^{t-1} [R_j * \alpha^{m \cdot j}] * \alpha^{j \cdot i} \quad (9a)$$

$$B_{m+i} = \alpha^{t \cdot i} * \sum_{j=0}^{d-2-t} [R_{j+t} * \alpha^{m \cdot (j+t)}] * \alpha^{j \cdot i} \quad (9b)$$

From equation (9) it is clear that the computation of frequency-domain syndromes $S_{m+i}$ can be performed in two steps wherein one step produces values $A_{m+i}$, the other step produces values $B_{m+i}$, and syndromes $S_{m+i}$ are formed as the EXCLUSIVE-OR sums of respective values $A_{m+i}$ and $B_{m+i}$.

Figure 9:
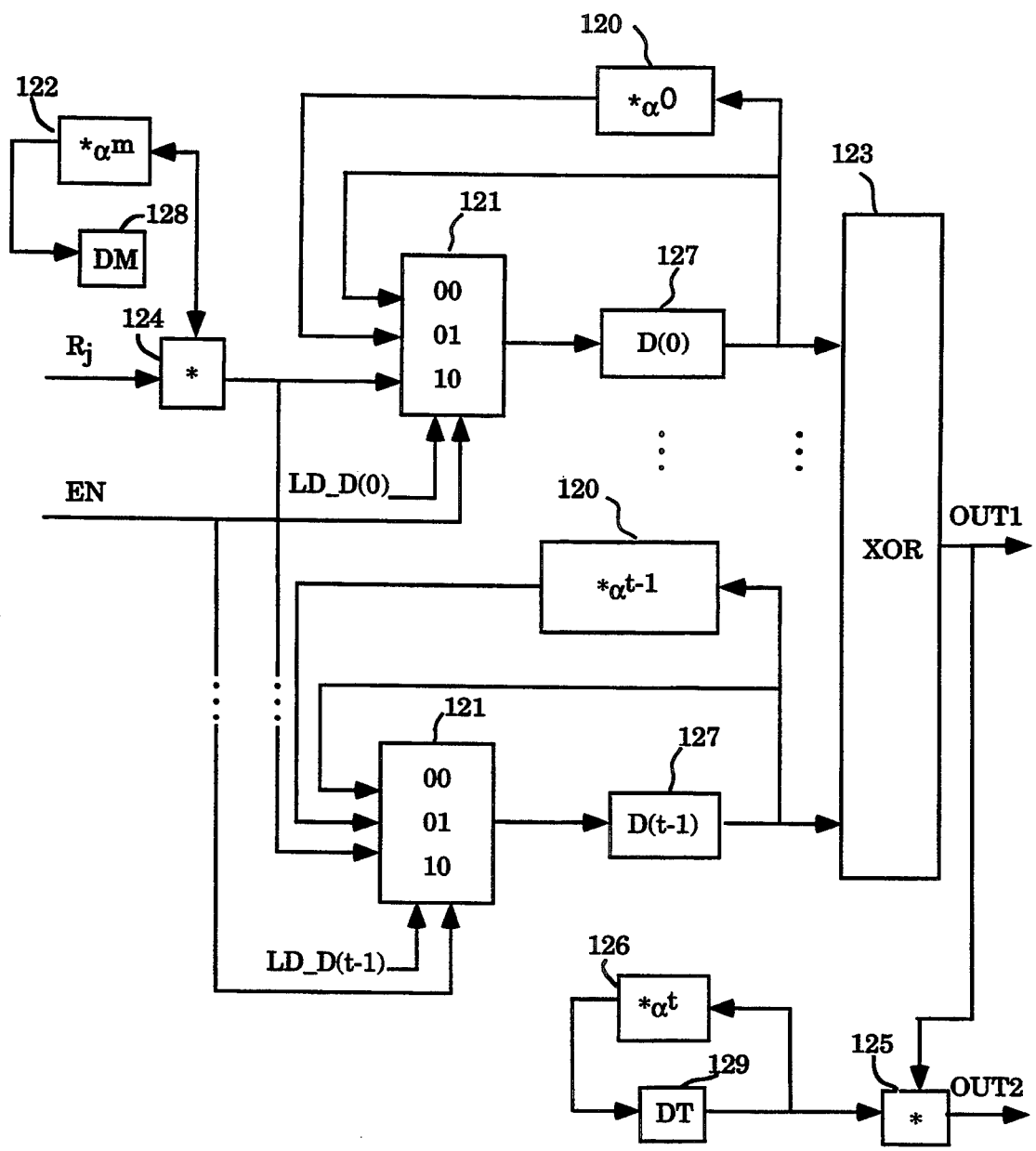
FIG. 9 is a logic diagram of a new two-step syndrome computation circuit.

The circuitry of FIG. 9 implements equation (9) for codes with odd d; it comprises t registers 127 denoted D(0) through D(t−1); t constant finite-field multipliers 120 implementing multiplication by $\alpha^j$ for j from 0 to t−1; t three-input multiplexers 121; register 128 DM; a constant finite-field multiplier 122 implementing multiplication by $\alpha^m$; a t-input EXCLUSIVE-OR circuit 123; register 129 DT; a constant finite-field multiplier 126 implementing multiplication by $\alpha^t$; and two variable finite-field multipliers 124 and 125. Multipliers 124 and 125 may be implemented as one multiplier with appropriate multiplexing of inputs and output, which is preferred due to the circuitry cost of variable multipliers. All registers, multiplexers, multipliers and data paths are symbol wide. Values $A_{m+i}$ are produced on OUT1 and values $B_{m+i}$ are produced on OUT2.

In the first step of operation of FIG. 9, DM is initialized to $\alpha^0$, then the following process is repeated t times for j from 0 to t−1: present coefficient $R_j$ and assert control signal LD_D(j) to store in D(j) the product of $R_j$ and the output of DM, and store the output of multiplier 122 in DM. Then control signal EN is asserted and the following process is repeated d−1 times for i from 0 to d−2: save elsewhere value $A_{m+i}$ on OUT1 and store the outputs of multipliers * $\alpha^j$ 120 in respective registers D(j) for j from 0 to t−1.

In the second step of operation of FIG. 9, DM is initialized to $\alpha^{i \cdot m}$ and the following process is repeated t times for j from 0 to t−1: present coefficient $R_{j+t}$ and assert control signal LD_D(j) to store in D(j) the product of $R_{j+t}$ and the output of DM, and store the output of multiplier 122 in DM. Then DT is initialized to $\alpha^0$, control signal EN is asserted and the following process is repeated d−1 times for i from 0 to d−2: save as $S_{m+i}$ the EXCLUSIVE-OR sum of value $B_{m+i}$ on OUT2 and value $A_{m+i}$ from the first step, store the outputs of multipliers * $\alpha^j$ 120 in respective registers D(j) for j from 0 to t−1, and store the output of multiplier * $\alpha^t$ 126 in DT.

Using the circuit of FIG. 9, it is possible to reverse the order of the two steps, first processing $R_t$ through $R_{d-2}$ and then processing $R_0$ through $R_{t-1}$. In the first step of operation, initialize DM to $\alpha^{i \cdot m}$ load registers D(j) while presenting $R_t$ through $R_{d-2}$, then initialize DT to $\alpha^0$ and save elsewhere values $B_{m+i}$ from OUT2. In the second step of operation, initialize DM to $\alpha^0$, load registers D(j) while presenting $R_0$ through $R_{t-1}$, then save as $S_{m+i}$ the EXCLUSIVE-OR sum of values $A_{m+i}$ from OUT1 and respective values $B_{m+i}$ from the first step.

With a slight modification to the circuit of FIG. 9, it is possible to reverse the order in which the remainder coefficients $R_j$ are processed within each step, in one step processing $R_{d-2}$ through $R_t$ and in the other step processing $R_{t-1}$ through $R_0$. Replace multiplier 122 with a multiplier implementing multiplication by $\alpha^{-m}$. In the first step of operation, initialize DM to $\alpha^{(d-2) \cdot m}$, load registers D(j) while presenting $R_{d-2}$ through $R_t$, then initialize DT to $\alpha^0$ and save elsewhere values $B_{m+i}$ from OUT2. Then in the second step of operation, initialize DM to $\alpha^{(t-1) \cdot m}$, load registers D(j) while presenting $R_{t-1}$ through $R_0$, then save as syndromes $S_{m+i}$ the EXCLUSIVE-OR sums of values $A_{m+i}$ from OUT1 and respective values $B_{m+i}$ from the first step. Alternatively, in the first step of operation, initialize DM to $\alpha^{(t-1) \cdot m}$ and load registers D(j) while presenting $R_{t-1}$ through $R_0$, then initialize DT to $\alpha^0$ and save elsewhere values $B_{m+i}$ from OUT2. Then in the second step of operation, initialize DM to $\alpha^{(d-2) \cdot m}$, load registers D(j) while presenting $R_{d-2}$ through $R_t$, then save as syndromes $S_{m+i}$ the EXCLUSIVE-OR sums of values $A_{m+i}$ from OUT1 and respective values $B_{m+i}$ from the first step.

When d is even, the equation for values $B_{m+i}$ becomes $$B_{m+i} = \alpha^{t \cdot i *} \sum_{j=0}^{t} [R_{j+t} * \alpha^{m \cdot (j+i)}] * \alpha^{j \cdot i} \qquad (9c)$$

and the circuit of FIG. 9 is modified to include a register D(t) and another constant finite-field multiplier 120 implementing multiplication by $\alpha^t$ and another three-input multiplexer 121, all connected as for existing registers D(j), multipliers 120 and multiplexers 121. EXCLUSIVE-OR circuit 123 becomes a (t+1)-input EXCLUSIVE-OR circuit. Operation is modified to load register D(t) with zero before producing values $A_{m+i}$ and with $R_{2 \cdot t}$ before producing values $B_{m+i}$. Remainder coefficients may be processed in reverse order by performing the same modification described above.

When d is even, it is possible to compute the syndromes in two steps wherein one step processes remainder coefficients $R_j$ for j from 0 to t and the other step processes coefficients $R_j$ for j from t+1 to d−2. To do so requires only replacing multiplier 126 with a multiplier implementing multiplication by $\alpha^{t+1}$. D(t) is loaded with $R_t$ before producing values $A_{m+i}$ and with zero before producing values $B_{m+i}$.

Equation (3) can also be written as $$S_{m+i} = \alpha^{-t \cdot i *} \sum_{j=t}^{2 \cdot t - 1} [R_{j-t} * \alpha^{m \cdot (j-i)}] * \alpha^{j \cdot i} \oplus \sum_{j=t}^{d-2-t} [R_j * \alpha^{m \cdot j}] * \alpha^{j \cdot i} \qquad (10)$$

$$= A_{m+i} \oplus B_{m+i},$$

where $$A_{m+i} = \alpha^{-t \cdot i *} \sum_{j=t}^{2 \cdot t - 1} [R_{j-t} * \alpha^{m \cdot (j-i)}] * \alpha^{j \cdot i} \qquad (10a)$$

$$B_{m+i} = \sum_{j=t}^{d-2-t} [R_j * \alpha^{m \cdot j}] * \alpha^{j \cdot i} \qquad (10b)$$

From equation (10) it is clear that the computation of frequency-domain syndromes $S_{m+i}$ can be performed in two steps wherein one step produces values $A_{m+i}$, the other step produces values $B_{m+i}$, and syndromes $S_{m+i}$ are formed as the EXCLUSIVE-OR sums of respective values $A_{m+i}$ and $B_{m+i}$.

Figure 10:
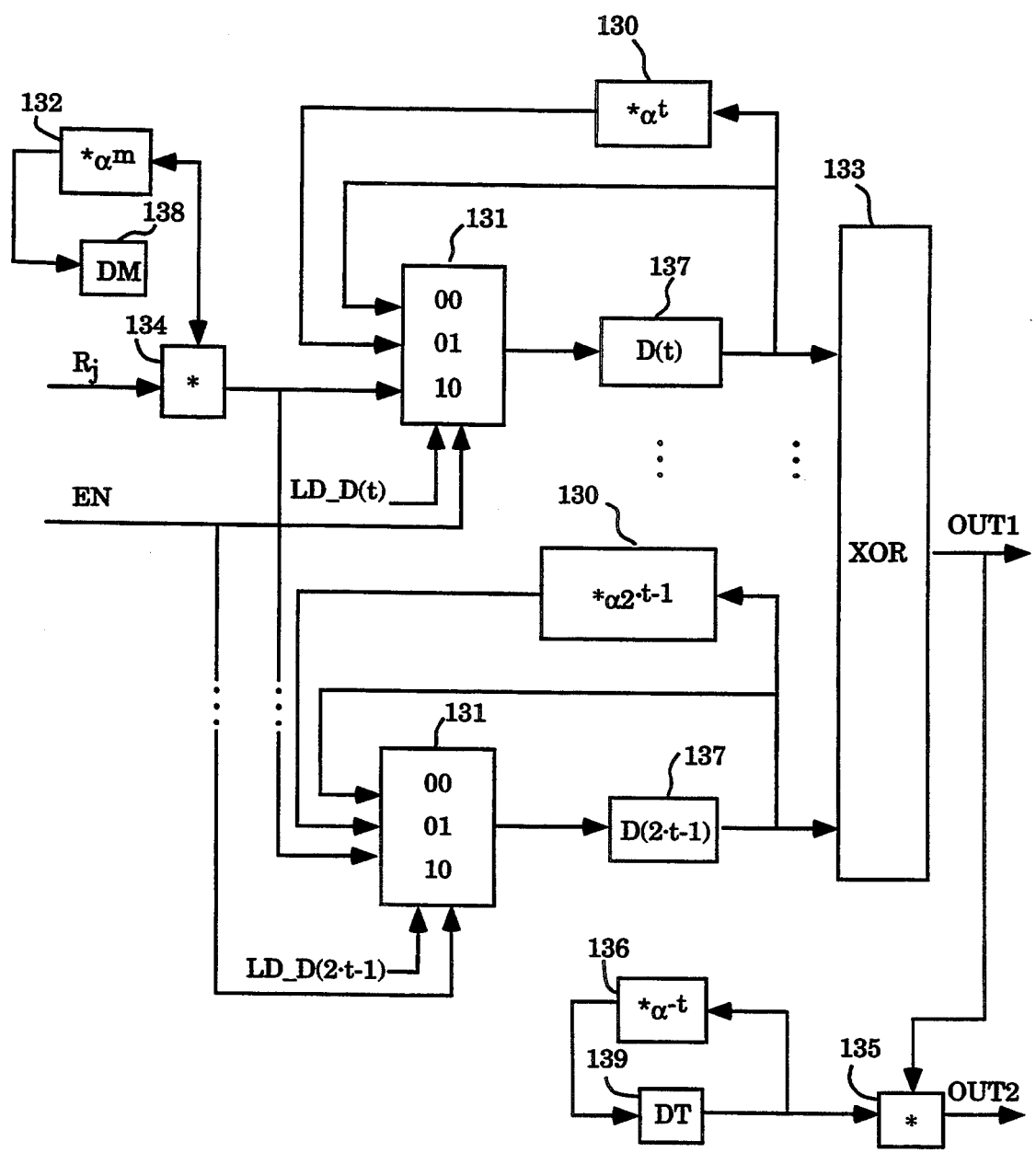
FIG. 10 is a logic diagram of a two-step syndrome computation circuit equivalent to that of FIG. 9 except for the constant finite-field multipliers implemented.

The circuitry of FIG. 10 implements equation (10) for codes with odd d; it comprises t registers 137 denoted D(t) through D(2·t−1); t constant finite-field multipliers 130 implementing multiplication by $\alpha^j$ for j from t to 2·t−1; t three-input multiplexers 131; register 138 denoted DM; a constant finite-field multiplier 132 implementing multiplication by $\alpha^m$; a t-input EXCLUSIVE-OR circuit 133; register 139 denoted DT; a constant finite-field multiplier 136 implementing multiplication by $\alpha^{-t}$; and two variable finite-field multipliers 134 and 135. Multipliers 134 and 135 may best be implemented as one multiplier with appropriate multiplexing of inputs and output. Values $A_{m+i}$ are produced on OUT2 and values $B_{m+i}$ are produced on OUT1.

In the first step of the operation of FIG. 10, DM is initialized to $\alpha^0$ and the following process is repeated t times for j from t to 2·t−1: present coefficient $R_{j-t}$ and assert control signal LD_D(j) to store the product of $R_{j-t}$ and the output of DM in D(j), and store the output of multiplier * $\alpha^m$ 132 in DM. Then DT is initialized to $\alpha^0$ control signal EN is asserted and the following process is repeated d−1 times for i from 0 to d−2: save elsewhere value $A_{m+i}$ from OUT2, store the outputs of multipliers * $\alpha^j$ 130 in respective registers D(j) for j from t to d−2, and store the output of multiplier * $\alpha^{-t}$ 136 in DT.

In the second step of operation of FIG. 10, DM is initialized to $\alpha^{t \cdot m}$ and the following process is repeated t times for j from t to 2·t−1: present coefficient $R_j$ and assert control signal LD_D(j) to store the product of $R_j$ and the output of DM in D(j), and store the output of multiplier 132 $\alpha^m$ in DM. Then control signal EN is asserted and the following process is repeated d−1 times for i from 0 to d−2: save as $S_{m+1}$ the EXCLUSIVE-OR sum of value $B_{m+i}$ from OUT2 and value $A_{m+i}$ from the first step and store the outputs of multipliers $\alpha^j$ 130 in respective registers D(j) for j from t to d−2.

Using the circuit of FIG. 10, it is possible to reverse the order of the two steps, first processing $R_t$ through $R_{d-2}$ and then processing $R_0$ through $R_{t-1}$. In the first step of operation, initialize DM to $\alpha^{t \cdot m}$, load registers D(j) while presenting $R_t$ through $R_{d-2}$, then save elsewhere values $B_{m+i}$ from OUT1. In the second step of operation, initialize DM to $\alpha^0$ load registers D(j) while presenting $R_0$ through $R_{t-1}$, then initialize DT to $\alpha^0$ and save as $S_{m+i}$ the EXCLUSIVE-OR sum of values $A_{m+i}$ from OUT2 and respective values $B_{m+i}$ from the first step.

With a slight modification to the circuit of FIG. 10, it is possible to reverse the order in which the remainder coefficients $R_j$ are processed within each step, in one step processing $R_{d-2}$ through $R_t$ and in the other step processing $R_{t-1}$ through $R_0$. Replace multiplier 132 with a multiplier implementing multiplication by $\alpha^{-m}$. In the first step of operation, initialize DM to $\alpha^{(d-2)\cdot m}$, load registers D(j) while presenting $R_{d-2}$ through $R_t$, then save elsewhere values $B_{m+i}$ from OUT1. In the second step of operation, initialize DM to $\alpha^{(t-1)\cdot m}$ load registers D(j) while presenting $R_{t-1}$ through $R_0$, then initialize DT to $\alpha^0$ and save as syndromes $S_{m+i}$ the EXCLUSIVE-OR sums values $A_{m+i}$ from OUT2 and respective values $B_{m+i}$ from the first step. Alternatively, in the first step of operation, initialize DM to $\alpha^{t\cdot m}$, load registers D(j) while presenting $R_{t-1}$ through $R_0$, then initialize DT to $\alpha^0$ and save elsewhere values $A_{m+i}$ from OUT2. In the second step of operation, initialize DM to $\alpha^{(d-2)\cdot m}$ load registers D(j) while presenting $R_{d-2}$ through $R_t$, then save as syndromes $S_{m+i}$ the EXCLUSIVE-OR sums of values $B_{m+i}$ from OUT1 and respective values $A_{m+i}$ from the first step.

Figure 12:
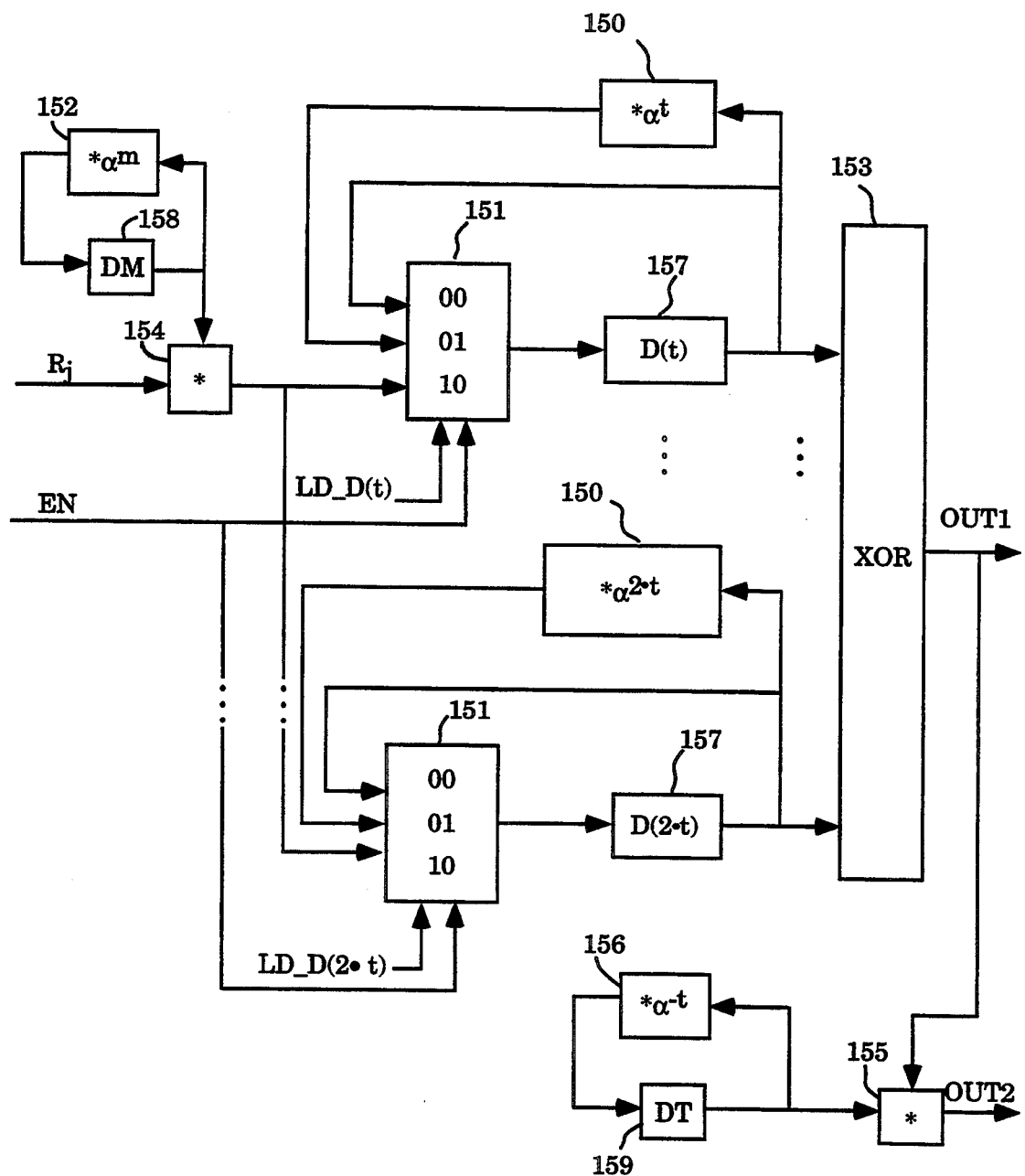
FIG. 12 is a logic diagram of another circuit which can be shared for two-step syndrome computation and for finding the roots of the error locator polynomial.

When d is even, the equation for values $B_{m+i}$ becomes $$B_{m+i} = \sum_{j=t}^{2\cdot t} [R_j * \alpha^{m\cdot j}] * \alpha^{j\cdot i} \qquad (10c)$$

and the circuit of FIG. 12 is used. Operation is similar to that for FIG. 10 except that register D(2·t) is loaded with zero before producing values $A_{m+i}$ and with $R_{2\cdot t}$ before producing values $B_{m+i}$. Remainder coefficients may be processed in reverse order by modifying FIG. 12 in a fashion similar to that described for FIG. 10.

When d is even, it is possible to modify the circuit of FIG. 12 to compute the syndromes in two steps wherein one step processes remainder coefficients $R_j$ for j from 0 to t and the other step processes coefficients $R_j$ for j from t+1 to d−2. To do so requires only replacing multiplier 156 with a multiplier implementing multiplication by $\alpha^{t+1}$. D(2·t) is loaded with $R_t$ before producing values $A_{m+i}$ and with zero before producing values $B_{m+i}$.

In the preferred embodiment of the invention, the CL-SM330's Encode/Decode LFSR block presents interleaved remainder coefficients $R_j$ sequentially from $R_{d-2}$ of the first interleaved codeword to $R_0$ of the last interleaved codeword, and these coefficients are stored in the error identifier RAM in that order beginning at a fixed address. Further, the number of interleaved codewords can be either five or ten, so the address in the identifier RAM of coefficient $R_0$ of a codeword is not fixed. Therefore it is desirable to use a syndrome computation which accepts the remainder coefficients in order from $R_{d-2}$ to $R_0$; where the order of the two steps of syndrome computation is reversed and the order in which the coefficients $R_j$ are processed within each steps is reversed, i.e. in the first step, $R_{d-2}$ through $R_t$ are processed to produce values $B_{m+i}$ and in the second step, $R_{t-1}$ through $R_0$ are processed to produce syndromes $S_{m+i}$ as the EXCLUSIVE-OR sums of respective values $A_{m+i}$ and $B_{m+i}$.

SHARING ERROR LOCATION CIRCUITRY

Errors can be located by finding the inverse roots of the error locator polynomial $$\sigma(x) = \sum_{j=0}^{e} \sigma_j * x^j \qquad (11)$$

where e is the number of errors, $1 \leq e \leq t$. Observe that at a root $\alpha^i$ of $\sigma(x)$, $$\sigma(x)\bigg|_{\alpha^i} = \sum_{j=0}^{e} \sigma_j * \alpha^{j\cdot i} = 0. \qquad (12)$$

The roots of $\sigma(x)$ can be found by successively evaluating $\sigma(x)$ at all $x = \alpha^i$ for i from 0 to n−1, where $n < 2^b$ is the codeword length. A value of $\alpha^i$ for which $\sigma(\alpha^i)$ evaluates to zero is a root of $\sigma(x)$, and (−i) is the corresponding error location. This method is known as a Chien search.

Figure 11:
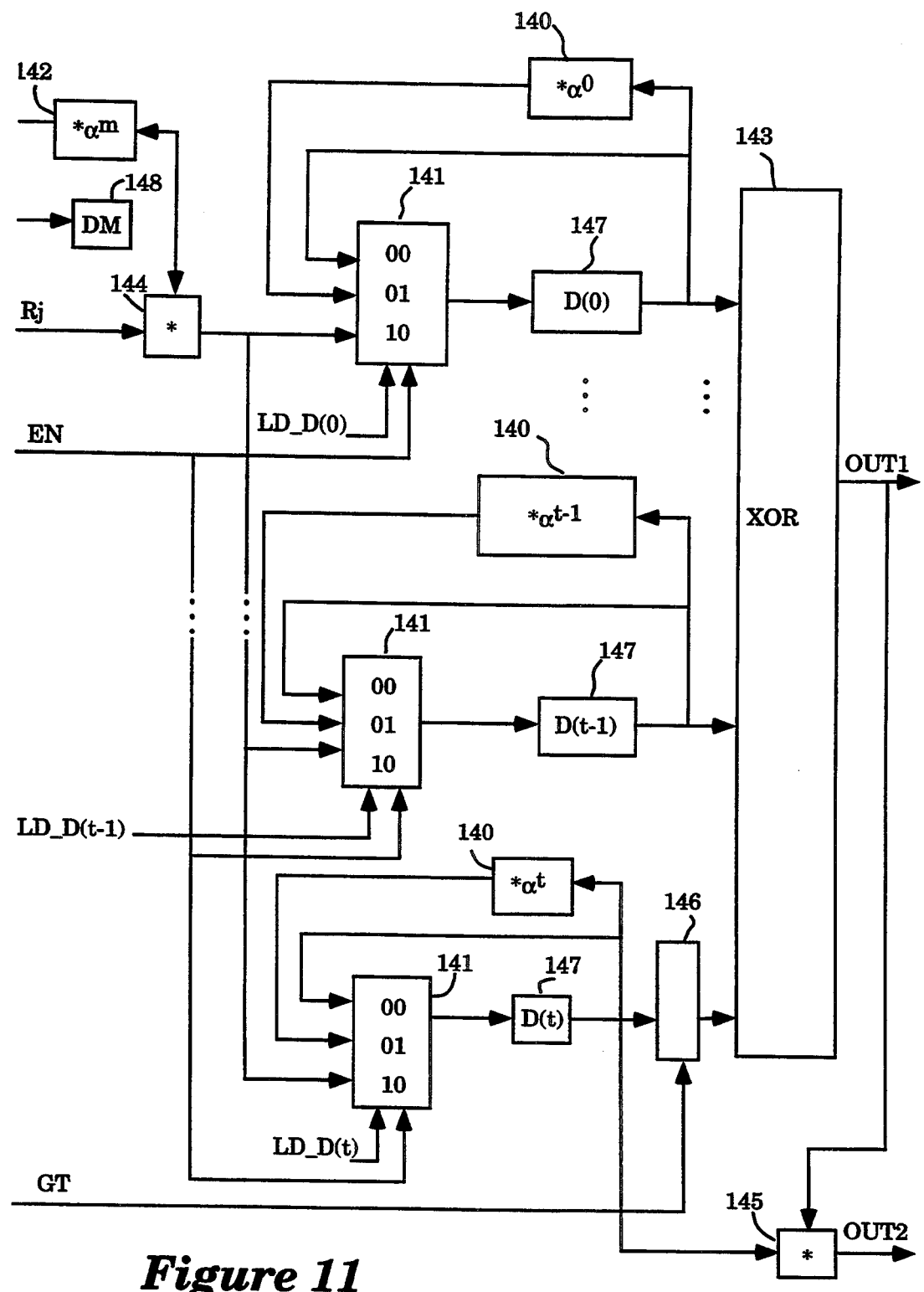
FIG. 11 is a logic diagram of circuit which can be shared for two-step syndrome computation and for finding the roots of the error locator polynomial.

The circuit of FIG. 11 can be shared for computing frequency-domain syndromes according to equation (9) and for finding the roots of the error locator polynomial $\sigma(x)$ according to equation (12) for codes with odd d. FIG. 11 comprises t+1 registers denoted D(0) through D(t); t+1 constant finite-field multipliers 140 implementing multiplication by $\alpha^j$ for j from 0 to t, t+1 three-input multiplexers 141; a symbol-wide gating circuit 146; register DM; a constant finite-field multiplier 142 implementing multiplication by $\alpha^m$; a (t+1)-input EXCLUSIVE-OR circuit 143; and two variable finite-field multipliers 144 and 145. Multipliers 144 and 145 may best be implemented as one multiplier with appropriate multiplexing of inputs and output. All registers, multipliers, multiplexers and data paths are symbol wide. FIG. 11 implements a reduction in circuitry which is possible when d is odd; when d is even the circuit of FIG. 9, modified for even d as described above, is used.

The computation of frequency-domain syndromes with the circuit of FIG. 11 is performed in a fashion similar to that used for the circuit of FIG. 9. Control signal GT is deasserted so that the output of gating circuit 146 is zero.

The search for the roots of $\sigma(x)$ using the circuit of FIG. 11 is accomplished by first loading coefficients $\sigma_j$ into the e+1 registers D(e−j) for j from 0 to e and loading zero into registers the t−e registers D(j) for j from e+1 to t. Control signal GT is asserted so that the input of gating circuit 146 is passed to its output. The following process is repeated n times for i from 0 to n−1: if OUT1 is zero, a root has been found and the error location is i; to search for another root, store the outputs of multipliers * $\alpha^j$ 140 in respective registers D(j) for j from 0 to t.

Multiplying equation (12) by $\alpha^{i\cdot t}$ and transforming j, we obtain $$\alpha^{i\cdot t} * \sigma(x)\bigg|_{\alpha^i} = \sum_{j=t}^{t+e} \sigma_{j-t} * \alpha^{j\cdot i} = 0. \qquad (13)$$

The circuit of FIG. 12 can be shared for computing syndromes according to equation (10) and for finding the roots of the error locator polynomial $\sigma(x)$ according to equation (13). FIG. 12 comprises t+1 registers 157 denoted D (t) through D(2·t); t+1 constant finite-field multipliers 150 implementing multiplication by $\alpha^j$ for j from t to 2·t; register 158 denoted DT; a constant finite-field multiplier 156 implementing multiplication by $\alpha^{-t}$; t+1 three-input multiplexers 151; register 159 denoted DM; a constant finite-field multiplier 152 implementing multiplication by $\alpha^m$, a (t+1)-input EXCLUSIVE-OR circuit 153; and two variable finite-field multipliers 154 and 155. Multipliers 154 and 155 may best be implemented as one multiplier with appropriate multiplexing of inputs and output. All registers, multipliers, multiplexers and data paths are symbol wide.

The computation of frequency-domain syndromes with the circuit of FIG. 12 is performed in a fashion similar to that used for the circuit of FIG. 10.

The search for the roots of $\sigma(x)$ using the circuit of FIG. 12 is accomplished by first loading the coefficients $\sigma_{j-t}$ into the e+1 registers D(e−(j−t)) for j from t to t+e and loading zero into the t−e registers D(j) for j from t+e+1 to 2·t. The following process is repeated n times for i from 0 to n−1: if OUT1 is zero, a root has been found and the error location is i; to search for another root, store the outputs of multipliers * $\alpha^j$ 150 in respective registers D(j) for j from t to 2·t.

Figure 16:
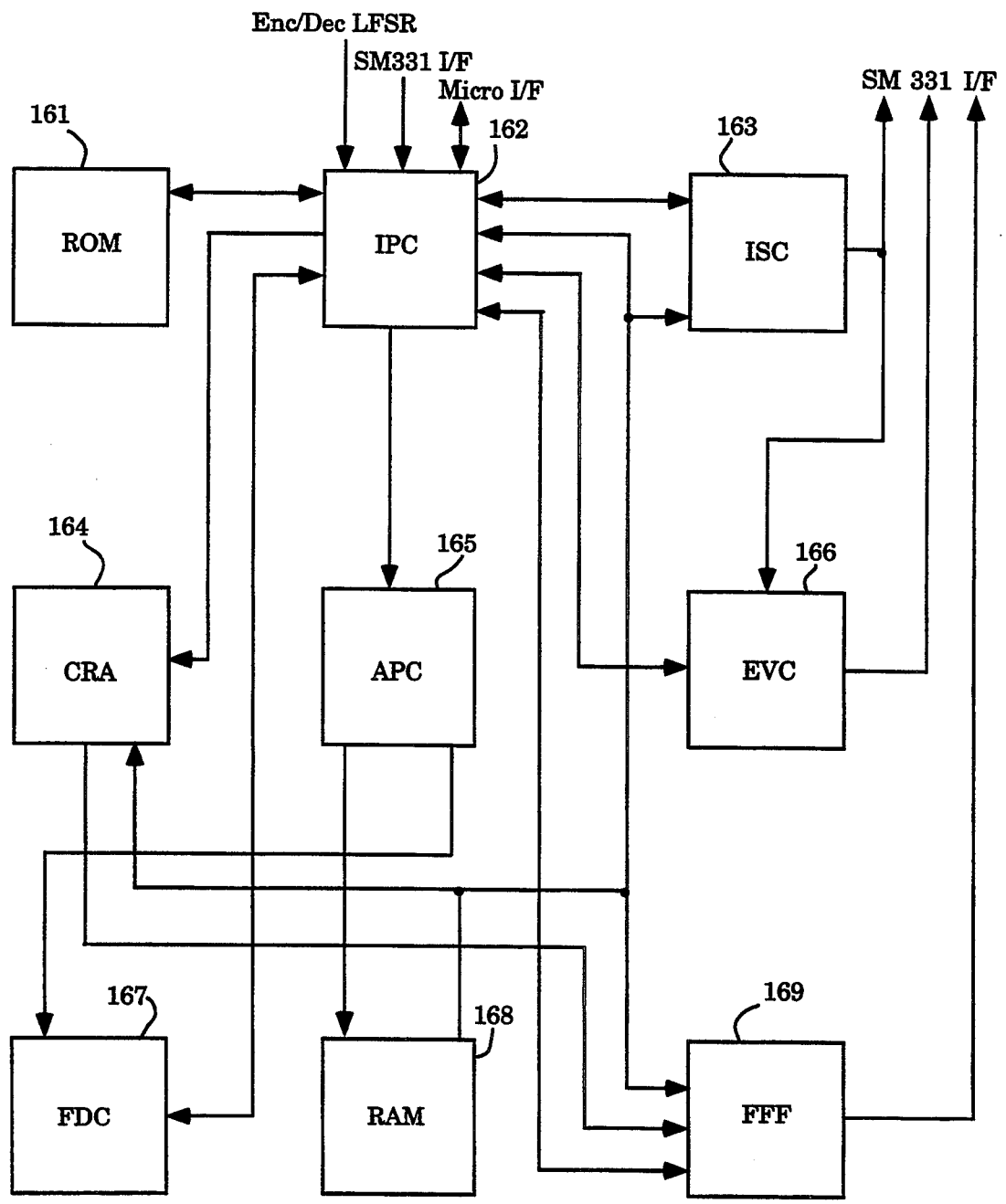
FIG. 16 is block diagram of the error identification circuit of the present invention showing its major functional blocks.
Figure 20:
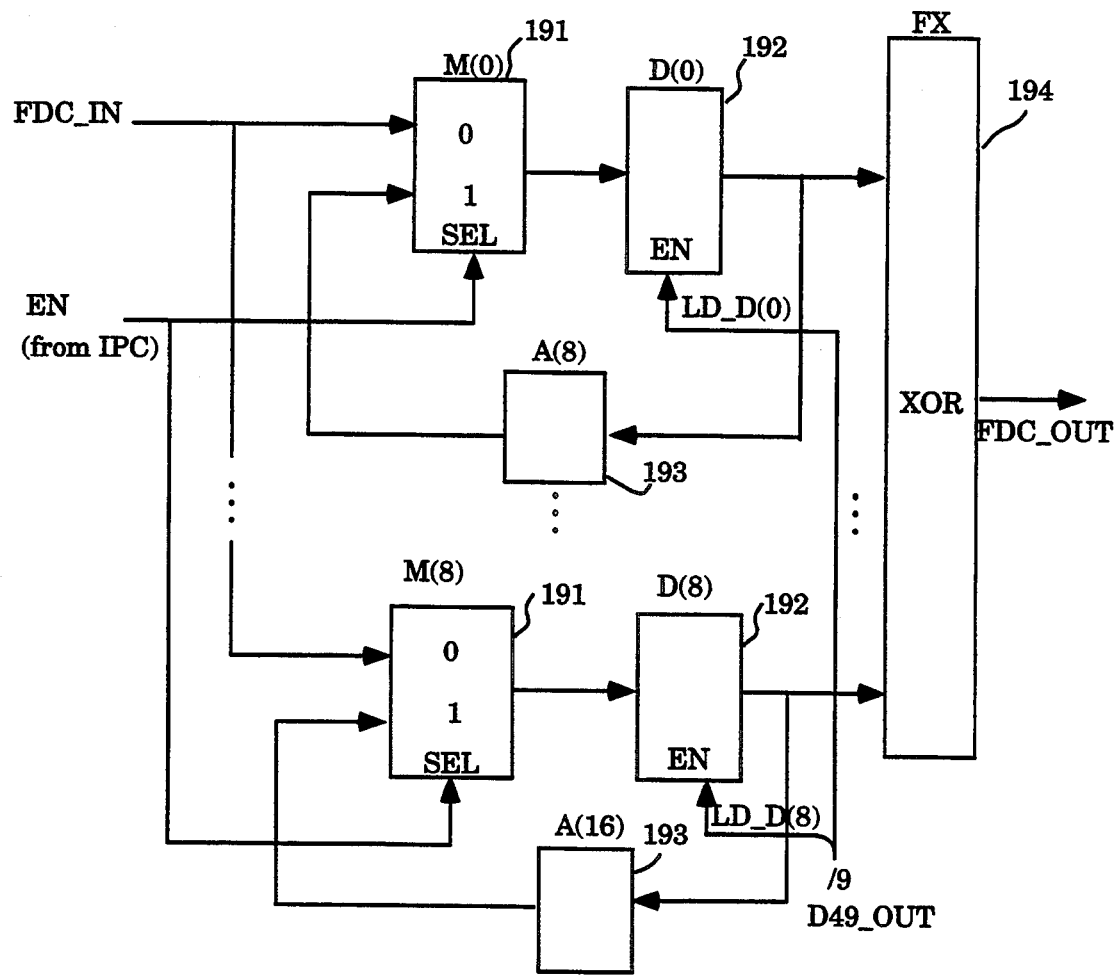
FIG. 20 is a block diagram of the Frequency Domain Circuit (FDC) block of the present invention.
Figure 21:
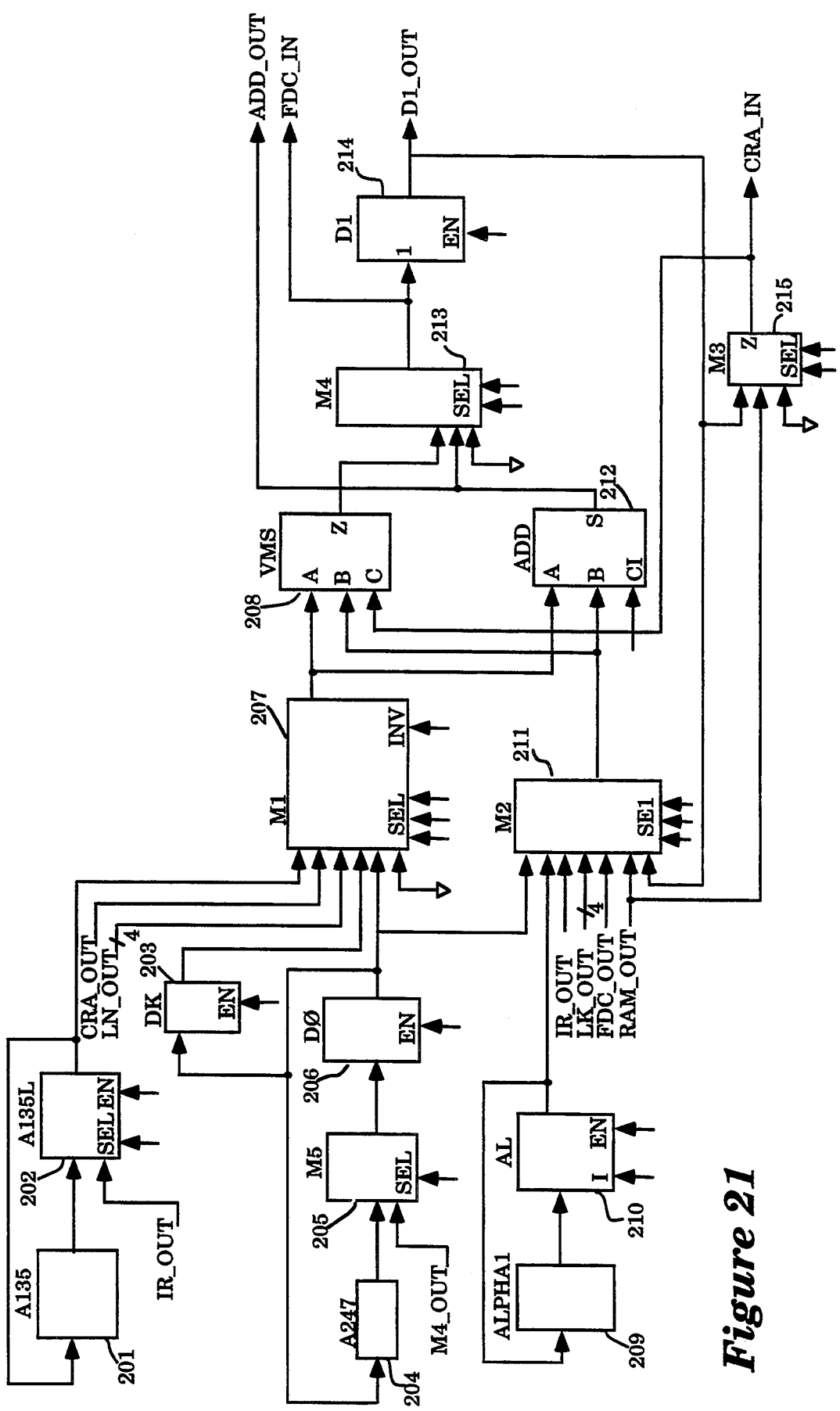
FIG. 21 is a block diagram of the Finite Field Processor (FFP) block of the present invention.

Circuitry for computing syndromes in two steps and performing the Chien search is implemented in the preferred embodiment as shown in FIG. 16, FIG. 20, and FIG. 21. The IDC block fetches instructions from the ROM and decodes them to generate control signals for the RAM and the other blocks. Remainder coefficients $R_j$, values $B_{m+i}$ and syndromes $S_{m+i}$, and error locator polynomial coefficients $o_j$ are stored in the RAM, with values $B_{m+i}$ and syndromes $S_{m+i}$ sharing the same storage elements. Registers 192 denoted D(0) through D(8); multiplexers 191 denoted M(0) through M(8); multipliers 193 denoted A(8) through A(16); and EXCLUSIVE-OR circuit 194 denoted FX of FIG. 20 correspond to registers D(t) through D(2·t); multiplexers 151; multipliers * $\alpha^j$ 150 for j from t to 2·t; and EXCLUSIVE-OR circuit 153 of FIG. 12. Registers 202 denoted A135L, multiplier 201 denoted A135, register 206 denoted D0, and multiplier 204 denoted A247 of FIG. 21 correspond to register DM, multiplier * $\alpha^m$ 152; register DT, and multiplier * $\alpha^{-t}$ 156 of FIG. 12. Finite-field variable multiply-and-sum circuit 208 denoted VMS of FIG. 21 corresponds to finite-field variable multipliers 154 and 155 of FIG. 12 implemented as a single multiplier with multiplexed inputs and outputs and the circuit which produces the syndromes $S_{m+i}$ as the EXCLUSIVE-OR sums of corresponding values $A_{m+i}$ and $B_{m+i}$.

IMPROVED ITERATIVE ALGORITHM

Figure 13:
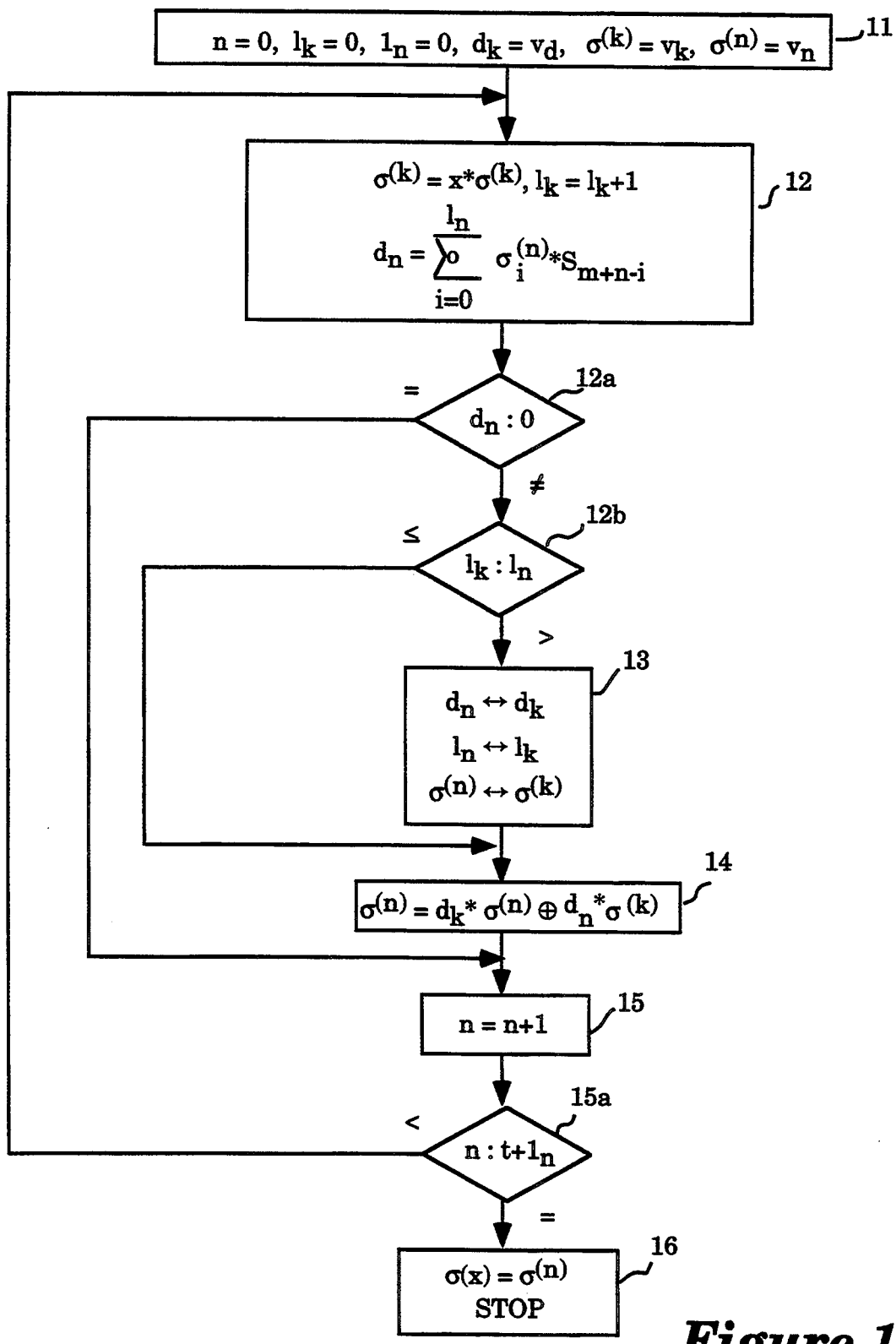
FIG. 13 is a flow chart of a new iterative algorithm for computing the coefficients of the error locator polynomial.

FIG. 13 is a flow chart of the improved iterative algorithm of the present invention. In FIG. 13, the "++" operator exchanges the values of two variables and $v_d$, $v_n$ and $v_k$ are arbitrary non-zero constants. In step 11, counters n, $l_k$ and $l_n$; parameter $d_k$; and polynomials $\sigma^{(k)}$ and $\sigma^{(n)}$ are initialized. In step 12, $\sigma^{(k)}$ is multiplied by x and the nth discrepancy $d_n$ is calculated. If $d_n$ is zero, control passes to step 15. Otherwise, if counter $l_k$ is less than or equal to the counter $l_n$, control is passed to step 14. Otherwise step 13 exchanges the values of counters $l_k$ and $l_n$; exchanges the values of parameters $d_k$ and $d_n$; and exchanges the values of $\sigma^{(k)}$ and $\sigma^{(n)}$ by exchanging the addresses of $\sigma^{(k)}$ and $\sigma^{(n)}$. Step 14 updates error locator polynomial $\sigma^{(n)}$. Step 15 increments counter n. Then if counter n is less than $t+l_n$, control is passed to step 12. Otherwise, the iterative algorithm has been completed and $\sigma^{(n)}$ is the desired error locator polynomial.

The improved iterative algorithm reduces implementation complexity and cost by requiring only two polynomial coefficient storage areas, instead of three, and decreases the time needed to compute the error locator polynomial by eliminating the need to copy polynomial coefficients from one storage element to another. The improved iterative algorithm is particularly suited for implementation in hardware, where exchanging the values of two variables is simply accomplished by cross-connecting the outputs and inputs of two registers which contain the values, or, as in the case of variables stored in a random-access memory, of two registers which contain the addresses of the memory elements which contain the values.

In the preferred embodiment of the invention, implementation complexity is reduced and speed of operation is increased by storing the coefficients of each polynomial $\sigma^{(n)}$ and $\sigma^{(k)}$ in a number of memory elements equal to 2·t+1 wherein the first t and last t elements are initially cleared to zero and the middle element is initialized to an arbitrary non-zero constant. The coefficients of polynomials $\sigma^{(n)}$ and $\sigma^{(k)}$ are stored in order of increasing degree of x. The operation of multiplying $\sigma^{(k)}$ by x is implemented by decrementing a register containing the address of the low-order coefficient of $\sigma^{(k)}$. The operation of exchanging the coefficients of $\sigma^{(n)}$ and $\sigma^{(k)}$ is implemented by exchanging the contents of two registers containing the addresses of the low-order coefficients of $\sigma^{(n)}$ and $\sigma^{(k)}$. The operation of computing $\sigma^{(n)} = d_k * \sigma^{(n)} \oplus d_n * \sigma^{(k)}$ where $l_k < l_n$ is performed in a loop repeated $l_n$ times for i from 0 to $l_n-1$. This operation does not require any special treatment for those coefficients of $\sigma^{(k)}$ where $i > l_k$.

Circuitry for performing the new iterative algorithm of the present invention as implemented in the preferred embodiment is shown in FIG. 16, FIG. 17, FIG. 21 and FIG. 23. Referring to FIG. 16, the IPC (Instruction Processing Circuit) block FIG. 23 fetches instructions from the ROM and controls the circuitry of the RAM, the APC (Address Pointer Circuit) block FIG. 17 and the FFP (Finite Field Processor) block FIG. 21. The RAM holds the value of counter n at location N; the syndromes, beginning at location S; and the coefficients of polynomials $\sigma^{(k)}$ and $\sigma^{(n)}$, low-order first beginning at the locations contained in registers 175 denoted SK and 171 denoted SN of FIG. 17, respectively. Registers 277 denoted LK and 278 denoted LN of FIG. 23 contain the values of counters $l_k$ and $l_n$, respectively. Registers 203 denoted DK and 206 denoted D0 of FIG. 21 hold the values of parameters $d_k$ and $d_n$, respectively.

Figure 23:
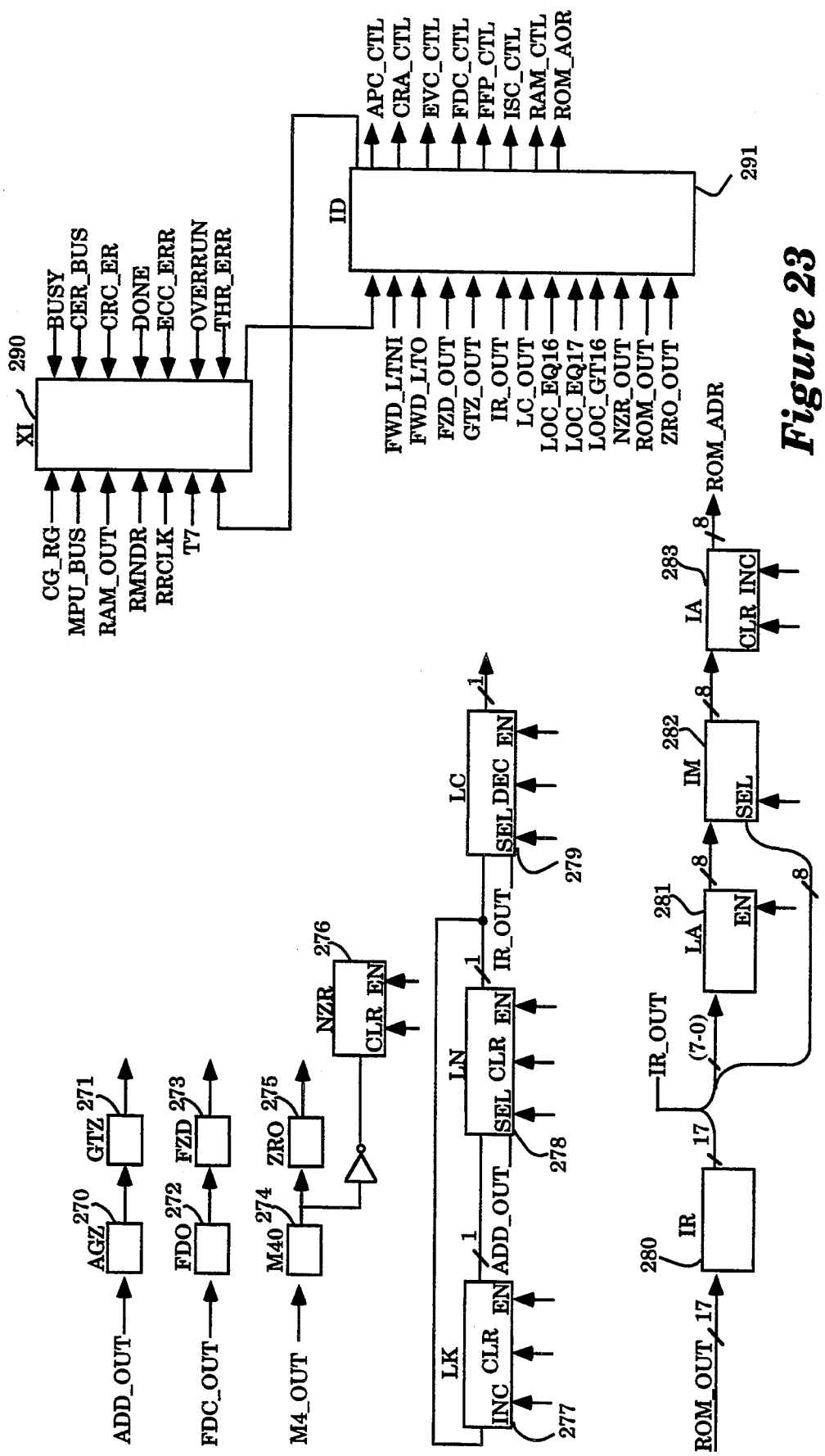
FIG. 23 is a block diagram of the Instruction Processing Circuit (IPC) block of the present invention.

For step 1, LK and LN are cleared to zero, SK and SN are initialized, the locations in the RAM used for the coefficients of polynomials $\sigma^{(k)}$ and $\sigma^{(n)}$ are initialized, DK is initialized to a non-zero value, and D1 is initialized to −(t−2). For step 2, location N in the RAM is written from D1, LK is incremented, $\sigma^{(k)}$ is multiplied by x by decrementing SK, D0 is cleared, and the nth discrepancy $d_n$ is calculated by using the VMS Variable Multiply-and-Sum block of FIG. 21 to sum into D0 the products of the contents of the RAM elements pointed to by SN and the syndromes in the area in the RAM beginning at location S. The block 274 denoted M40 of FIG. 23 is used to determine if parameter $d_n$ is zero; if so, control passes to step 5. Otherwise, block 212 denoted ADD (Integer Addition Circuit) (FIG. 21) and block 270 denoted AGZ (Greater-than-Zero) Detection Circuit) (FIG. 23) are used to determine if the contents of LK are less than or equal to the contents of LN; if so, control is passed to step 14. Otherwise for step 13, the contents of LK and LN are exchanged; the contents of DK and D0 are exchanged; and the contents of SK and SN exchanged. For step 14, the coefficients of polynomial $\sigma^{(n)}$ are updated by using the VMS block of FIG. 21 to sum the products of the contents of DK and the contents of the RAM elements pointed to by SK with the products of the contents of D0 and the contents of the RAM elements pointed to by SK using the VMS block of FIG. 21 and then storing the results into the RAM elements pointed to by SN. For step 15, the ADD block of FIG. 21 and the AGZ block of FIG. 23 are used to determine if the sum of the contents of D1 and the contents of LN is less than or equal to zero; if so, the ADD block of FIG. 21 is used to form in D1 the sum of one and the contents of the RAM at location N, and control is passed to step 2. Otherwise, the iterative algorithm has been completed; LN holds the degree and SN holds the address in the RAM of the coefficients of the error locator polynomial $\sigma^{(x)}$.

CONCURRENT CRC RESIDUE ADJUSTMENT

Figure 18:
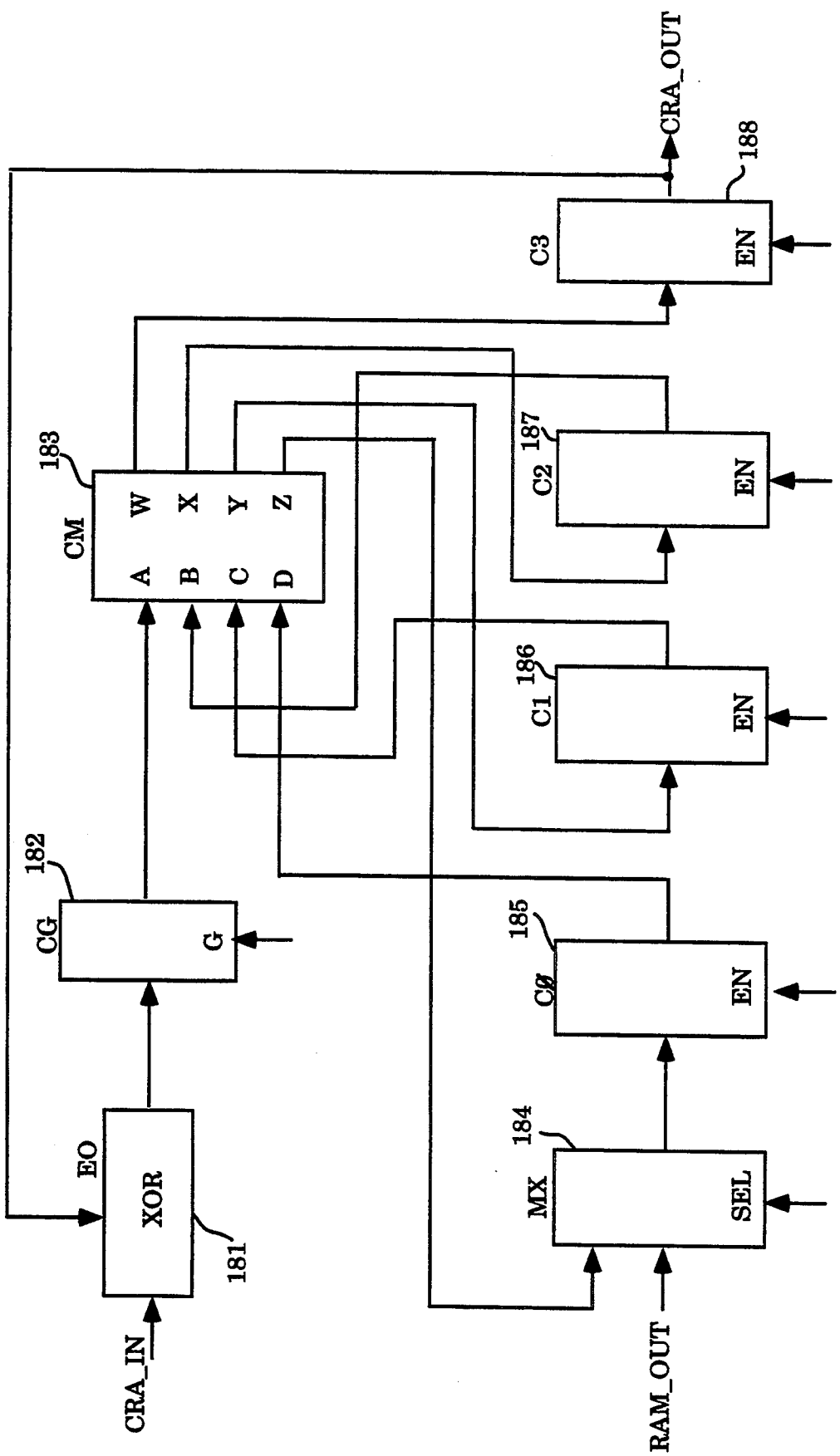
FIG. 18 is a block diagram of the CRC Residue Adjuster (CRA) block of the present invention.

In the preferred embodiment of the invention, the adjustment of the CRC information required whenever an error is identified is performed during the Chien search. Circuitry for performing the CRC residue adjustment as implemented in the preferred embodiment is shown in FIG. 18, FIG. 21, and FIG. 23.

The CRC residue is adjusted in a dedicated CRC Residue Adjuster (CRA) comprising a Linear Feedback Shift Register (LFSR) implementing the reciprocal of the CRC code generator polynomial. The registers in the CRA are initially loaded with the CRC residue symbols. Referring to FIG. 18, loading the CRA registers is performed by asserting control signal EN and deasserting control signals SH and FB while presenting the CRC residue symbols on RAM_OUT, most-significant symbol first.

The search for roots $\alpha^i$ of the error locator polynomial is performed sequentially for all i from 0 to n. For each interleave in error, before the search for roots reaches i equal to d−1, zero is clocked into the CRA x times, where x is the non-inclusive number of CRC redundancy symbols between the last non-ECC-redundancy symbol of the interleave in error and the first ECC redundancy symbol of the first interleave. For example, referring to FIG. 2, x is equal to 4, 3, 2, 1 and 0 for the interleaved codewords containing the symbols labeled "VU4" "CRC1" "CRC2" "CRC3" and "CRC4" respectively. Referring to FIG. 18, clocking a value into the CRA is performed by asserting control signals EN, SH and FB and presenting the value on CRA_IN.

If a root is found for i equal to d−1, the error value is clocked into the CRA; otherwise zero is clocked into the CRA. Then if the symbol corresponding to i equal to d−1 is a CRC redundancy symbol, zero is clocked into the CRA y times where y is the non-inclusive number of CRC redundancy symbols between the symbol corresponding to i equal to d−1 and the last non-CRC-redundancy symbol of the sector. For example, referring to FIG. 2, y is equal to 0, 0, 1, 2 and 3 for the interleaved codewords containing the symbols labeled "VU4" "CRC1" "CRC2" "CRC3" and "CRC4" respectively. For all i greater than d−1, either zero or the value of the error in the symbol corresponding to i is clocked into the CRA.

After all n locations of an interleave in error have been processed, the contents of the dc−1 CRA registers are shifted out of the CRA and EXCLUSIVE-OR-ed into dc−1 storage elements elsewhere, and the dc-1 CRA registers are cleared to zero. Referring to FIG. 18, the contents of the CRA are shifted out and the CRA registers are cleared to zero by asserting control signals EN and SH and deasserting control signal FB. In the preferred embodiment, referring to FIG. 21, the contents of each CRA register are presented in turn on CRA_OUT and, using the VMS block, multiplied by AL_OUT and EXCLUSIVE-OR-ed with the contents of the corresponding RAM storage element presented on RAM_OUT, the result being stored in D1 and then D1_OUT being back into the RAM storage element. This procedure works because AL_OUT is always the same, $a_{n-1}$, after each interleave has been processed, and the fact that the adjusted CRC residue bytes for each interleave have all been multiplied by a common non-zero factor is immaterial if the sum of all the adjusted CRC residue bytes is zero. Implementation complexity is reduced because no unique instruction or instruction exception condition need be implemented.

After all interleaved codewords have been processed, the dc−1 storage elements are checked for zero. This is performed adding zero to each accumulated adjusted CRC residue byte using the ADD circuit of the FFP FIG. 21 and using the M40 OR circuit in the IPC FIG. 23 to detect any non-zero value.

ERROR IDENTIFIER ARCHITECTURE

Figure 14:
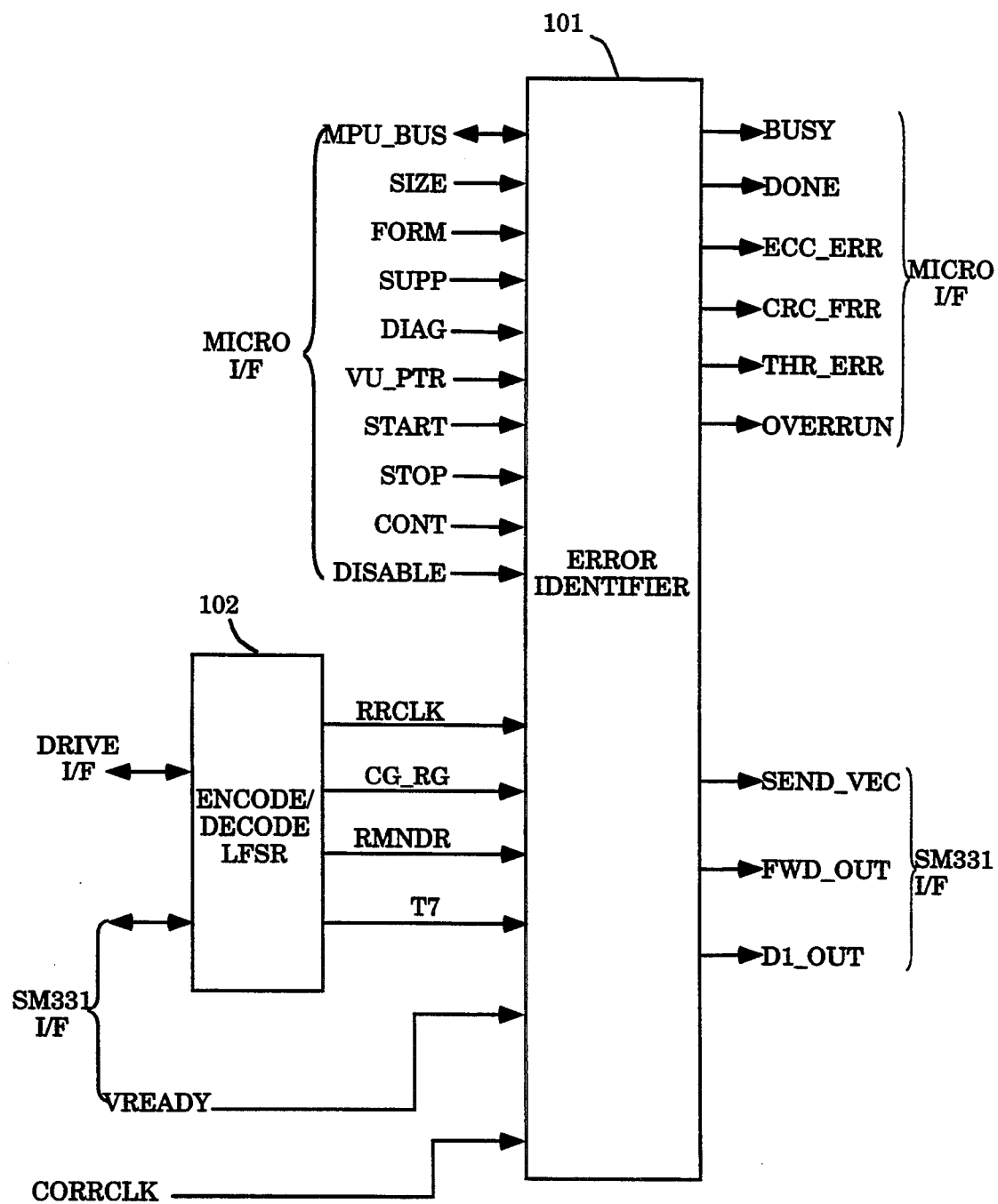
FIG. 14 is a high-level block diagram of the CL-SM330's ECC/CRC block containing the error identification circuit of the present invention and showing its interfaces with the other blocks of the CL-SM330.

FIG. 14 shows the CL-SM330's ECC/CRC block, including the interfaces between the error identifier, the Encode/Decode LFSR block, and the other blocks of the CL-SM330. The CORRCLK (Correction Clock) signal clocks the synchronous logic of the error identifier. The five configuration signals SIZE, FORM, SUPP, DIAG and VU_PTR and the START, STOP, CONT and DISABLE signals are the outputs of registers in the CL-SM330's Microcontroller Interface block which are programmed by the external microcontroller. The BUSY, DONE, ECC_ERR, CRC_ERR, THR_ERR and OVERRUN signals are applied to the CL-SM330's Microcontroller Interface block. MPU_BUS provides an address bus, a data bus, and read/write control signals for external microcontroller access to the error identifier RAM and register AO. The RRCLK, CG_RG, RMNDR and T7 signals are provided to the error identifier from the Encode/Decode LFSR block. The VREADY signal is fed from the CL-SM331 Buffer Manager through the CL-SM330's SM331 Interface block to the error identifier. The SEND_VEC signal and the FWD_OUT and D1_OUT buses are applied to the CL-SM330's SM331 Interface block.

SIZE and FORM determine the number of interleaves (hereafter abbreviated as NUM_ILVS) and the total number of bytes in the sector (hereafter abbreviated as NUM_BYTS):

| SIZE | FORM | NUM_ILVS | NUM_BYTS |
|---|---|---|---|
| 0 | 0 | 5 | 600 |
| 0 | 1 | 5 | 610 |

-continued

| SIZE | FORM | NUM_ILVS | NUM_BYTS |
|------|------|----------|----------|
| 1 | x | 10 | 1200 |

SIZE, FORM, SUPP, DIAG and VU_PTR control assertion of SEND_VEC as described below. Assertion of START forces the error identifier to begin identifying errors using the current contents of RAM. If the error identifier is identifying errors, assertion of STOP forces the error identifier to cease identifying errors and to assert DONE. Assertion of DISABLE prevents the error identifier from beginning to identify errors at the trailing edge of CG_RG as described below.

FIG. 15 shows the register address and bit assignments for the signals accessible to the external microcontroller through the CL-SM330's Microcontroller Interface block. A number in hexadecimal notation is denoted by appending h to it. Because the overall CL-SM330 busy status is read from bit 6 at register 10$h$, BUSY is advantageously implemented to be read from bit 4 at address 10$h$. Because START is best implemented as an edge-triggered control signal and the "write" function of bit 4 of register 10$h$ would otherwise be wasted, START is advantageously implemented to be asserted by writing one to bit 4 at address 10$h$. Because the CL-SM330 is configured for Read Sector operations by writing bits 3-0 of register 10$h$, SUPP is advantageously implemented to be simultaneously (de)asserted by writing (zero)one to bit 3 at address 10$h$. Placing the form factor, sector size and vendor-unique/pointer control signals in the same register allows all three to be controlled with one microcontroller access; therefore VU_PTR is (de)asserted by writing (zero)one to bit 5 at address 11$h$, FORM is (de)asserted by writing (zero) one to bit 1 at address 11$h$, and SIZE is (de)asserted by writing (zero)one to bit 0 at address 11$h$. Disabling the error identifier and enabling continuous sector read operation are seldom-used functions, so it is preferred that they be placed in register 12$h$ along with other relatively static CL-SM330 configuration signals; DISABLE is (de)asserted by writing (zero)one to bit 3 at address 12$h$ and CONT is (de)asserted by writing (zero)one to bit 0 at address 12$h$. Because it is desirable to control related functions by accessing a single address and other medium-related CL-SM330 microcontroller interrupts are enabled and disabled through register 21$h$, it is implemented so that when one is written to bit 0 at address 21$h$, the CL-SM330's Microcontroller Interface block will assert an interrupt signal to the external microcontroller when the error identifier asserts DONE. For ease of microcontroller firmware implementation it is advantageous that interrupt status signals be read from the corresponding bits at another address, so DONE is read from bit 0 at address 23$h$. Placing the error signals for the error identifier in the same register with other CL-SM330 error signals allows all to be read with one microcontroller access; therefore ECC_ERR, CRC_ERR, THR_ERR and OVERRUN are read from bits 7, 6, 5 and 4, respectively, at address 30$h$. Grouping the error identifier RAM address and data access address with the error identifier error access register yields a more logical organization of the CL-SM330 microcontroller address space, so A0 is written at address 31$h$ and the RAM element at the address in A0 is read or written by reading or writing address 32$h$. Because A0 is incremented each time the microcontroller accesses the error identifier RAM, the microcontroller firmware is always certain of the value of A0, implementation cost is reduced by providing no path for the microcontroller to read the contents of A0. There is normally no need to transfer error correction vectors for errors in the ECC redundancy bytes, so DIAG is advantageously implemented to be (de)asserted by writing (zero)one to bit 4 at address 3F$h$, wherein other bits control other test modes of the CL-SM330.

FIG. 16 is a block diagram of the error identifier. The major blocks comprising the error identifier are the Address Pointer Circuit 165 (APC), CRC Residue Adjuster 164 (CRA), Error Vector Control 166 (EVC), Frequency Domain Circuit 167 (FDC), Finite Field Processor 169, (FFP), Instruction Processing Circuit 162 (IPC), Interleave & Sector Counters 163 (ISC), Random Access Memory 168 (RAM) and Read-Only Memory 161 (ROM).

The output of a register or circuit is denoted by appending "_OUT" to its name. The input to a register or circuit is denoted by appending "_IN" to its name. A number in hexadecimal notation is denoted by appending 'h' to it. Where not otherwise indicated, control signal inputs to registers, multiplexers, etc. are driven from the appropriate "xxx_CTU" bus from the IPC block 162, FIG. 23.

In the preferred embodiment of the invention, each instruction is fetched from the ROM and stored in the seventeen-bit instruction register (IR), then decoded from IR_OUT and executed during the next clock cycle. By pipelining the instruction in this manner, it is immediately available at the beginning of each cycle with no ROM-access delay. Also, the decoding of instruction bits required to select the proper address to be applied to the RAM address bus is performed using ROM_OUT rather than IR_OUT, and the selected address is stored in the eight-bit RAM address register (RA) and applied during the next cycle. By pipelining the RAM address in this manner, it is immediately available at the beginning of each cycle with no instruction-decoding delay.

Figure 17:
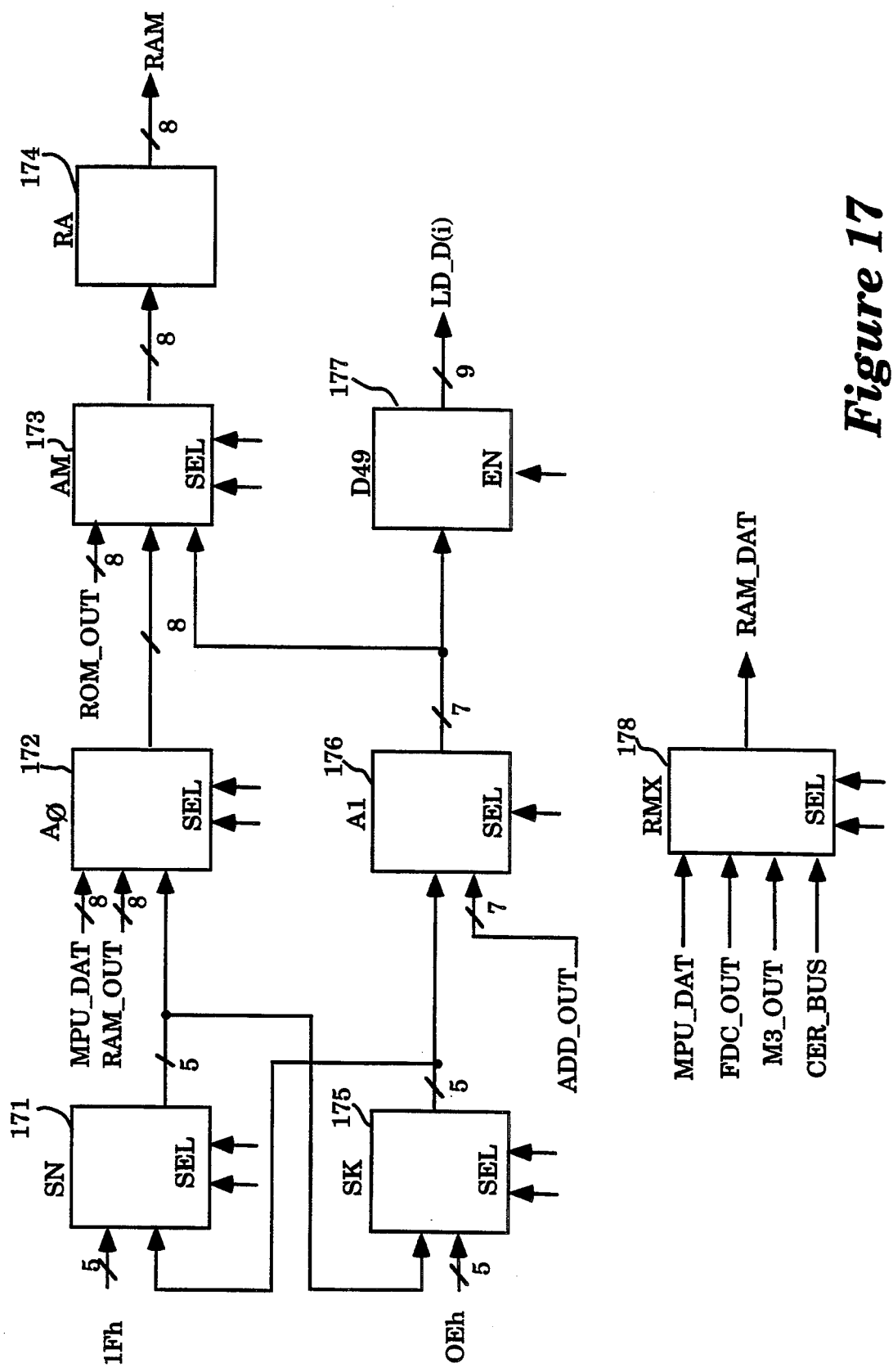
FIG. 17 is a block diagram of the Address Pointer Circuit (APC) block of the present invention.

FIG. 17 is a block diagram of the Address Pointer Circuit (APC), which controls the address and data input buses of the RAM and the loading of FDC registers D(i). APC includes A0, A1, AM, D49, RA, RMX, SK and SN.

A0 is an eight-bit register 172 which can supply an address for indirect access to the RAM. A0 can be loaded from SN_OUT, from RAM_OUT, or from the external microcontroller data bus. Bits 7-5 of A0_IN are forced to zero when SN is the source. A0 can be incremented. NUM_ILVS can be added to A0.

A1 is a seven-bit register 176 which can supply an address for indirect access to the RAM or to the FDC registers D(i). A1 can be loaded from SK_OUT or from ADD_OUT. Bits 7-5 of A1_IN are forced to zero when SK_OUT is the source. A1 can be incremented or decremented.

AM is a three-input, eight-bit-wide multiplexer 173 which supplies input to RA. Its inputs are A0_OUT, A1_OUT and bits 6-0 of ROM_OUT. Bit 7 of AM_OUT is forced to zero when A1_OUT or ROM_OUT is the selected source.

D49 is a four-to-nine decoder 177 with enable. A1_OUT is applied to D49_IN. D49_OUT is applied to the LD_D(i) inputs of FDC multiplexers M(i).

RA is an eight-bit register 174 which holds the address applied to the RAM address bus during the execution of an instruction. RA is loaded from AM_OUT.

RMX is a four-input, eight-bit wide multiplexer 178 which supplies input to the RAM data bus. Its inputs are FDC_OUT, M3_OUT, CER_BUS and the external microcontroller data bus.

SK is a five-bit register 175 which holds the address of the low-order coefficient of the $\sigma^{(k)}$ polynomial in the RAM. SK can be preset to 0Eh or loaded from SN_OUT. SK can be decremented.

SN is a five-bit register 171 which holds the address of the low-order coefficient of the $\sigma^{(n)}$ polynomial in the RAM. SN can be preset to 1Fh or loaded from SK_OUT.

FIG. 18 is a block diagram of the CRC Residue Adjuster (CRA), which is a LFSR implementing H(x), the reciprocal of the Reed-Solomon generator polynomial GC(x) for the ANSI/ISO standard CRC code. CRA comprises four eight-bit registers (185–188) denoted C0, C1, C2 and C3; the CM computation circuit 183, described below; a two input, eight-bit-wide multiplexer 184 deonted MX; a two input, eight-bit-wide EXCLUSIVE-OR circuit 181 denoted EO; and an eight-bit gating circuit 182 denoted CG. The output of C3 is CRA_OUT. CRA_IN and CRA_OUT are applied to the inputs of EO. EO_OUT is applied to CG_IN. CG_OUT, C2_OUT, C1_OUT and C0_OUT are applied to inputs A, B, C and D of CM, respectively. Outputs W, X and Y of CM are applied to C3_IN, C2_IN and C1_IN, respectively. Output Z of CM and RAM_OUT are applied to the inputs of MX. MX_OUT is applied to C0_IN.

To "clock the CRA" means to perform the combination of actions specified by bits 4-1 of IR-OUT:

| 4321 | ACTION |
| --- | --- |
| xx0x | Disable loading of C0, C1, C2 and C3; i.e. force control signal EN to zero. |
| xx10 | If LOC_GT16 is one, enable loading of C0, C1, C2 and C3; i.e. force control signal EN to one if and only if LOCGT_16 is one. |
| xx11 | Enable loading of C0, C1, C2 and C3; i.e. force control signal EN to one. |
| x0xx | Force CG_out to zero; i.e. force control signal FB to zero. |
| x1xx | Pass CG_IN to CG_OUT; i.e. force control signal FB to one. |
| 0xxx | If enabled as specified above, load C3, C2 and C1 from outputs W, X and Y of CM, respectively, and load C0 from RAM_OUT; i.e. force control signal SH to zero. |
| 1xxx | If enabled as specified above, load C3, C2, C1 and C0 from outputs W, X, Y and Z of CM, respectively.; i.e. force control signal SH to one. |

CM is a four-input, four-output, eight-bit-wide constant finite-field computation circuit with inputs A, B, C and D, and outputs W, X, Y and Z, which implements:

$W = H_3 * A \oplus B$
$X = H_2 * A \oplus C$
$Y = H_1 * A \oplus D$
$Z = H_0 * A$ where $H_i$ are the coefficients of H(x).

Figure 19:
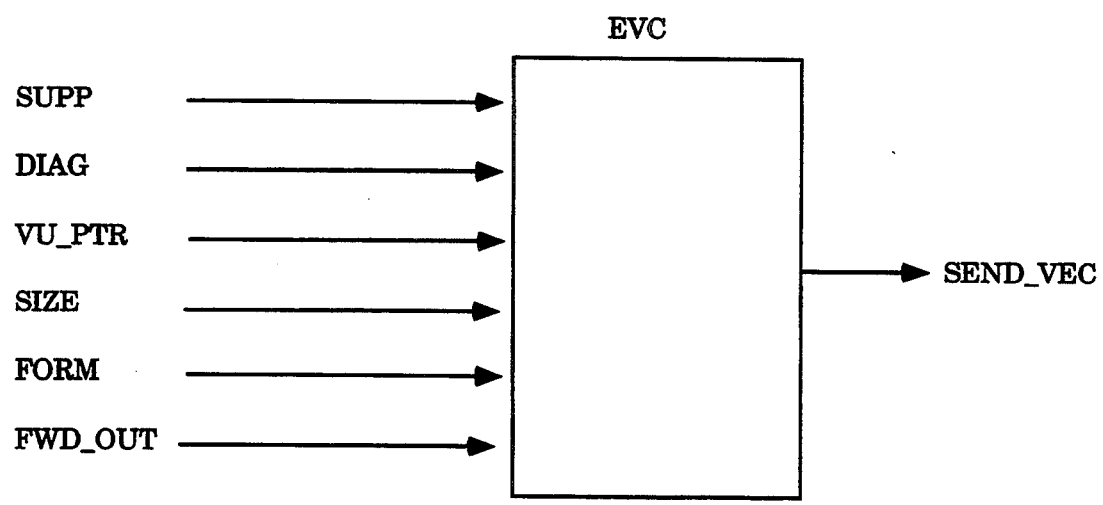
FIG. 19 is a block diagram of the Error Vector Control (EVC) block of the present invention.

FIG. 19 shows Error Vector Control (EVC), which controls the assertion of SEND_VEC, the signal which initiates transfer of an error correction vector to the CL-CSM331. Each time the error identifier has located and identified an introduced error, EVC examines the configuration signals and applies the selected condition to FWD_OUT. If FWD_OUT satisfies the condition, ECV asserts SEND_VEC, causing the CL-SM331 Interface block to execute an error correction vector transfer using the current values of FWD_OUT and D1_OUT.

| SUPP | DIAG | VU_PTR | SIZE | FORM | FWD_OUT CONDITION |
| --- | --- | --- | --- | --- | --- |
| 1 | x | x | x | x | NONE ALLOWED |
| 0 | 1 | x | x | x | ALL ALLOWED |
| 0 | 0 | 0 | 0 | x | <512 |
| 0 | 0 | 0 | 1 | x | <1024 |
| 0 | 0 | 1 | 0 | 0 | <520 |
| 0 | 0 | 1 | 0 | 1 | <530 |
| 0 | 0 | 1 | 1 | x | <1040 |

FIG. 20 is a block diagram of the Frequency Domain Circuit (FDC), which is used to compute syndromes from the time-domain remainders and to search for the roots of the error locator polynomial. The FDC in the preferred embodiment is a variation on the circuit shown in FIG. 12. The FDC comprises nine eight-bit registers 192 denoted D(i) for i from 0 to 8, each associated with a constant finite-field multiplier 193 denoted A(8+i) and a two-input, eight-bit-wide multiplexer 191 denoted M(i); plus a nine-input, eight-bit-wide EXCLUSIVE-OR circuit 194 denoted FX; and an eight-bit-input OR circuit FDO. The output of FX is FDC_OUT and is applied to FDO_IN. The output of each register D(i) is applied to the input of A(8+i) and to one of the inputs of FX. The output of each multiplier A(8+i) is applied to one of the inputs of M(i). FDC_IN is applied to the other input of each multiplexer M(i). The output of each multiplexer M(i) is applied to the input of respective register D(i). When FDC register D(i) is to be loaded from FDC_IN, signal LD_D(i) from D49_OUT is asserted. To "clock the FDC" means to record FDO_OUT in the FZD latch within the IAC; to load each register D(i) from the output of its associated finite-field multiplier A(i); to store ALPHA1_OUT in the AL register within the FFP; to store A135_OUT in the A135L register within the FFP; and to load the FWD register within the ISC from SUB_OUT within the ISC.

FIG. 21 is a block diagram of the Finite-Field Processor (FFP), which performs integer addition and variable finite-field multiply-and-sum operations. It includes A135, A135L, A247, ADD, AL, ALPHA1, D0, D1, DK, M1, M2, M3, M4, M5 and VMS. Except as noted, all data paths are 8-bits wide.

A135 is a constant finite-field multiplier 201 implementing multiplication by $\alpha^{135}$. A135L_OUT is applied to A135L.

A135L is an eight-bit multiplexed register 202 which holds $X * \alpha^{135 \cdot L}$, where L is the number of times A135L has been clocked since it was loaded with X from IR_OUT. The value loaded into A135L is multiplexed between A135_OUT and bits 7-0 of IR_OUT. A135L_OUT is applied to A135_IN and M1.

A247 is a constant finite-field multiplier 204 implementing multiplication by $\alpha^{247}$. D0_OUT is applied to A247_IN. A247_OUT is applied to M5.

ADD is a two-input, eight-bit-wide integer addition circuit 212 with a one-bit carry-in signal CI implementing $S = A + B + CI$. M1_OUT is applied to input A. M2_OUT is applied to input B. Bit C of IR_OUT is applied to input CI.

AL is an eight-bit register 210 which holds $\alpha^{L-1}$, where L is the number of times AL has been clocked since it was initialized to $\alpha^{-1}$ by assertion of control input I. AL_OUT is applied to ALPHA1_IN and M2. AL can be initialized to $\alpha^{-1}$ or loaded from AL-PHA1_OUT.

ALPHA1 is a constant finite-field multiplier 209 implementing multiplication by $\alpha^1$. ALPHA1_OUT is applied to AL_IN.

D0 is an eight-bit register 206 which is used for many purposes. D0 can be loaded from M5_OUT. D0_OUT is applied to M1, M2 and A247_IN.

D1 is an eight-bit register 214 which is used for many purposes. D1 can be loaded from M4_OUT. D1_OUT is applied to M2, M3 and the SM331 interface block.

DK is an eight-bit register 203 which is used to hold $d_k$ and for other purposes. DK can be loaded from D0 _OUT. DK _OUT is applied to M1.

M1 is a six-input, eight-bit-wide invertible multiplexer 207 which supplies input to VMS and ADD. Its inputs are D0_OUT, DK_OUT, LN_OUT, CRA_OUT, A135L_OUT and zero. Bits 7-4 of the LN_OUT input are forced to zero. If bits P and 7 of IR_OUT are set, each bit of M1_OUT is inverted.

M2 is a seven-input, eight-bit-wide multiplexer 211 which supplies input to VMS and ADD. Its inputs are D0_OUT, D1_OUT, LK_OUT, AL_OUT, RAM_OUT, FDC_OUT and bits 7-0 of IR_OUT. Bits 7-4 of the LK_OUT input are forced to zero. Bit 7 of the IR_OUT input is replaced with bit 6 of IR_OUT.

M3 is a three-input, eight-bit-wide multiplexer 215 which supplies input to VMS, CRA and RMX. Its inputs are D1_OUT, RAM_OUT and zero. M3_OUT is CRA_IN.

M4 is a three-input, eight-bit-wide multiplexer 213 which supplies input to M5, D1 and the nine FDC registers D(i). Its inputs are VMS_OUT, ADD_OUT and zero. M4_OUT is FDC_IN.

M5 is a two-input, eight-bit-wide multiplexer 205 which supplies input to D0. Its inputs are M4_OUT and A247_OUT.

Figure 22:
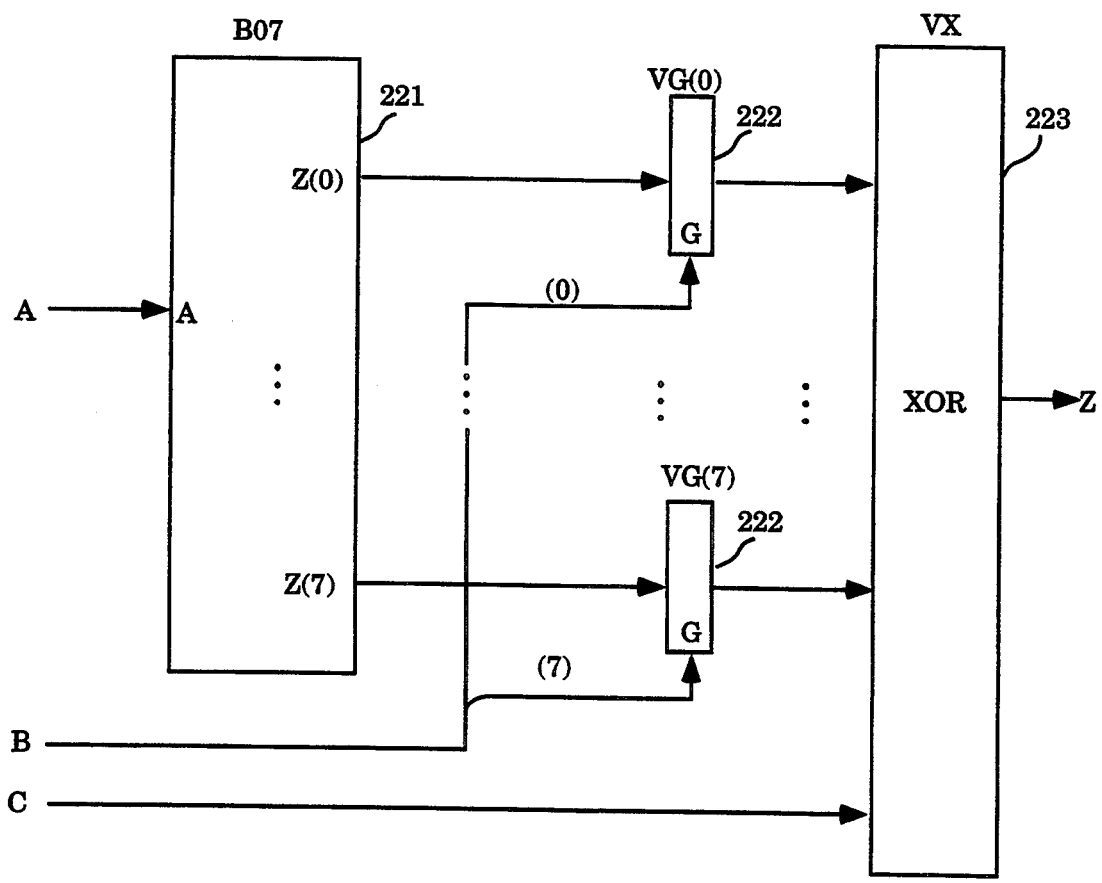
FIG. 22 is a logic diagram of the finite-field Variable Multiply-and-Sum (VMS) circuit of the present invention.

FIG. 22 is a block diagram of the finite-field Variable Multiply-and-Sum circuit (VMS), which implements $Z=(A*B)\oplus C$, which is computed according to:

$$Z = C \oplus \sum_{i=0}^{7} A*(B \text{ AND } 2^i).$$

VMS comprises a single-input, eight-output constant finite-field multiplier circuit 221 denoted B07; eight eight-bit-wide gating circuits 222 denoted VG(i); and a nine-input, eight-bit-wide EXCLUSIVE_OR circuit 223 denoted VX. B07 implements $$Z(i)=A*2^i$$

for i from 0 to 7. Mi_OUT is applied to input A of VMS, which is input A of B07. M2_OUT is applied to input B of VMS; each bit i of B is applied to the control input G of respective gating circuit VG(i). The eight outputs Z(i) of B07 are applied to the inputs of VG(i), whose outputs are applied to the first eight inputs of VX. M3_OUT is applied to input C of VMS, which is the remaining input of VX.

Note that propagation delay from input B of VMS to VMS_OUT is less than that from input A of VMS to VMS_OUT. RAM access time can be significantly longer than other circuit delays. In the preferred embodiment, the propagation delay from RAM_OUT to M2_OUT is minimized in preference to the propagation delays from the other inputs of M2 to M2_OUT, and M2_OUT is applied to input B of VMS rather than to input A of VMS. This minimizes the total propagation delay when a RAM element is applied to VMS and increases the maximum CORRCLK rate which may be applied to the error identifier.

FIG. 23 is a block diagram of the Instruction Processing Circuit (IPC), which controls the operation of other portions of the error identifier. IPC contains AGZ, FZD, GTZ, IA, ID, IM, IR, LA, LC, LK, LN, M40, NZR, XI and ZRO.

AGZ is an eight-bit greater-than-zero detection circuit block 270. Greater than zero means the most-significant bit is zero and at least one other bit is non-zero. ADD_OUT is applied to AGZ_IN.

FDO is an eight-bit-input circuit (block 272). FDC_OUT is applied to FD0_IN.

FZD is a one-bit register (block 273) which records FDO_OUT whenever the FDC is clocked.

GTZ is a one-bit register (block 271) which records AGZ_OUT when each instruction is executed.

IA is an eight-bit register (block 203), which holds the address applied to the ROM address bus. IA can be cleared to zero, incremented, and loaded from IM_OUT.

ID is the Instruction-bit Decoding network (block 291), which generates control signals for the error identifier hardware, including but not limited to multiplexer selection signals; register increment-enable, decrement-enable and write-enable signals; and RAM write-enable signals. ID decodes instruction bits from ROM_OUT and IR_OUT and control signals from the other blocks of IPC to produce control signals applied to the other blocks of the error identifier on the buses labeled APC_CTL, CRA_CTL, etc.

IM is a two-input, eight-bit-wide multiplexer (block 282) which supplies input to IA. Its inputs are LA_OUT and bits 7-0 of IR_OUT.

IR is a seventeen-bit register (block 280) which holds the instruction being executed. IR is loaded from ROM_OUT. Bits 16-13 of IR_IN can be forced to zero to prevent execution of the next instruction by transforming it into a NOP.

LA is an eight-bit register (block 281) which holds the address of the first instruction of a DO loop. LA can be loaded from bits 7-0 of IR_OUT.

LC is a four-bit register (block 279) which holds the loop count during execution of a DO loop. It can be loaded from LN_OUT or from bits 12-9 of IR_OUT.

LK is a four-bit register (block 277) which holds the degree of the $\sigma^{(k)}$ polynomial. LK can be incremented, cleared to zero, or loaded from LN_OUT.

LN is a four-bit register (block 288) which holds the degree of the $\sigma(n)$ polynomial. LN can be cleared to zero or loaded from LK_OUT or from bits 3-0 of ADD_OUT.

M40 is an eight-bit-input OR circuit (block 274). M4_OUT is applied to M40_IN.

NZR is a one-bit latch (block 276) which is set if M40_OUT is one when a Load_FDC_Rem instruction is executed. NZR can be cleared.

XI is the external interface module (block 290). XI controls APC when the external microcontroller is accessing RAM and when CRC residue/ECC remainder bits are being stored in RAM. The XI block of the IPC manages the interfaces to the external microcontroller and the rest of the CL-SM330.

The microcontroller can write register A0 and read or write RAM at the address contained in A0. Each time the microcontroller accesses RAM, XI increments A0.

If at the leading edge of CG_RG, either CONT is asserted or BUSY is not asserted, XI presets A0 to the value 3Eh and begins deserializing bits from RMNDR onto the eight-bit-wide CER_BUS. When T7 is asserted during the last bit of each byte, XI stores the deserialized byte on CER_BUS into RAM at the address contained in A0 and then increments A0. In addition, if at the leading edge of CG_RG both CONT and BUSY are asserted, then XI asserts OVERRUN, stops and does not complete the current error identification process.

If at the leading edge of CG_RG, CONT is not asserted and BUSY is asserted, then XI asserts OVERRUN, does not store the deserialized CRC residue or ECC remainder bits in RAM, and does not stop the current error identification process.

If at the trailing edge of CG_RG, no non-zero bit was detected on RMNDR while CG_RG was asserted and either CONT is asserted or OVERRUN is not asserted, then XI asserts DONE.

If at the trailing edge of CG_RG, any non-zero bit was detected on RMNDR while CG_RG was asserted and DISABLE is not asserted and either CONT is asserted or OVERRUN is not asserted, then XI asserts BUSY and the error identifier begins identifying introduced errors.

When a Stop instruction is executed, XI asserts DONE and stops the error identifier by deasserting BUSY, which forces IA to zero. If an uncorrectable ECC error, uncorrectable CRC error, or error exceeding threshold has been detected, a Stop instruction will be executed which causes XI to assert ECC_ERR, CRC_ERR, or THR_ERR, respectively.

ZRO is a one-bit register (block 275) which records NOT(M40_OUT) when each instruction is executed.

Figure 24:
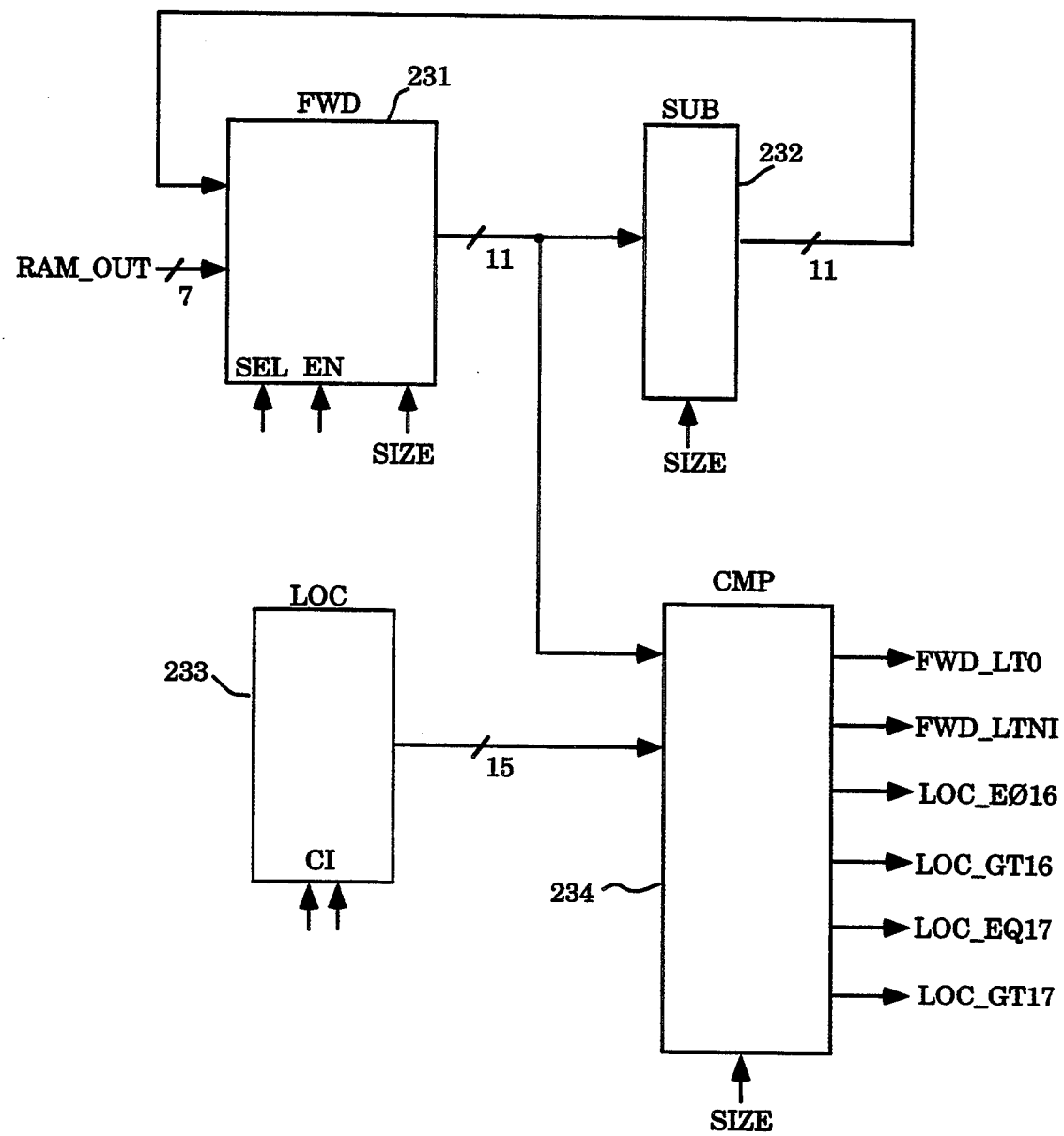
FIG. 24 is a block diagram of the Interleave & Sector Counters (ISC) block the present invention.

FIG. 24 is a block diagram of the Interleave and Sector Counters (ISC) block, which maintains forward displacement and ECC error location counters for the error identifier. IPC comprises CMP, FWD, LOC and SUB. The forward displacement of an error is the non-inclusive number of bytes between the first data byte of the sector and the byte in error.

CMP is a comparator circuit (block 234) with inputs FWD_OUT and LOC_OUT and outputs FWD_LT0, FWD_LTNI, LOC_EQ16, LOC_GT16, LOC_EQ17 and LOC_GT17, where FWD_LT0=(FWD_OUT<NUM_ILVS)
FWD_LTNI=(FWD_OUT<2*NUM_ILVS)
LOC_EQ16=(LOC_OUT==16)
LOC_GT16=(LOC_OUT>16)
LOC_EQ17=(LOC_OUT==17)
LOC_GT17=(LOC_OUT>17)

FWD is an eleven-bit register (block 231) which holds the forward displacements of errors. Bits 6-0 of FWD can be loaded from RAM_OUT; when bits 6-0 are so loaded, bits 10-7 of FWD IN are forced to 1001 if SIZE is one or forced to 0100 if SIZE is zero. For each interleave i in error (where 0≦i<NUM_ILVS), FWD is initialized to NUM_BYTS+i before the search for roots is begun. Each time the FDC is clocked, FWD is loaded from SUB_OUT. If FDO_OUT is zero before the FDC is clocked, then after the FDC is clocked, FWD holds the forward displacement of the error just located.

LOC is a five-bit counter (block 233) which holds the number of times the FDC has been clocked, up to eighteen. LOC can be cleared to zero. If LOC_GT17 is zero when the FDC is clocked, LOC is incremented.

SUB is an eleven-bit minus four-bit unsigned subtraction circuit (block 232) implementing

SUB_OUT=FWD_OUT−NUM_ILVS.

NUM-ILVS is determined by the SIZE signal as described herein.

RAM is a 226-by-eight-bit random-access memory which holds the time-domain CRC residue and ECC remainder bytes, frequency-domain ECC syndromes, polynomial coefficients and other data used by the error identifier. Usage of RAM is as shown in TABLE I. On power up or other initialization, the external microcontroller must write desired error threshold values to locations ILV_THR and SCT_THR, and must write zero to locations SIG_K+9 through SIG_K+16 and SIG_N+9 through SIG_N+16.

The error identifier has no need to access individual CRC residue or ECC remainder bytes using immediate addresses. In the preferred embodiment of the invention, implementation cost is reduced by storing these bytes beginning at RES_REM equal to 3Eh, above all other variables stored in the RAM, so that all immediate addresses used to access other variables need be only six bits wide. At the beginning of the error identification procedure, the four CRC residue bytes must be fetched from the RAM in reverse order and stored in the CRA registers and six bytes in the RAM must be cleared to zero. These six bytes are the four locations used for accumulating the adjusted CRC residue beginning at ADJ_CRC, the location used for the total error count (TOT_ERR), and the location used for the maximum interleave error count (MAX_ERR). It is advantageous to place ADJ_CRC at 3Ah, TOT_ERR at 39h and MAX-ERR at 38h, so that the address register used to access the four CRC residue bytes at consecutive decreasing addresses need not be reloaded before beginning a loop which clears the next six bytes at consecutive decreasing addresses. By placing SIG_K at 06h and SIG_N at 17h, the registers implemented for SK and SN need be only five bits wide, and this leaves room at 28h for storing the syndromes. The interleave error threshold (ILV_THR) and sector error threshold (SCT_THR) are placed adjacent to each other at the beginning of the RAM at 00h and 01h, respectively, to simplify microcontroller access. The remaining variables including the number of interleaves left to be processed (ILV_LFT), the address or $R_{15}$ of the interleave being processed (R15_ADR), the seven least-significant bits of the initial forward displacement value for the interleave being processed (MAX_FWD) and counter n of the iterative algorithm (N) are placed at the remaining RAM locations 02h, 03h, 04h and 05h respectively.

TABLE I

| | Address Map of the Error Identifier RAM | |
| --- | --- | --- |
| LABEL | DECIMAL ADDRESS | HEX ADDRESS |
| ILV_THR | 0 | 01 |
| SCT_THR | 1 | 01 |
| ILV_LFT | 2 | 02 |
| R15_ADR | 3 | 03 |
| MAX_FWD | 4 | 04 |

TABLE I-continued

Address Map of the Error Identifier RAM

| LABEL | DECIMAL ADDRESS | HEX ADDRESS |
|---|---|---|
| N | 5 | 05 |
| SIG_K | 6 | 06 |
| SIG_N | 23 | 17 |
| S | 40 | 28 |
| MAX_ERR | 56 | 38 |
| TOT_ERR | 57 | 39 |
| ADJ_CRC | 58 | 3A |

TABLE I-continued

Address Map of the Error Identifier RAM

| LABEL | DECIMAL ADDRESS | HEX ADDRESS |
|---|---|---|
| RES_REM | 62 | 3E |

ROM is a 157-by-seventeen-bit read-only memory which contains the sequence of instructions required to identify errors. TABLE II shows the contents of ROM in binary and hexadecimal form.

TABLE II

Contents of the Error Identifier ROM

| ADDR | LQPRDSTFC76543210 | HEX | ADDR | LQPRDSTFC76543210 | HEX |
|---|---|---|---|---|---|
| 00h | 00000000000000000 | 00000 | 28h | 01110010100100000 | 0E520 |
| 01h | 00101100001000001 | 05841 | 29h | 00110100010000010 | 06882 |
| 02h | 01100011100000110 | 0C704 | 2Ah | 11101011000110010 | 1D632 |
| 03h | 10101000001000010 | 15042 | 2Bh | 00100101110000101 | 04B85 |
| 04h | 11110110000000110 | 1EC06 | 2Ch | 11100011000101111 | 1C62F |
| 05h | 01100010100000110 | 0C506 | 2Dh | 00100001110000100 | 04384 |
| 06h | 11110100000000000 | 1E400 | 2Eh | 00100000000000011 | 04003 |
| 07h | 01110010000000000 | 0E400 | 2Fh | 01100000000110001 | 0C031 |
| 08h | 11101000000010000 | 1D010 | 30h | 10000000000000000 | 10000 |
| 09h | 01110000100000011 | 0E103 | 31h | 11110110001011110 | 1EC5E |
| 0Ah | 11101001000001101 | 1D20D | 32h | 00101100000000110 | 05806 |
| 0Bh | 00101000001100010 | 05062 | 33h | 01100111100110101 | 0CF35 |
| 0Ch | 00101000001011000 | 05058 | 34h | 11110000100001110 | 1E10E |
| 0Dh | 01110000100000100 | 0E104 | 35h | 11110010000100000 | 1E420 |
| 0Eh | 11100000000010011 | 1C013 | 36h | 00101100000010111 | 05817 |
| 0Fh | 00101000000000101 | 05005 | 37h | 01100111100111001 | 0CF39 |
| 10h | 00101000000110000 | 05030 | 38h | 11110000100011111 | 1E11F |
| 11h | 01110000100000100 | 0E104 | 39h | 11110010000100000 | 1E420 |
| 12h | 00101000000001010 | 0500A | 3Ah | 00101100111111010 | 059FA |
| 13h | 01110000100000010 | 0E102 | 3Bh | 01110000100000101 | 0E105 |
| 14h | 01111000100110100 | 0F134 | 3Ch | 00101101000101110 | 05A2E |
| 15h | 01110100000000011 | 0E803 | 3Dh | 01100000000111110 | 0C03E |
| 16h | 00101100000000111 | 05807 | 3Eh | 10110100001100000 | 16860 |
| 17h | 01100011100011000 | 0C718 | 3Fh | 01011101100000000 | 0BB00 |
| 18h | 11011000001000000 | 1B040 | 40h | 11100100001001010 | 1C84A |
| 19h | 01011000001000000 | 0B040 | 41h | 00101011110000000 | 05780 |
| 1Ah | 00101100000101000 | 05828 | 42h | 11101011001000101 | 1D645 |
| 1Bh | 01100111100011100 | 0CF1C | 43h | 00101000000000001 | 05001 |
| 1Ch | 11110011100100000 | 1E720 | 44h | 01000010001000000 | 08440 |
| 1Dh | 01110011100100000 | 0E720 | 45h | 00011000000000000 | 03000 |
| 1Eh | 01111000000000101 | 0F005 | 46h | 01100000001000111 | 0C047 |
| 1Fh | 00101100000000111 | 05807 | 47h | 01011010001000000 | 0B440 |
| 20h | 01100011100100001 | 0C721 | 48h | 11011001100100000 | 1B320 |
| 21h | 11011000001000000 | 1B040 | 49h | 01110010101100000 | 0E560 |
| 22h | 01011000001000000 | 0B040 | 4Ah | 00111010110000101 | 07585 |
| 23h | 11101010010000010 | 1D482 | 4Bh | 11101011000111011 | 1D63B |
| 24h | 00101100000101000 | 05828 | 4Ch | 00111100100000101 | 07905 |
| 25h | 00100100000000001 | 04801 | 4Dh | 01111000110011100 | 1F19C |
| 26h | 01101111100100111 | 0DF27 | 4Eh | 01110100100000100 | 0E904 |
| 27h | 11001101111100000 | 19BE0 | 4Fh | 00101110000000000 | 05C00 |
| 50h | 00111010000111001 | 07439 | 78h | 01100000011111010 | 0C07A |
| 51h | 01100000001010011 | 0C053 | 79h | 10010000100000000 | 12100 |
| 52h | 11110000100111001 | 1E139 | 7Ah | 11110110001011110 | 1EC5E |
| 53h | 10111000001100000 | 17060 | 7Bh | 11101111001011011 | 1DE5B |
| 54h | 00100010001111111 | 0447F | 7Ch | 00110100000000101 | 06805 |
| 55h | 00110110110111000 | 06DB8 | 7Dh | 11101100010010111 | 1D897 |
| 56h | 11100011001011001 | 1C659 | 7Eh | 00101100000111010 | 0583A |
| 57h | 00101010000000001 | 05401 | 7Fh | 01100011110000000 | 0C780 |
| 58h | 01110000100111000 | 0E138 | 80h | 11001011110010110 | 19796 |
| 59h | 01110000100000101 | 0E105 | 81h | 01110010100100000 | 0E520 |
| 5Ah | 00010001000000000 | 02200 | 82h | 00111000100000100 | 07104 |
| 5Bh | 01100000001011101 | 0C05D | 83h | 01110000100000100 | 0E104 |
| 5Ch | 11110111001011000 | 1EE58 | 84h | 00111000100000011 | 07103 |
| 5Dh | 11110111001011100 | 1EE5C | 85h | 01110000100000011 | 0E103 |
| 5Eh | 11101101001110001 | 1DA71 | 86h | 00111000010000010 | 07082 |
| 5Fh | 00101100000101000 | 05C28 | 87h | 11100011000010100 | 1C614 |
| 60h | 00111000010000101 | 07085 | 88h | 01110000100000010 | 0E102 |
| 61h | 01110000100000101 | 0E105 | 89h | 00111000000111000 | 07038 |
| 62h | 01000001001000000 | 08240 | 8Ah | 11101011010011010 | 1D69A |
| 63h | 01100000001100100 | 0C064 | 8Bh | 00101100000111010 | 0583A |
| 64h | 01110000100110111 | 0E137 | 8Ch | 01100011110001101 | 0C78D |
| 65h | 01000010010000000 | 08480 | 8Dh | 10110100000000000 | 16840 |
| 66h | 01000010100000000 | 08500 | 8Eh | 11101100010011011 | 1D89B |
| 67h | 10111000000110111 | 17037 | 8Fh | 00110100000000000 | 06800 |
| 68h | 01011010100000000 | 0B500 | 90h | 00110101110111000 | 06BB8 |
| 69h | 01001000001000000 | 09040 | 91h | 11100011010011100 | 1C69C |
| 6Ah | 01100110101101011 | 0CD6B | 92h | 00110100000000001 | 06801 |

TABLE II-continued

Contents of the Error Identifier ROM

| ADDR | LQPRDSTFC76543210 | HEX | ADDR | LQPRDSTFC76543210 | HEX |
|------|-------------------|------|------|-------------------|------|
| 6Bh | 110001010000100000 | 18A20 | 93h | 00110101110111001 | 06BB9 |
| 6Ch | 01001001001000000 | 09240 | 94h | 11100011010011100 | 1C69C |
| 6Dh | 11100100010010111 | 1C897 | 95h | 00000000000000000 | 00000 |
| 6Eh | 00010010000000000 | 02400 | 96h | 00010100000000000 | 02800 |
| 6Fh | 11101101001101111 | 1DA6F | 97h | 00101000001000000 | 05040 |
| 70h | 00000000000000001 | 00001 | 98h | 11101011010000010 | 1D682 |
| 71h | 11101110001111011 | 1DC7B | 99h | 01110000100111001 | 0E138 |
| 72h | 01110110101011100 | 0ED5C | 9Ah | 00010100000000100 | 02804 |
| 73h | 00110100000000010 | 06802 | 9Bh | 00010100000000010 | 02802 |
| 74h | 00100101110000101 | 04B85 | 9Ch | 00010100000000001 | 02801 |
| 75h | 11101011001111011 | 1D67B | | | |
| 76h | 00000000000000000 | 00000 | | | |
| 77h | 00100001001111111 | 0427F. | | | |

ERROR IDENTIFIER MICROENGINE INSTRUCTION SET

Each instruction comprises seventeen bits. The instruction bits are labeled as follows:

| Bit: | 16 | 15 | 14 | 13 | 12 | 11 | 10 | 9 | 8 | 7 | 6 | 5 | 4 | 3 | 2 | 1 | 0 |
|------|----|----|----|----|----|----|----|----|----|----|----|----|----|----|----|----|----|
| Label: | L | Q | P | R | D | S | T | F | C | 7 | 6 | 5 | 4 | 3 | 2 | 1 | 0 |

The Opcode of an instruction comprises bits Q, P and R. 'x' represents a bit whose value may be either one or zero. 'a' represents a bit which is part of an immediate ROM or RAM address; it may be either one or zero. 'v' represents a bit which is part of an immediate value; it may be either one or zero.

Conventions used for immediate values, immediate addresses and indirect addresses are as follows:

| | |
|---|---|
| VAL7 | Use the eight-bit value in bits 7-0 of IR_OUT after replacing the value of bit 7 with that of bit 6. This is equivalent to treating bits 6-0 of IR_OUT as a signed seven-bit integer with value in the range −64 to +63. |
| *(ADR6) | Read or write RAM at the address specified by bits 5-0 of IR_OUT. |
| *(A0) | Read or write RAM at the address specified by A0_OUT. |
| *(A0++) | Read or write RAM at the address specified by A0_OUT, then increment the A0 register. |
| *(A1++) | Read or write RAM at the address specified by A1_OUT, then increment the A1 register. |
| *(A1−−) | Read or write RAM at the address specified by A1_OUT, then decrement the A1 register. |

When any instruction with bit L equal to one (except a Conditional_Branch or Search_For_Root instruction) is executed, LC_OUT is examined. If LC_OUT is zero, IA is incremented; otherwise, LC is decremented and IA is loaded from LA_OUT.

When a Search_For_Root instruction with bit L equal to one is executed, FDC_OUT, FWD_OUT and LOC_OUT are examined. If FDC_OUT is zero, FWD_LTNI is one, or LOC_EQ16 is one, IA is incremented and bits L, Q, P and R of IR_IN are forced to zero to prevent execution of the next instruction by transforming it into a NOP instruction; otherwise, IA is loaded from LA_OUT.

OPCODE 000: NOP INSTRUCTIONS

| LQPR | DSTFC | 76543210 | |
|------|-------|----------|---|
| x000 | xxxxx | xxxxxxx0 | No Operation. |
| x000 | xxxxx | xxxxxxx1 | No Operation except when this instruction immediately follows a Conditional_Branch instruction If VREADY is zero when the Conditional_Branch instruction is executed, this instruction forces bit D of IR_OUT to zero. |

OPCODE 001: MISCELLANEOUS INSTRUCTIONS

| LQPR | DSTFC | 76543210 | |
|------|-------|----------|---|
| x001 | xxxx1 | xxxxxxxx | Load LN from LK_OUT. |
| x001 | xxx1x | xxxxxxxx | Load LK from LN_OUT. |
| x001 | xx1xx | xxxxxxxx | Correct_Error: If allowed by the current configuration signals and FWD_OUT, assert the signal which initiates an error correction vector transfer. FWD_OUT and DL_OUT are the forward displacement and value of the error, respectively. |
| x001 | x1xxx | xxxxxvvv | Stop: Assert the error signal specified by one of bits 2-0 equal to one (if any) and stop the error identifier. |

Bit Error signal
2 ECC_ERR
1 CRC_ERR
0 THR_ERR

| x001 | 1xxxx | xxxxxxxx | Load A0 from SN_OUT and load A1 from SK_OUT. |

OPCODE 110: BRANCH-CONTROL INSTRUCTIONS

Initiate_DO_Loop:

| LQPR | DSTFC | 76543210 | |
|------|-------|----------|---|
| 0110 | xxxx0 | aaaaaaaa | Load LA from bits 7-0 of IR_OUT and load LC from LN_OUT. |
| 0110 | vvvv1 | aaaaaaaa | Load LA from bits 7-0 of IR_OUT and load LC from bits D, S, T, F. |

Conditional_Branch:

| LQPR | DSTFC | 76543210 | |
|------|-------|----------|---|
| 1110 | xvvvx | aaaaaaaa | If the state of the signal selected by bits S, T and F of IR_OUT does not match bit D, load IA from bits 7-0 of IR_OUT. |

| STF | CONDITION |
|-----|-----------|
| 000 | NOT (SIZE) |
| 001 | NOT (FORM) |
| 010 | NZR_OUT |
| 011 | GTZ_OUT |
| 100 | ZRO_OUT |
| 101 | FZD_OUT |
| 110 | LOC_EQ17 |
| 111 | FWD_LT0 |

OPCODE 01x: ADD INSTRUCTIONS

Perform an eight-bit addition operation with carry-in:

$$ADD\_OUT = M1\_OUT + M2\_OUT + CARRY.$$

Mi_OUT is specified by bits T and F of the instruction. If bit 7 of the instruction is one, each bit of M1_OUT is inverted. M2_OUT is specified by bits R, 6 and 5 of the instruction. CARRY is bit C of the instruction. ADD_OUT is stored in the destination (s) specified by bits D and S of the instruction. The operation $$ADD\_OUT = M2\_OUT - M1\_OUT$$

is selected by bits 7 and C of the instruction both equal to one. The operation $$ADD\_OUT = M2\_OUT + 1,$$

is selected by bits T, F and 7 of the instruction all equal to zero and bit C of the instruction equal to one. The operation $$ADD\_OUT = M2\_OUT - 1,$$

is selected by bits T, F and C of the instruction all equal to zero and bit 7 of the instruction equal to one.

| TF7 | M1_OUT | R65 | M2_OUT | DS | DESTINATION(S) |
|---|---|---|---|---|---|
| 000 | 0 | 0vv | VAL7 | 00 | LN |
| 010 | D0_OUT | 10a | *(ADR6) | 01 | D0 |
| 1x0 | LN_OUT | 110 | *(A1++) | 10 | D1 |
| 001 | FFh | 111 | *(A0++) | 11 | D0=D1=ADD_OUT |
| 011 | D0_OUT ⊕ FFh | | | | |
| 1x1 | LN_OUT ⊕ FFh | | | | |

The following combinations are exceptions to the foregoing or cause additional functions to be performed:

| LQPR | DSTFC7 | 6543210 | |
|---|---|---|---|
| x01x | xx11xx | xxxxxx | Disregard bits R, 6 and 5; instead, use LK_OUT as M2_OUT. |
| x01x | 110x00 | xxxxxx | In addition to the normal function, store ADD_OUT in A1. |
| x011 | 100000 | 11xxxxx | Load_FDC_Sig: In addition to the normal function, store ADD_OUT in the FDC register D(i) specified by i=A1_OUT and decrement A1. |
| X010 | 110011 | vvvvvvv | Setup_Iteralgo: In addition to the normal function, store the initial value of D0_OUT in DK, clear LN and LK to zero, preset SN to 0Eh, and preset SK to 1Fh. |
| X010 | 111000 | vvvvvvv | Setup_A0_A1_D0_D1: In addition to the normal function, store ADD_OUT in A1, clear D0 and D1 to zero, and load A0 from SN_OUT. |
| X010 | 110100 | vvvvvvv | Setup_Compute_Dn: In addition to the normal function, store ADD_OUT in A1, clear D0 and D1 to zero, load A0 from SN_OUT, decrement SK, and increment LK. |

OPCODE 10x: VMS INSTRUCTIONS

Perform a finite-field variable multiply-and-sum operation:

$$VMS\_OUT = (M1\_OUT * M2\_OUT) \oplus M3\_OUT.$$

MI_OUT is specified by bits T and F of the instruction. M2_OUT is specified by bits R, 6 and 5 of the instruction. M3_OUT is specified by bits C and 7 of the instruction. VMS_OUT is stored in the destination(s) specified by bits D and S of the instruction. Note that when bits D and S of the instruction are both zero, the initial value of D0_OUT is stored in DK. If bits T and F are both one, the CRA is clocked.

| TF | M1_OUT | R65 | M2_OUT | C7 | M3_OUT | DS | DESTINATION(S) |
|---|---|---|---|---|---|---|---|
| 00 | A135L_OUT | 000 | AL_OUT | 00 | 0 | 01 | D0 |
| 01 | D0_OUT | 001 | D0_OUT | 10 | D1_OUT | 10 | D1 |
| 10 | DK_OUT | 010 | DL_OUT | 01 | *(A0++) | 11 | D0=D1=VMS_OUT |
| 11 | CRA_OUT | 011 | FDC_OUT | 11 | *(A1) | 00 | DK=D0_OUT, D0=D1=VMS_OUT |
| | | 100 | *(A1--) | | | | |
| | | 101 | *(A1++) | | | | |
| | | 110 | *(A0) | | | | |
| | | 111 | *(A0++) | | | | |

The following combinations are exceptions to the foregoing or cause additional functions to be performed:

| LQPR | DSTFC7 | 6543210 | |
|---|---|---|---|
| x101 | 100000 | 10xxxxx | Load_FDC_Rem: In addition to the normal function, store VMS_OUT in the FDC register D(i) specified by i=A1_OUT, decrement A1, add NUM_ILVS to A0, store A135_OUT in A135, and if M40_OUT is one, set NZR. |
| X100 | 110111 | 11xxxxx | Compute-Syndrome: Disregard bits D and S. Instead, store VMS_OUT in D1. In addition, clock the FDC and store A247_OUT in D0. |
| x100 | 001000 | 10xxxxx | Swap_K_N_Regs: In addition to the normal function, exchange the contents of SN and SK and exchange the contents of LN and LK. |

OPCODE 111: ASSIGNMENT INSTRUCTIONS

If bit F of any instruction with Opcode 111 is one, the FDC is clocked. If both bits S and T of any instruction with Opcode 111 are one, the CRA is clocked.

The sequence of instructions used in the preferred embodiment to implement the error identification procedure is shown in TABLE III. This sequence is implemented in the contents of ROM shown in TABLE II. A variable stored in RAM at a label shown in TABLE I is denoted by the parenthesized label preceded by "*"; the value of a label is denoted by the label itself.

| LQPR | DSTFC7 | 6543210 | |
|------|--------|---------|---|
| x111 | 000xx0 | 0aaaaaa | Write RAM at the address in bits 5-0 from the source specified by bits F and C of IR_OUT.<br>FC  SOURCE       DESTINATION<br>00  0            *(ADR6)<br>01  DL_OUT<br>1x  FDC_OUT |
| x111 | 001xx0 | xxxxxxx | Write RAM at the address specified by bits 6 and 5 of IR_OUT from the source specified by bits F and C of IR_OUT.<br>FC  SOURCE     65  DESTINATION<br>00  0          00  *(A1--)<br>01  D1_OUT     01  *(A1++)<br>1x  FDC_OUT    10  *(A0)<br>                     11  *(A0++) |
| x111 | 010xxx | 0aaaaaa | Load the destination specified by bit C of IR_OUT from bits 6-0 of the value read from RAM at the address in bits 5-0 of IR_OUT.<br>SOURCE     C   DESTINATION<br>*(ADR6)    0   A0<br>           1   FWD<br>Note: Bit 7 of A0 is loaded with 0; bits 10-8 of FWD are loaded with bits 10-8 of NUM_ILVS. |
| x111 | 10000v | vvvvvvv | Load_A135L: Load A135L with the value in bits 7-0 of IR_OUT. |
| x111 | 10001v | vvvvvvv | Initialize_FDC: Load A135L with the value in bits 7-0 of IR_OUT, preset AL to $\alpha^{-1}$, clear each FDC register D(i) to zero, and clear LOC and NZR to zero. |
| x111 | 011100 | 10vvvvx | Search_For_Root (described above). |

TABLE III

| | Error Identifier Instruction Sequence |
|---|---|
| 00h | No_Operation(0); |
| 01h | D0 = D1 = A1 = ADD(0, RES_REM+3); |
| 02h | Initiate_D0_Loop(3, 04h); |
| 03h | D1 = ADD(0, RES_REM+4); |
| 04h |   Clock_CRA(*(A1--),0,06h); |
| 05h | Initiate_D0_Loop(2, 06h); |
| 06h |   *(A1--) = 0; |
| 07h |   *(A1--) = 0; |
| 08h | IF(!SIZE != 1, 10h); |
| 09h |   *(R15_ADR) = D1; |
| 0Ah |   IF(!FORM != 1, 0Dh); |
| 0Bh |     D1 = ADD(0, 610 & 7Fh); |
| 0Ch |     D1 = ADD(0, 600 & 7Fh); |
| 0Dh |   *(MAX_FWD) = D1; |
| 0Eh |   IF(!SIZE != 0, 13h); |
| 0Fh |     D1 = ADD(0, 5); |
| 10h |   D1 = ADD(0, 1200 & 7Fh); |
| 11h |   *(MAX_FWD) = D1; |
| 12h |   D1 = ADD(0, 10); |
| 13h | *(ILV_LFT) = D1; |
| 14h | Initialize_FDC($\alpha^{15}$); |
| 15h | A0 = *(R15_ADR) & 7fh; |
| 16h | D0 = D1 = A1 = ADD(0, 7); |
| 17h | Initiate_O0_Loop(3, 18h); |
| 18h |   Load_FDC_Rem() ; |
| 19h |   Load_FDC_Rem(); |
| 1Ah | D0 = D1 = A1 = ADD(0, S); |
| 1Bh | Initiate_D0_Loop(7, 1Ch); |
| 1Ch |   *(A1++) = FDC_OUT, Clock_FDC(); |
| 1Dh |   *(A1++) = VRC_OUT, Clock_FDC(); |
| 1Eh | Load_A135L($\alpha^{75}$); |
| 1Fh | D0 = D1 = A1 = ADD(0, 7); |
| 20h | Initiate_DO_Loop(3, 21h); |
| 21h |   Load_FDC_Rem(); |
| 22h |   Load_FDC_Rem(); |
| 23h | IF(NZR_OUT != 1, 84h); |
| 24h | D0 = D1 = A1 = ADD(0, S); |

TABLE III-continued

Error Identifier Instruction Sequence

| | |
|---|---|
| 25h | D0 = ADD(0, 1); |
| 26h | Initiate_DO_Loop(15, 27h); |
| 27h | Compute_Syndrome(); |
| 28h | *(A1++) = D1; |
| 29h | D0 = ADD(-1, *(ILV_LFT)); |
| 2Ah | IF(GTZ_OUT != 1, 31h); |
| 2Bh | D0 = ADD(-D0_OUT, 5); |
| 2Ch | IF(GTZ_OUT != 0,2Fh); |
| 2Dh | LN = ADD(-D0_OUT, 4); |
| 2Eh | LN = ADD(0, 3); |
| 2Fh | Initiate_D0_Loop(LN_OUT, 31h); |
| 30h | No_operation(0) |
| 31h | Clock CRA(*(A0), 0,1Eh), |
| 32h | D0 = D1 = A1 = ADD(0, SIG_K); |
| 33h | Initiate_D0_Loop(7, 35h); |
| 34h | *(SIG_K+8) = D1; |
| 35h | *(A1++) = 0; |
| 36h | D0 = D1 = A1 = ADD(0, SIG_N); |
| 37h | Initiate_D0_Loop(7, 39h); |
| 38h | *(SIG_N+8) = D1; |
| 39h | *(A1++) = 0; |
| 3Ah | Setup_Iteralgo(7Ah); |
| 3Bh | *(N) = D1; |
| 3Ch | Setup_Compute_DN(); |
| 3Dh | Initiate_D0_Loop(LN_OUT, 3Eh); |
| 3Eh | D0 = ADD(0, *(A0++)); |
| 3Fh | D0 = D1 = VMS(D0_OUT, *(A1--), D1_OUT); |
| 40h | IF(ZRO_OUT != 0, 4Ah); |
| 41h | D1 = ADD(-LN_OUT, LK_OUT); |
| 42h | IF(GTZ_OUT != 1, 45h); |
| 43h | D1 = ADD(0, 1); |
| 44h | Swap_K_N_Regs() |
| 45h | A0 = SN_OUT, A1 = SK_OUT; |
| 46h | Initiate_D0_Loop(LN_OUT, 47h); |
| 47h | D1 = VMS(DK_OUT, *(A0), 0); |
| 48h | D1 = VMS(D0_OUT, *(A1++), D1_OUT); |
| 49h | *(A0++) = D1; |
| 4Ah | D1 = ADD(-LN_OUT, *(N)); |
| 4Bh | IF(GTZ_OUT != 1, 3Bh); |
| 4Ch | D0 = D1 = ADD(+1, *(N)); |
| 4Dh | Initialize_FDC($\alpha^{120}$)); |
| 4Eh | FWD = (NUM_BYTS & 780h) \| (*(MAX_FWD) & 7Fh); |
| 4Fh | Setup_A0_A1_D0_D1(0); |
| 50h | D1 = ADD(LN_OUT, *(TOT_ERR)); |
| 51h | Initiate_DO_Loop(LN_OUT, 53h); |
| 52h | *(T0T_ERR) = D1; |
| 53h | Load_FDC_Sig(); |
| 54h | LN = ADD(LN_OUT, 7Fh); |
| 55h | D0 = ADD(-LN_OUT, *(MAX_ERR)); |
| 56h | IF(GTZ_OUT != 0, 59h); |
| 57h | D1 = ADD(LN_OUT, 1); |
| 58h | *(MAX_ERR) = D1; |
| 59h | *(N) = D1; |
| 5Ah | LK = LN_OUT; |
| 5Bh | Initiate_DO_Loop(LN_OUT, 5Dh); |
| 5Ch | Search_For_Root(18h) |
| 5Dh | Search_For_Root(1Ch) |
| 5Eh | IF(FZD_OUT != 1, 71h); |
| 5Fh | Setup_A0_A1_D0_D1(S) |
| 60h | D1 = ADD(-1, *(N)); |
| 61h | *(N) = D1; |
| 61h | DK = D0_OUT, D0 = D1 = VMS(D0_OUT, D1_OUT, 0); |
| 63h | Initiate_D0_Loop(LN_OUT, 64h); |
| 64h | *(S+15) = D1; |
| 65h | D0 = D1 = VMS(DK_OUT,AL_OUT,*(A0++)), DK=Initial D0_OUT; |
| 66h | D0 = D1 = VMS(DK_OUT,AL_OUT,D1_OUT), DK= Initial D0_OUT; |
| 67h | D1 = ADD(0, *(S+15)); |
| 68h | D1 = VMS(DK_OUT, *(A1--), D1_OUT); |
| 69h | D1 = VMS(A135L_OUT, D1_OUT, 0). |
| 6Ah | Initiate_D0_Loop(6, 6Bh); |
| 6Bh | D0 = VMS(D0_OUT, D0_OUT, 0); |
| 6Ch | D1 = VMS(D0_OUT, D1_OUT, 0); |
| 6Dh | IF(ZRO_OUT != 0, 97h). |
| 6Eh | Correct Errors; |
| 6Fh | IF(FZD_OUT != 1), 6Fh); |
| 70h | No Operation(1); |
| 71h | IF(LOC_EQ17 != 1, 7Bh); |
| 72h | Clock_CRA(*(A0),D1_OUT,1Ch); |
| 73h | D0 = ADD(0, *(ILV_LFT)); |
| 74h | D0 = ADD(-D0_OUT, 5); |
| 75h | IF(GTZ_OUT != 1, 7Bh); |

TABLE III-continued

Error Identifier Instruction Sequence

| | |
|---|---|
| 76h | No_Operation(0); |
| 77h | LN = ADD(D0_OUT, 7Fh); |
| 78h | Initiate_D0_Loop(LN_OUT, 7Ah); |
| 79h | LN = LK_OUT; |
| 7Ah | Clock_1 CRA(*(A0),0,1Eh); |
| 7Bh | IF(FWD_LTNI != 1, 5Bh); |
| 7Ch | D0 = ADD(0, N); |
| 7Dh | IF(ZRO_OUT != 1, 97h); |
| 7Eh | D0 = D1 = A1 = ADD(0, CRC); |
| 7Fh | Initiate_D0_Loop(3, 80h) |
| 80h | D1 = VMS(CRA_OUT, AL_OUT, *(A1)), Clock_CRA(*(A0),0,16h); |
| 81h | *(A1++) = D1; |
| 82h | D1 = ADD(1, *(MAX_FWD)); |
| 83h | *(MAX_FWD) = D1; |
| 84h | D1 = ADD(1, *(R15_ADR)); |
| 85h | *(R15_ADR) = D1; |
| 86h | D1 = ADD(-1, *(ILV_LFT)); |
| 87h | IF(GTZ_OUT != 0, 14h); |
| 88h | *(ILV_LFT) = D1; |
| 89h | D1 = ADD(0, *(MAX_ERR)); |
| 8Ah | IF(GTZ_OUT != 1, 9Ah); |
| 8Bh | D0 = D1 = A1 = ADD(0, CRC); |
| 8Ch | Initiate_D0_Loop(3, 8Dh); |
| 8Dh | D0 = ADD(D, *(A1++)); |
| 8Eh | IF(ZRO_OUT != 1, 9Bh); |
| 8Fh | D0 = ADD(0, *(ILV_THR)); |
| 90h | D0 = ADD(-D0_OUT, *(MAX_ERR)); |
| 91h | IF(GTZ_OUT != 0, 9Ch); |
| 92h | D0 = ADD(0, *(SCT_THR)); |
| 93h | D0 = ADD-D0_OUT, *(TOT_ERR)); |
| 94h | IF(GTZ_OUT != 0, 9Ch); |
| 95h | No_Operation(0); |
| 96h | Stop(0); |
| 97h | D1 = ADD(0, 40h); |
| 98h | IF(GTZ_OUT != 1, 82h); |
| 99h | *(MAX_ERR) = D1; |
| 9Ah | Stop(4); |
| 9Bh | Stop(2); |
| 9Ch | Stop(1); |

ERROR IDENTIFICATION ALGORITHM

Figure 25:
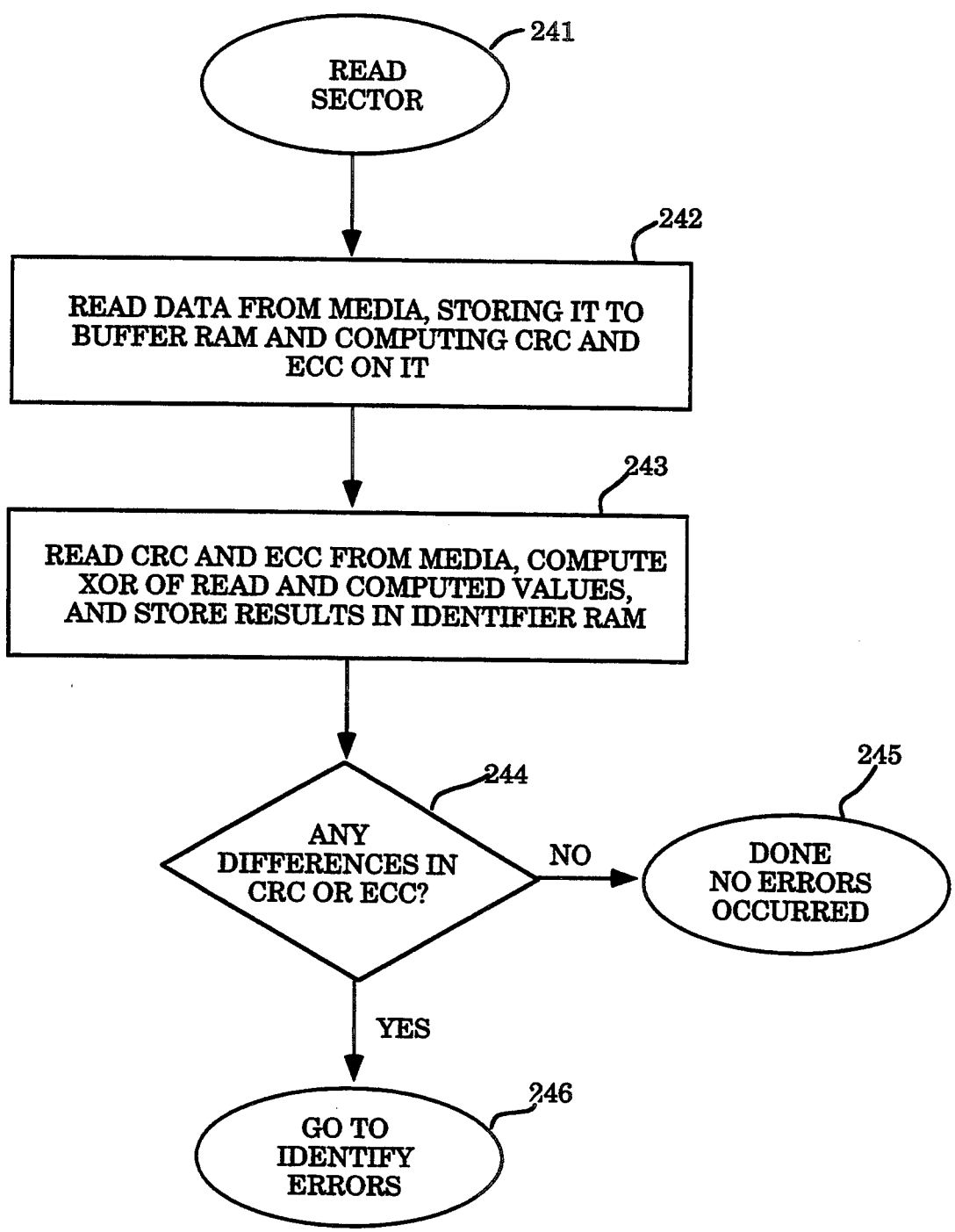
FIG. 25 is a flow chart of the overall read sector operation.

FIG. 25 illustrates the read-sector process for the typical case where DISABLE is zero, CONT is zero and BUSY is zero at the leading edge of CG_RG; other cases are described above. First, circuitry in the Encode/Decode LFSR block of the CL-SM330 computes CRC and ECC redundancy over user-data and vendor-unique/pointer bytes read from the optical disk. While CRC and ECC redundancy bits are read CG_RG is asserted and CRC residue/ECC remainder bits (which are the EXCLUSIVE-OR sum of the computed and read redundancy bits) are presented on RMNDR. T7 is asserted while every eighth such bit is presented. CG_RG, RMNDR and T7 are synchronized with RRCLK. The error identifier deserializes the CRC residue/ECC remainder bits from RMNDR and stores the CRC residue/ECC remainder bytes in RAM. At the trailing edge of CG_RG if no non-zero bit was detected on RMNDR while CG_RG was asserted, then the error identifier immediately asserts DONE; otherwise, the error identifier asserts BUSY and begins identifying introduced errors.

Figure 26:
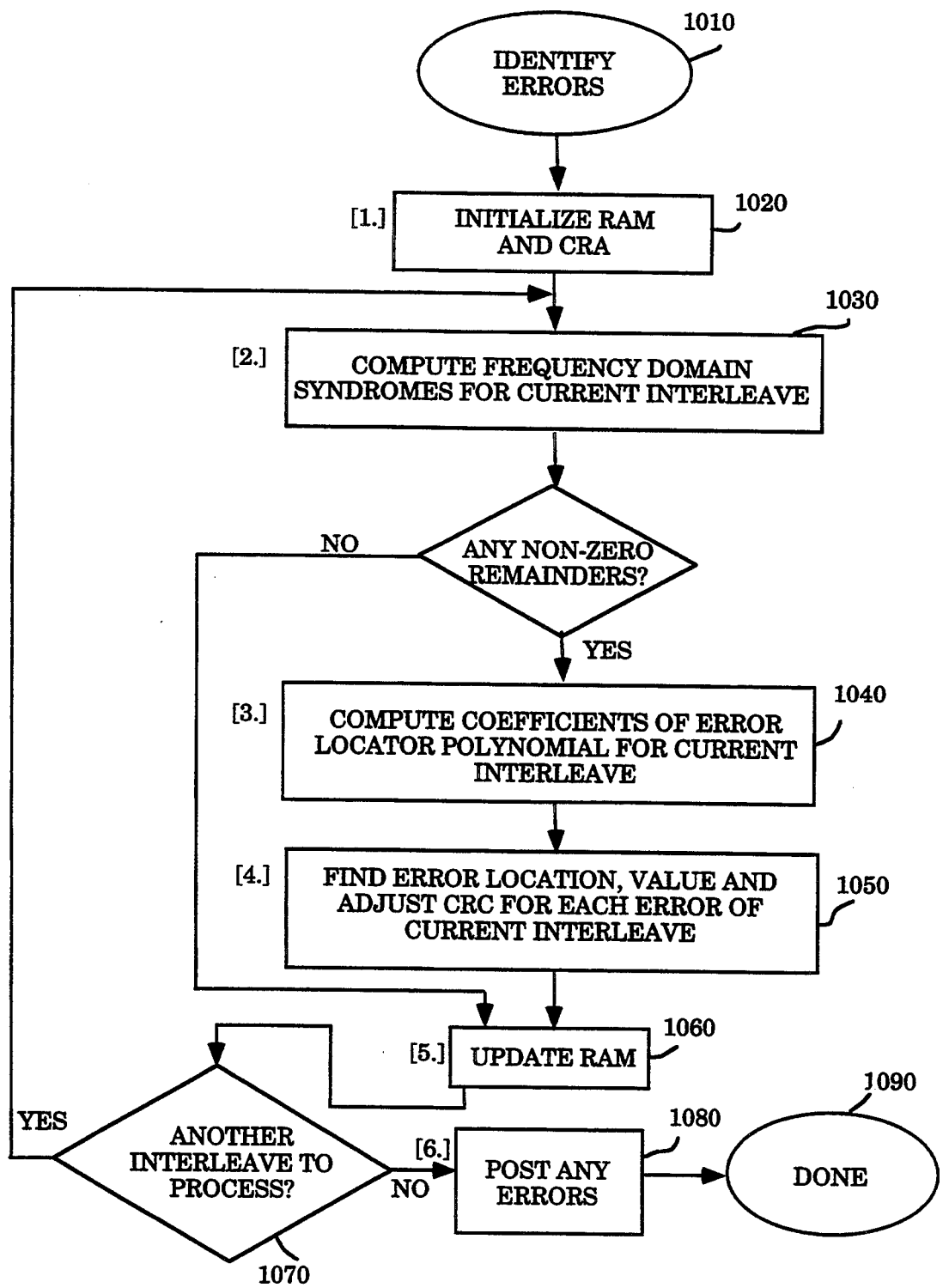
FIG. 26 is a flow chart of the identify errors operation.

FIG. 26 illustrates the major steps of the error identification process. In step 1020, the RAM and the CRA are initialized. Then for each interleave, the following process is repeated: In step 1030, compute frequency-domain syndromes from the remainder. If all remainder coefficients are zero, the control is transferred to step 1080. Otherwise in step 1040, compute coefficients of the error locator polynomial from the syndromes, and in step 1050, perform the Chien search to locate each errors, adjusting the CRC residue whenever an error is found.

In step 1060, the RAM elements at MAX_FWD and R15_ADR are incremented and the RAM element at ILV_LFT is decremented. If the RAM element at ILV_LFT is not zero, control is transferred to step 1030. Otherwise, in step 1080, if any uncorrectable ECC error was detected, the error identifier asserts ECC_ERR and stops; if any of the four RAM elements at ADJ_CRC is non-zero, an uncorrectable CRC error has been detected and the error identifier asserts CRC_ERR and stops; if the value stored in the RAM element at MAX_ERR exceeds that stored in the RAM element at ILV_THR or if the value stored in the RAM element at TOT_ERR exceeds that stored in the RAM element at SCT_THR, a threshold error has been detected and the error identifier asserts THR_ERR and stop; otherwise the error identifier stops without asserting any error signal. When the error identifier stops, it deasserts BUSY and asserts DONE.

Figure 27:
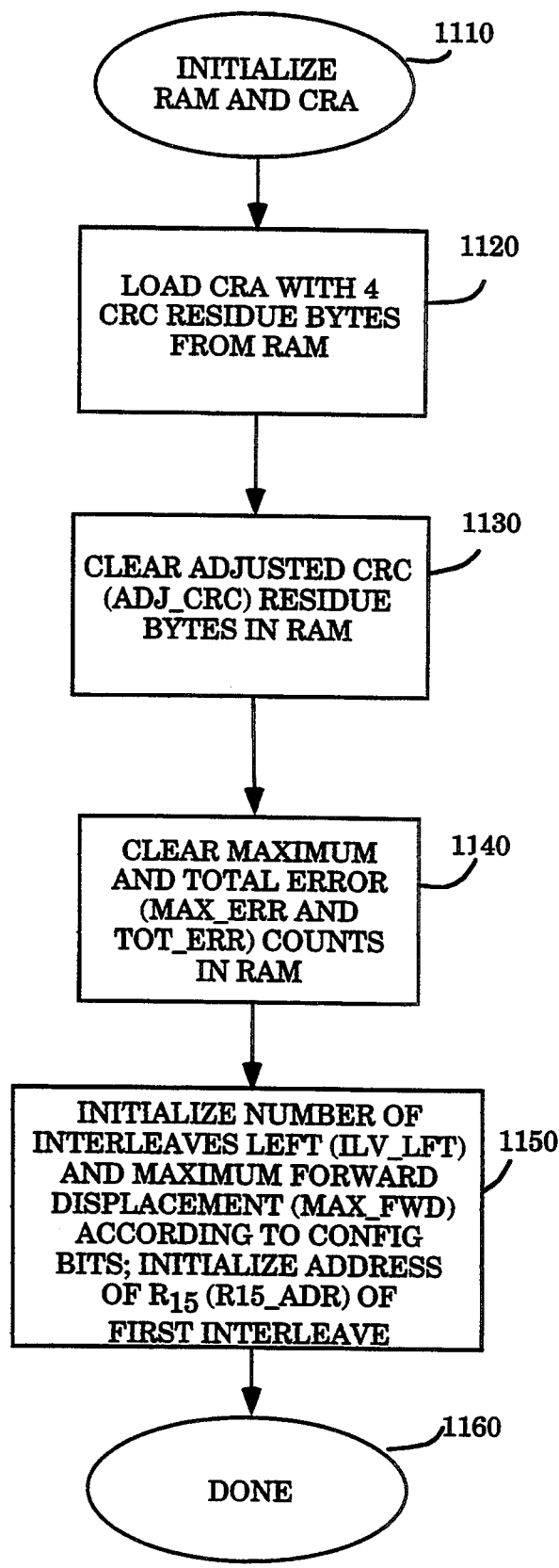
FIG. 27 is a flow chart of the initialize RAM and CRA operation.

FIG. 27 shows the process of initializing the RAM and the CRA each time a sector containing errors is detected. First the four CRC residue bytes stored in RAM at RES_REM are loaded into the CRA registers. Then the four RAM elements at ADJ_CRA, used for accumulating the adjusted CRC residue, the RAM element at MAX_ERR, used for the maximum error count and the RAM element at TOT_ERR, used for the total error count, are cleared to zero. The RAM element at R15_ADR, used to record the address in RAM of $R_{15}$ of the current interleave, is initialized to RES_REM+4. The RAM element at MAX_FWD, used to record the seven least-significant bits of the sum of NUM_ILVS and the forward displacement of the last byte of the current interleave, is initialized to NUM_BYTS. The RAM element at ILV_LFT, used to record the number of interleaves remaining to be processed, is initialized to NUM_ILVS.

Figure 28:
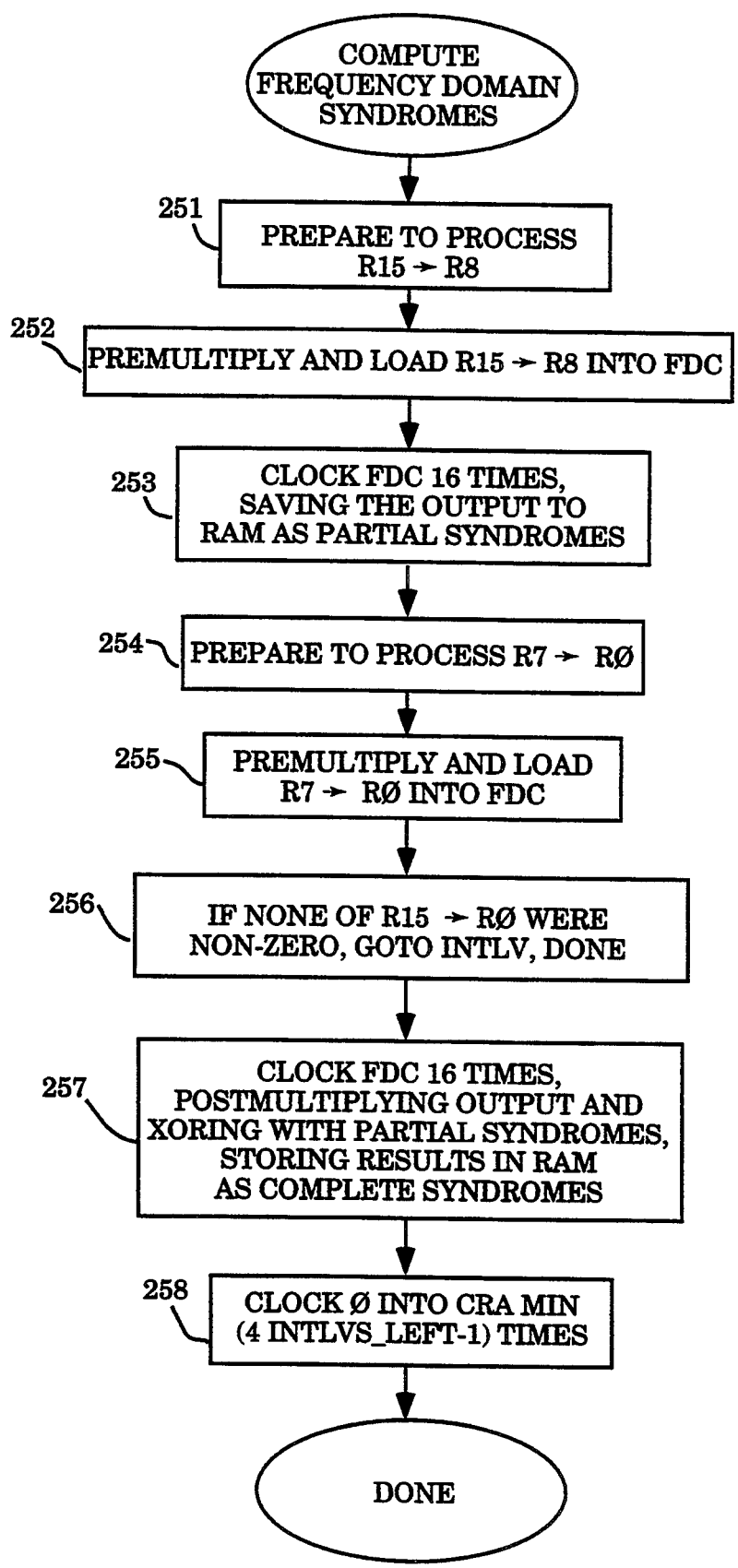
FIG. 28 is a flow chart of the compute frequency-domain syndromes operation.

FIG. 28 is a flow chart of the compute frequency-domain syndromes operation. In step 251, A0, A1, A135L and the FDC are initialized for the first step. Then in step 252, coefficients $R_{15}$ through $R_8$ are read from RAM, multiplied by A135L_OUT and stored in D(7) through D(0). As each coefficient specified by A0 is processed, VMS_OUT is stored in the FDC register specified by A1, NUM_ILVS is added to A0, A1 is decremented and A135_OUT is stored in A135L and NZR is set if M40_OUT is one; all these functions are performed by the microcengine Load_FDC_Rem instruction. Then in step 253, the FDC is clocked sixteen times, with the partial syndrome on FDC_OUT being stored each time in RAM. Then in step 254, A1, A135L and D0 are initialized for the second step. Then in step 255, coefficients $R_7$ through $R_0$ are read from RAM, multiplied by A135L_OUT and stored in D(7) through D(0), with A0, A1, A135L and NZR treated as in the first step, again by using the microengine Load_FDC_Rem instruction. Then in step 256, if none of $R_{15}$ through $R_0$ were non-zero, NZR will be zero and the ECC code detected no errors in the current interleave, the error identification process for the current interleave is complete so control is passed to step 1060 of FIG. 26. Otherwise, the error identification process for the current interleave continues with step 257, in which the FDC is clocked sixteen times, with the EXCLUSIVE-OR sum of the product of FDC_OUT and D0_OUT and the corresponding partial syndrome from the first step being stored in RAM and A247_OUT being stored in D0. This is performed by executing a microengine Compute_Syndrome instruction in which the normal function of bits D and S is disregarded and instead, VMS_OUT is stored in D1 at the same time that the FDC is clocked and A247_OUT is stored in D0. Then in step 258, zero is clocked into the CRA is clocked as necessary to account for any CRC remainder bytes between the last non-ECC remainder byte of the current interleave and the first ECC remainder byte of the sector. Note that this clocking of the CRA could be performed later, e.g. just before the loop in FIG. 30 is begun or immediately after the loop of FIG. 30 is interrupted when the FDC has been clocked $d-1$ times, but that to do so would increase the required ROM size and time required to perform the error identification procedure.

Figure 29:
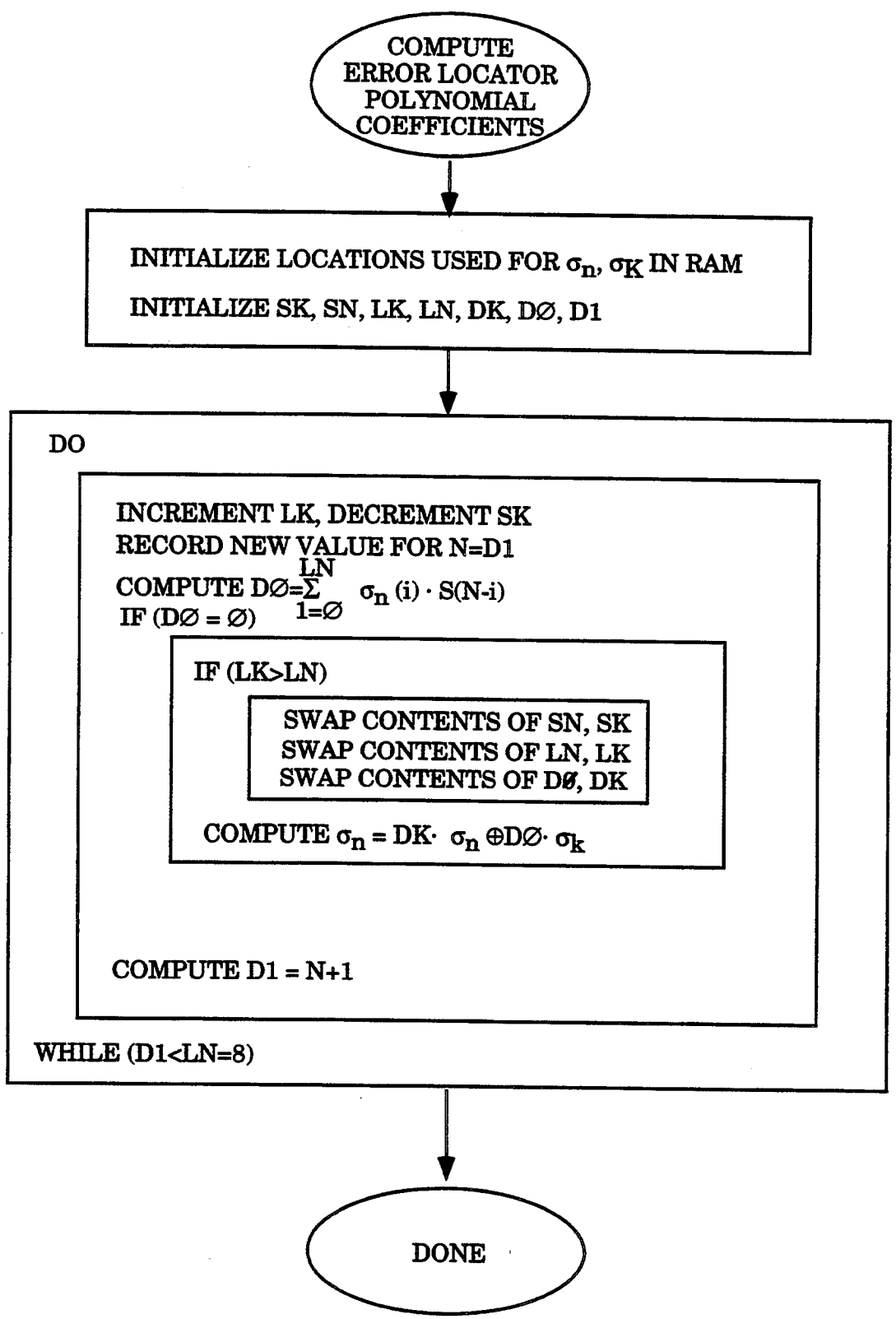
FIG. 29 is a flow chart of the compute error locator polynomial coefficients operation.

FIG. 29 is a flow chart of the compute error locator polynomial coefficients operation. This implements the new iterative algorithm of FIG. 13, as detailed in TABLE III. In the preferred embodiment of the invention, the swapping of the contents of LK and LN; DK and D0; and SK and SN are performed using a single microengine Swap_K_N_Regs instruction after one has been stored into D1 using a microengine ADD instruction. When the Swap_K_N_Regs instruction is executed, the product of D1_OUT and DK is stored in D0 and D1 at the same time that D0_OUT is stored in DK, LK_OUT is stored in LN, LN_OUT is stored in LK, SK_OUT is stored in SN and SN_OUT is stored in SK.

Figure 30:
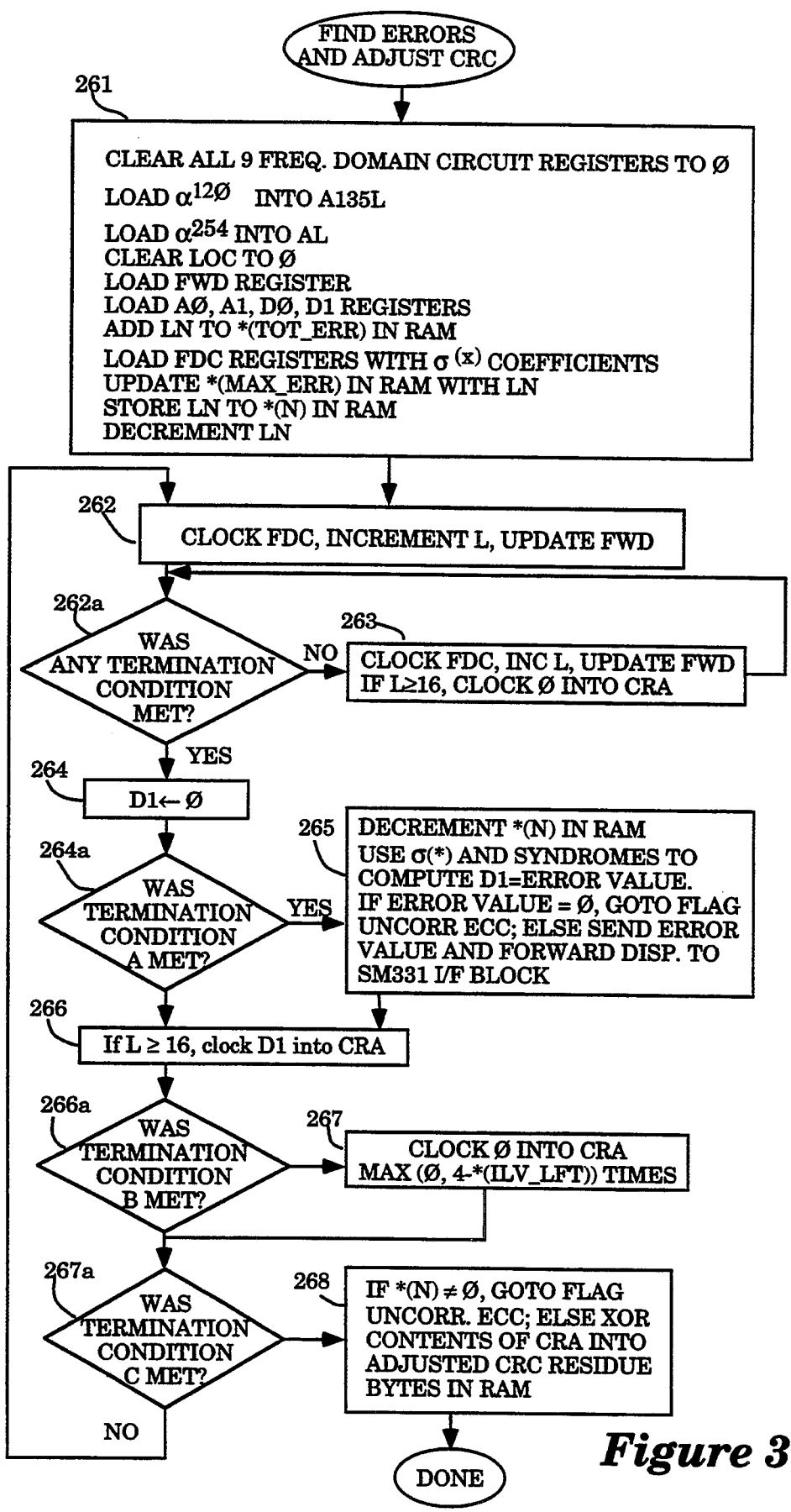
FIG. 30 is a flow chart of the find errors and adjust CRC residue operation.

FIG. 30 is a flow chart of the find errors and adjust CRC operation. In step 261, A135L, AL, LOC, FWD, A0, A12, D0, D1 and the FDC are initialized. The RAM element at TOT_ERR is updated by adding LN. If necessary, the RAM element at MAX_ERR is updated with LN. The error locator polynomial coefficients in RAM at the address contained in SN are loaded into the FDC registers D(i). LN is stored in the RAM location at N, then LN is decremented. Then in step 262, the FDC is clocked and L is incremented. Then if none of the conditions for terminating the search for roots was met before the FDC was clocked, the loop of step 263 is begun, in which zero is clocked into the CRA, the FDC is clocked and L is incremented until one of the terminating conditions is met. When one of the terminating conditions is met, the pipelined nature of instruction execution requires that execution of the next instruction be blocked. As disclosed herein, this is accomplished by transforming it into a No-Operation. Then in step 264, D1 is cleared. Then if condition (a) was met, step 265 is performed. In step 265, the RAM element at N is decremented and the error value is computed and stored in D1. Computing the error value requires performing a finite-field variable division. Hardware for performing this operation directly is complex and expensive. In the preferred embodiment, of the invention, implementation cost is reduced by using the following identity to perform finite-field division as a series of finite-field multiplications:

$$\frac{x}{y} = x*y^{-1} = x*y^{2b-2} = x* \prod_{i=1}^{b-1} y^{2i} \qquad (14)$$

Proceeding according to equation (14), finite-field division of x by y is performed by first loading x into D1 and y into D0, then repeating the following two-step process b-1 times: store the product of D0_OUT and D0_OUT in D0, then store the product of D0_OUT and D1_OUT in D1. The value x/y is produced in D1 and if either x or y was zero, D1_OUT is zero.

If the computed error value is zero, an uncorrectable ECC error has been detected, so this fact is recorded and control is transferred to step 1060 of FIG. 26; otherwise, if correction of the identified error is allowed by its forward displacement and the configuration bits, then the forward displacement and value of the identified error are presented to the CL-SM331 Interface block on FWD_OUT and D1_OUT respectively. The CL-SM331 deasserts VREADY when it is not able to accept an error correction vector. When the error identifier is ready to send an error correction vector, it waits until VREADY is asserted before asserting SEND_VEC. Then in step 266, D1_OUT is clocked into the CRA if LOC_GT16 is one. Then if condition (b) was met, step 267 is performed. In step 267, zero is clocked into the CRA as necessary to account for any CRC remainder bytes between the last non-CRC remainder byte of the sector and the last non-ECC remainder byte of the current interleave. Then if condition (c) was not met, control is transferred to step 262, otherwise step 268 is performed. In step 268, if the RAM element at N is not zero, an uncorrectable ECC error has been detected so this fact is recorded and control is transferred to step 1060 of FIG. 26; otherwise, the EXCLUSIVE-OR sums of the four RAM elements at ADJ_CRC and the products of the contents of the CRA registers and AL_OUT are stored in RAM at ADJ_CRC and then control is transferred to step 1060 of FIG. 26.

There has been disclosed and described in detail herein the preferred embodiment of the invention and its method of operation. From the disclosure it will be obvious to those skilled in the art that various changes in form and detail may be made to the invention and its method of operation without departing from the spirit and scope thereof.

We claim:

1. A circuit for producing a series of electronic values of frequency-domain syndromes of a Reed-Solomon or related code of distance d, the frequency-domain syndromes being denoted $S_{m+i}$ for i from 0 to d−2 wherein m is an offset of a code generator polynomial, from a set of electronic values of time-domain remainder coefficients $R_j$ for j from 0 to d−2 comprising:

means of t (d odd) or t+1 (d even) stages for electronically determining values of said frequency domain syndromes in two steps, including a step processing electronic values of said time-domain remainder coefficients $R_j$ for j from 0 to t−1, where t= and producing electronic values of their contributions $A_{m+i}$ to said frequency-domain syndromes $S_{m+i}$ according to $$A_{m+i} = \sum_{j=0}^{t-1} [R_j * \alpha^{m*j}] * \alpha^{j*i}$$

and a step processing electronic values of said time-domain remainder coefficients $R_j$ for j from t to d−2 and producing electronic values of their contributions $B_{m+i}$ to said syndromes $S_{m+i}$ according to $$B_{m+i} = \alpha^{t*i} * \sum_{j=0}^{d-2-t} [R_{j+t} * \alpha^{m*(j+t)}] * \alpha^{j*i}$$

said syndromes $S_{m+i}$ being formed as sums of respective electronic values of said contributions $A_{m+i}$ and $B_{m+i}$ for i from 0 to d−2.

2. A circuit for producing a series of electronic values of frequency-domain syndromes of a Reed-Solomon or related code of distance d, the frequency-domain syndromes being denoted $S_{m+i}$ for i from 0 to d−2 wherein m is an offset of a code generator polynomial, a parameter of the code, from a set of electronic values of time-domain remainder coefficients $R_j$ for j from 0 to d−2 comprising: means of t(d odd) or t+1 (d even) stages for electronically determining values of said frequency domain syndromes in two steps, including a step processing electronic values of said time-domain remainder coefficients $R_j$ for j from 0 to t−1, where t= and producing electronic values of their contributions $A_{m+i}$ to said syndromes $S_{m+i}$ according to $$A_{m+i} = \alpha^{-t*i} * \sum_{j=t}^{2*t-1} [R_{j-t} * \alpha^{m*(j+t)}] * \alpha^{j*i}$$

and a step processing said remainder coefficients $R_j$ for j from t to d−2 and computing their contributions $B_{m+i}$ to said frequency-domain syndromes $S_{m+i}$ according to $$B_{m+i} = \sum_{j=t}^{d-2} [R_j * \alpha^{m*j}] * \alpha^{j*i}$$

said frequency-domain syndromes $S_{m+i}$ being formed as sums of respective electronic values of said contributions $A_{m+i}$ and $B_{m+i}$ for i from 0 to d−2.

3. In a decoder for an error detection and correction system using a Reed-Solomon code or related code, a method of electronically decoding a Reed-Solomon code or related code of distance d having frequency domain syndromes $S_{m+i}$ for i from 0 to d−2, comprising the steps of:

(A) receiving an electronic signal of a code word polynomial;

(B) generating electronic values of an error locator polynomial G (x) from the code word polynomial electronic signal utilizing two polynomials $s^{(k)}(x)$ and $s^{(n)}(x)$ having respective coefficients $s_j^{(k)}$ and $s_j^{(n)}$ for j from 0 to t−1 and using steps of:

(a) initializing said coefficient $s_0^{(k)}$ to an arbitrary non-zero constant, initializing said coefficient $s_0^{(n)}$ to an arbitrary non-zero constant, initializing a parameter $d_k$ to an arbitrary non-zero constant and initializing counters $l_k$, $l_n$ and n to zero;

(b) multiplying said polynomial $s^{(k)}(x)$ by x, incrementing said counter $l_k$ and computing a parameter $d_n$ according to $$d_n = \sum_{j=0}^{l_n} \sigma_j^{(n)} * S_{m+n-i};$$

(c) branching to step (g) if said parameter $d_n$ is equal to zero; otherwise (d) branching to step (f) if said counter $l_k$ is less than or equal to said counter $l_n$; otherwise (e) interchanging values of said counters $l_k$ and $l_n$, interchanging values of said parameters $d_k$ and $d_n$, and interchanging the corresponding coefficients of said polynomials $s^{(k)}(x)$ and $s^{(n)}(x)$;

(f) computing new coefficients of said polynomial $s^{(n)}(x)$ according to $$\sigma^{(n)}(x) = d_k * \sigma^{(n)}(x) \oplus d_n * \sigma^{(k)}(x);$$

(g) incrementing said counter value n;

(h) branching to step (b) if said counter n is less than (d−2) or alternatively (t+$1_n$); otherwise (i) assigning $s(x) = s^{(n)}(x)$ (C) finding root electronic values of the error locator polynomial and determining corresponding error locations; and (D) correcting said code word polynomial signal or flagging an information polynomial as erroneous according to results of step (C).

4. In an electronic system performing identification of introduced errors in a plurality of interleaved error correction code (ECC) codewords of a Reed-Solomon or related code wherein information symbols of the ECC codewords are protected by a Reed-Solomon Cyclic Redundancy Check (CRC) code of degree dc with a generator polynomial GC(x) and the information symbols of the CRC code comprise sums across the ECC codewords of corresponding information symbols of the ECC codewords excluding the last information symbol of the last dc said ECC codewords, these last dc symbols comprising redundant symbols of the CRC code, a method for adjusting an electronic value of a residue of the CRC code to detect miscorrections by the ECC, the method comprising steps of:

(a) loading said residue of said CRC code into a LFSR which implements a reciprocal polynomial of said CRC generator polynomial GC(x) and clearing dc accumulators;
(b) before processing each of said ECC codewords in turn, first clocking a zero value into said LFSR a number of times;
(c) processing a last information symbol of said ECC codeword, wherein said processing comprises searching for an error in said information symbol and clocking a zero value into said LFSR if no error was detected or clocking an error value into said LFSR if an error was detected in said last information symbol of said ECC codeword;
(d) next clocking a zero value into said LFSR a number of times;
(e) processing each of remaining said information symbols of said ECC codeword in order from next-to-last to first, wherein said processing comprises searching for an error in said information symbol and clocking a zero value into said LFSR if no error was detected or clocking said error value into said LFSR if an error was detected in said information symbol of said ECC codeword;
(f) when all said information symbols of said ECC codeword have been processed, storing a sum of contents of said LFSR and contents of accumulators in said accumulators and branching to step (b) if a codeword remains to be processed; otherwise
(g) when all said information symbols of all said ECC codewords have been processed, checking that each of said accumulators contains zero values.

* * * * *